United States Patent
Park et al.

(10) Patent No.: US 8,835,275 B2
(45) Date of Patent: Sep. 16, 2014

(54) SEMICONDUCTOR DEVICES HAVING NITRIDED GATE INSULATING LAYER AND METHODS OF FABRICATING THE SAME

(75) Inventors: Tai-Su Park, Seoul (KR); Jin-Hyuk Choi, Suwon-si (KR); Sang-Chul Han, Suwon-si (KR); Jung-Sup Oh, Yongin-si (KR); Young-Dong Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 13/604,352

(22) Filed: Sep. 5, 2012

(65) Prior Publication Data

US 2013/0171801 A1 Jul. 4, 2013

(30) Foreign Application Priority Data

Dec. 28, 2011 (KR) ........................ 10-2011-0144751

(51) Int. Cl.
*H01L 21/28* (2006.01)
(52) U.S. Cl.
USPC ..... 438/400; 438/786; 438/589; 257/E21.267
(58) Field of Classification Search
CPC ................... H01L 29/66704; H01L 21/76224
See application file for complete search history.

(56) References Cited

U.S. PATENT DOCUMENTS

| | | | |
|---|---|---|---|
| 6,893,979 B2 | 5/2005 | Khare et al. | |
| 7,109,559 B2 | 9/2006 | Khare et al. | |
| 7,226,874 B2 | 6/2007 | Matsuyama et al. | |
| 7,268,088 B2 | 9/2007 | Niimi | |
| 7,723,241 B2 | 5/2010 | Matsuyama et al. | |
| 7,897,518 B2 | 3/2011 | Matsuyama et al. | |
| 7,902,027 B2 | 3/2011 | Yamamoto | |
| 2007/0267706 A1 | 11/2007 | Niimi | |
| 2008/0032512 A1 | 2/2008 | Kim et al. | |
| 2008/0042195 A1 | 2/2008 | Yamamoto | |
| 2008/0194091 A1 | 8/2008 | Lin et al. | |
| 2011/0001186 A1* | 1/2011 | Seo et al. ...................... | 257/330 |
| 2011/0124202 A1 | 5/2011 | Matsuyama et al. | |

FOREIGN PATENT DOCUMENTS

| | | |
|---|---|---|
| JP | 4421150 | 3/2003 |
| JP | 2004087865 A | 3/2004 |

(Continued)

OTHER PUBLICATIONS

Nicollian, Paul E. "Physics of Trap Generation and Electrical Breakdown in Ultra-thin SiO2 and SiON Gate Dielectric Materials." ISBN 978-90-365-2563-3. 2007.

*Primary Examiner* — Alexander Sofocleous
(74) *Attorney, Agent, or Firm* — Harness, Dickey & Pierce, P.L.C.

(57) ABSTRACT

Semiconductor devices, and methods of fabricating the same, include forming device isolation regions in a substrate to define active regions, forming gate trenches in the substrate to expose the active regions and device isolation regions, conformally forming a preliminary gate insulating layer including silicon oxide on the active regions exposed in the grate trenches, nitriding the preliminary gate insulating layer using a radio-frequency bias having a frequency of about 13.56 MHz and power between about 100 W and about 300 W to form a nitrided preliminary gate insulating layer including silicon oxynitride, forming a gate electrode material layer on the nitride preliminary gate insulating layer, partially removing the nitrided preliminary gate insulating layer and the gate electrode material layer to respectively form a gate insulating layer and a gate electrode layer, and forming a gate capping layer on the gate electrode layer to fill the gate trenches.

17 Claims, 52 Drawing Sheets

(56) References Cited

FOREIGN PATENT DOCUMENTS

| | | |
|---|---|---|
| JP | 2009252842 A | 10/2009 |
| JP | 4543397 | 9/2010 |
| KR | 20080029607 A | 4/2008 |
| KR | 20080089099 A | 10/2008 |
| KR | 100905997 B1 | 7/2009 |
| KR | 20100077756 A | 7/2010 |

* cited by examiner (A)  (B)  (C)

SEMICONDUCTOR DEVICES HAVING NITRIDED GATE INSULATING LAYER AND METHODS OF FABRICATING THE SAME

CROSS-REFERENCE TO RELATED APPLICATION

This application claims priority under 35 U.S.C. §119(e) to Korean Patent Application No. 10-2011-0144751 filed on Dec. 28, 2011, the disclosure of which is hereby incorporated by reference in its entirety.

BACKGROUND

1. Field

Example embodiments relate to semiconductor devices having a nitrided gate insulating layer and methods of fabricating the same.

2. Description of Related Art

A highly integrated semiconductor device should have fine patterns, consume low power, and operate at a low voltage. For example, a metal-oxide-semiconductor field-effect transistor (MOSFET) should be capable of turning on and off at a low voltage, and a leakage current generated by a gate insulating layer should be reduced.

SUMMARY

Example embodiments relate to semiconductor devices having a nitrided gate insulating layer and methods of fabricating the same.

Example embodiments provide a metal-oxide-semiconductor field-effect transistor (MOSFET) having a nitrided gate insulating layer, and a semiconductor device including the MOSFET.

Other example embodiments provide a MOSFET having a gate insulating layer including silicon oxynitride, and a semiconductor device including the MOSFET.

Still other example embodiments provide a memory module including the semiconductor device, a semiconductor module including the semiconductor device, and an electronic system including the semiconductor device.

Yet other example embodiments provide a method of forming a MOSFET having a nitrided gate insulating layer, and a method of fabricating a semiconductor device including the MOSFET.

Yet other example embodiments provide a semiconductor fabrication apparatus configured to nitride silicon oxide.

Yet other example embodiments provide a method of fabricating a semiconductor device using the semiconductor fabrication apparatus.

Aspects should not be limited by the above description, and other unmentioned aspects will be clearly understood by one of ordinary skill in the art from example embodiments described herein.

In accordance with example embodiments, a method of fabricating a semiconductor device is provided. The method includes forming device isolation regions in a substrate to define active regions, forming gate trenches in the substrate, wherein the gate trenches expose the active regions and the device isolation regions, conformally forming a preliminary gate insulating layer including silicon oxide on the exposed active regions in the gate trenches, nitriding the preliminary gate insulating layer by applying a radio-frequency (RF) bias at a frequency of about 13.56 MHz and power between about 100 W and about 300 W to form a nitrided preliminary gate insulating layer including silicon oxynitride, forming a gate electrode material layer on the nitrided preliminary gate insulating layer, partially removing the nitrided preliminary gate insulating layer and the gate electrode material layer to respectively form a gate insulating layer and a gate electrode layer, and forming a gate capping layer on the gate electrode layer, wherein the gate capping layer fills the gate trenches.

The gate insulating layer may include silicon oxynitride, and a concentration of nitrogen in the gate insulating layer may increase toward the gate electrode layer and a concentration of oxygen in the gate insulating layer may increase toward the substrate.

The nitriding of the preliminary gate insulating layer may include generating plasma using microwaves having a frequency of about 2.54 GHz and power between about 2000 W and about 3600 W.

The nitriding of the preliminary gate insulating layer may be performed under a pressure between about 100 mTorr and about 400 mTorr.

The nitriding of the preliminary gate insulating layer may include nitriding a region of the preliminary gate insulating layer close to surfaces of the device isolation regions.

The nitriding of the preliminary gate insulating layer may be performed using one selected from a $N_2$-containing gas, argon (Ar) gas and a combination thereof.

The nitriding of the preliminary gate insulating layer may be performed using one selected from a combination of ammonia ($NH_3$) gas and the Ar gas, a combination of nitrogen ($N_2$) gas, hydrogen ($H_2$) gas and the Ar gas and combinations thereof.

The nitriding of the preliminary gate insulating layer may include supplying the $NH_3$ gas at a flow rate between about 100 sccm and about 500 sccm, and supplying the Ar gas at a flow rate between about 1000 sccm and about 3000 sccm.

The nitriding of the preliminary gate insulating layer may include supplying the $N_2$ gas at a flow rate between about 50 sccm and about 400 sccm, supplying the $H_2$ gas at a flow rate between about 20 sccm and about 200 sccm, and supplying the Ar gas at a flow rate between about 500 sccm and about 3000 sccm.

The nitriding of the preliminary gate insulating layer may include heating the substrate to a temperature between about 450° C. and about 500° C.

The method may further include forming a gate barrier material layer between the nitrided preliminary gate insulating layer and the gate electrode material layer, and partially removing the gate barrier material layer to form a gate barrier layer.

The gate barrier layer may include titanium nitride.

The forming of the gate trenches may include forming first bottom surfaces exposing the active regions, and second bottom surfaces exposing the device isolation regions, wherein the first bottom surfaces are at a higher level than the second bottom surfaces.

In accordance with other example embodiments, a method of fabricating a semiconductor device is provided. The method includes mounting a wafer on a support chuck disposed in a lower region of a chamber, supplying microwaves from above the chamber into a central region of the chamber, supplying nitrogen ($N_2$)-containing gases into the chamber to generate plasma, and applying a radio-frequency (RF) signal having a frequency of about 13.56 MHz and power between about 100 W and about 300 W to a bias electrode disposed under the support chuck, and processing the wafer using plasma. The wafer includes a gate trench formed in a silicon substrate, and a preliminary gate insulating layer formed on a bottom surface and inner walls of the gate trench. The processing of the wafer includes nitriding the preliminary gate insulating layer using the plasma to form a gate insulating layer including silicon oxynitride.

The processing of the wafer includes heating the support chuck to a temperature between about 450° C. to about 550° C.

In accordance with yet other example embodiments, there is provided a method of fabricating a semiconductor device including providing a substrate having active regions each delimited by device isolation regions, the active regions being exposed, forming at least one gate trench in each of the active regions, conformally forming a preliminary gate insulating layer including an oxide over the active region in the at least one gate trench, nitriding the preliminary gate insulating layer by applying a radio-frequency (RF) bias at a frequency of about 13.56 MHz with power between about 100 W and about 300 W to form a nitrided preliminary gate insulating layer including an oxynitride, forming a nitrided gate insulating layer and a gate electrode layer partially filling in the at least one gate trench by removing portions of the nitrided preliminary gate insulating layer and a gate electrode layer on the nitrided preliminary gate insulating layer, and forming a gate capping layer filling in a remaining portion of the at least one gate trench.

The preliminary gate insulating layer may be excluded from the device isolation regions.

The forming of the at least one gate trench may include forming a bottom surface including a first bottom surface over active region and a second bottom surface corresponding over one of the device isolation regions. The second bottom surface may be formed at a height different than a height of the first bottom surface.

Sidewalls of the at least one gate trench may be formed at an angle of 90-degrees or greater with respect to an upper surface of the substrate.

The method may further include forming an insulating layer including an oxide over the device isolation regions, prior to the nitriding the preliminary gate insulating layer. An upper portion of the insulating layer may be nitrided when nitriding the preliminary gate insulating layer.

Specific particulars of other example embodiments are included in detailed descriptions and drawings.

BRIEF DESCRIPTION OF THE DRAWINGS

Example embodiments will be more clearly understood from the following detailed description taken in conjunction with the accompanying drawings. FIGS. 1-20 represent non-limiting, example embodiments as described herein. In the drawings:

FIG. 1 is a layout of semiconductor devices according to example embodiments;

FIG. 14 is a conceptual diagram of a semiconductor fabrication apparatus capable of according to example embodiments;

FIG. 15 is a flowchart illustrating a method of fabricating a semiconductor device using a semiconductor fabrication apparatus according to example embodiments;

FIG. 16 is a conceptual diagram of a memory module including at least one of the semiconductor devices according to various example embodiments;

FIG. 17 is a conceptual diagram of a semiconductor module including at least one of the semiconductor devices according to various example embodiments;

FIG. 18 is a conceptual block diagram of an electronic system including at least one of the semiconductor devices according to various example embodiments;

FIG. 19 is a schematic block diagram of another electronic system including at least one of the semiconductor devices according to example embodiments; and FIG. 20 is a schematic diagram of a wireless mobile phone including at least one of the semiconductor devices according to various example embodiments.

DETAILED DESCRIPTION OF EXAMPLE EMBODIMENTS

Figure 1:
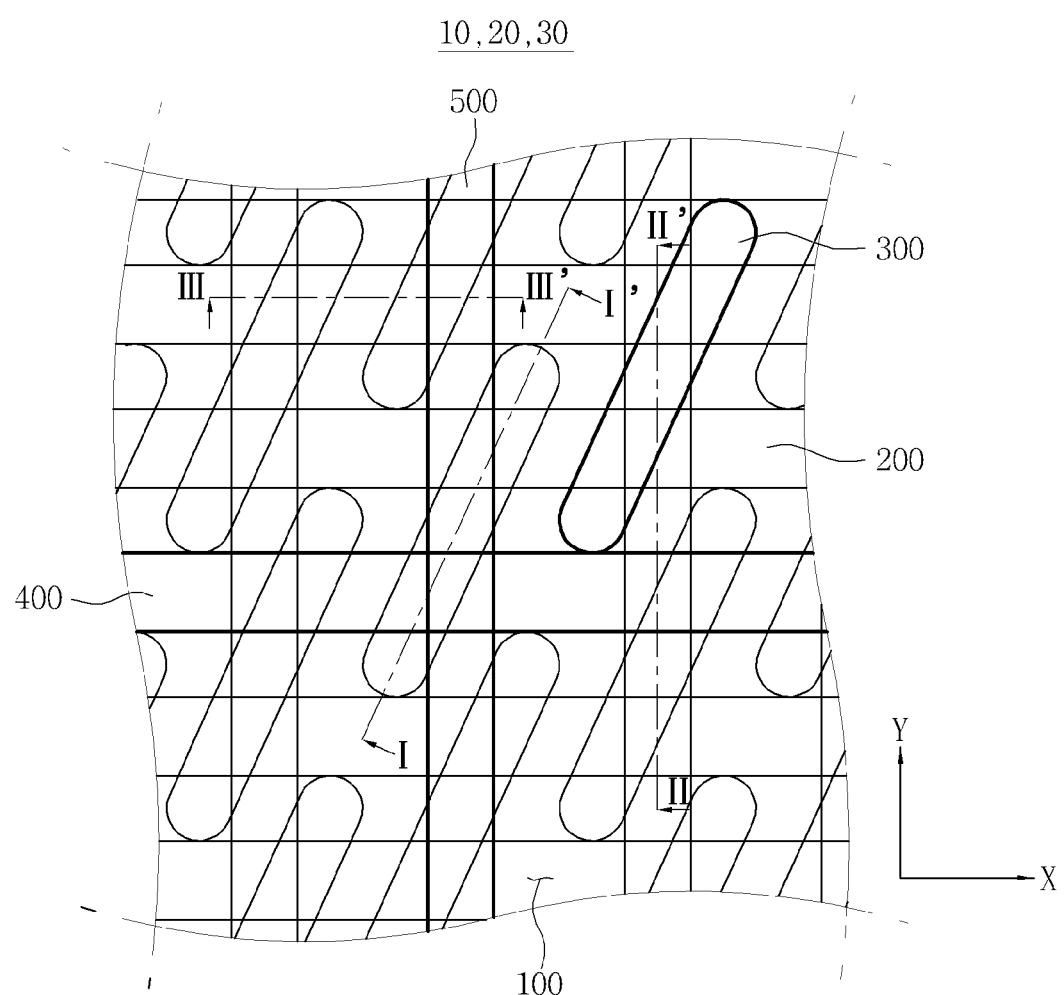

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to semiconductor devices having a nitrided gate insulating layer and methods of fabricating the same.

FIG. 1 is a layout of semiconductor devices according to example embodiments.

Referring to FIG. 1, each of semiconductor devices 10, 20, and 30 according to example embodiments may include active regions 300 arranged as island types and isolated from one another by device isolation regions 200 formed in a substrate 100. Each of the semiconductor devices 10, 20, and 30 may include word lines 400, which may extend in an X direction and intersect the device isolation regions 200 and the active regions 300, and bit lines 500, which may extend in a Y direction and intersect the device isolation regions 200 and the active regions 300. In other drawings, the word lines 400 will be referred to as gate structures. The active regions 300 may be inclined at a given angle with respect to the X and Y directions. The active regions 300 may be bar-shaped.

Figure 2A:
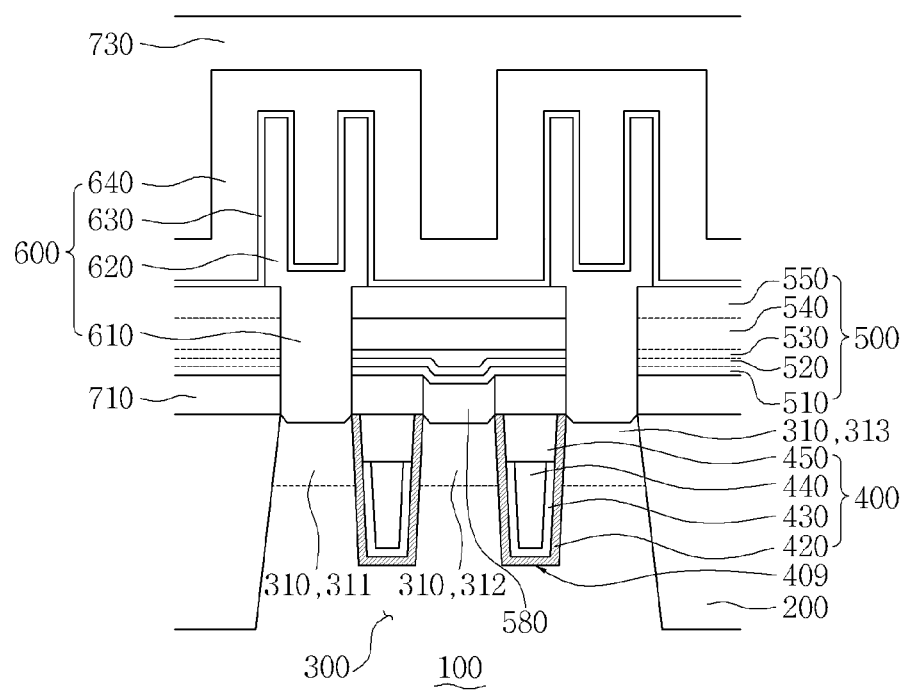
FIGS. 2A through 2C are conceptual longitudinal sectional views taken along line I-I' of FIG. 1, which illustrate semiconductor devices according to various example embodiments.
Figure 2B:
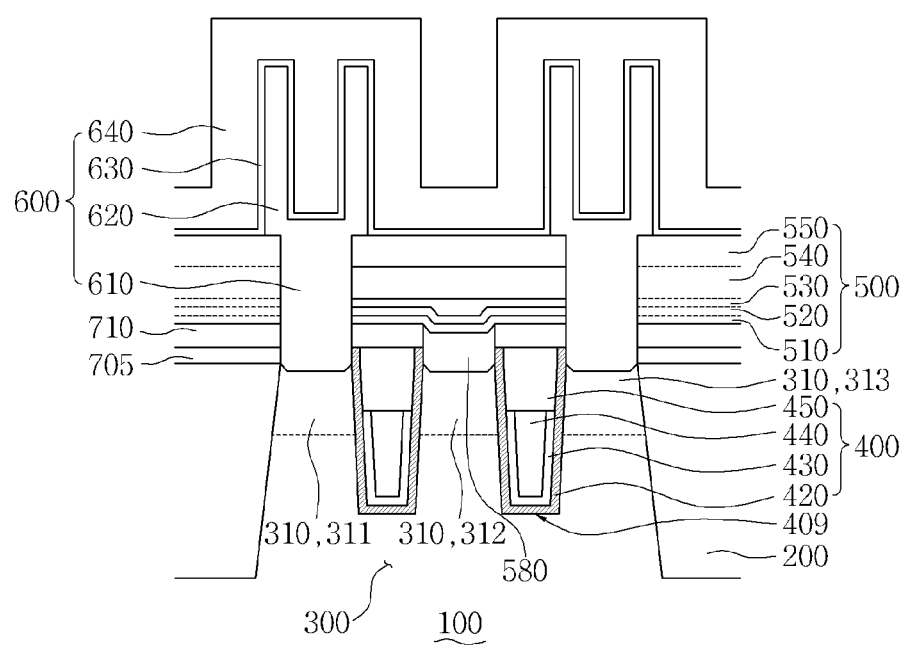
Figure 2C:
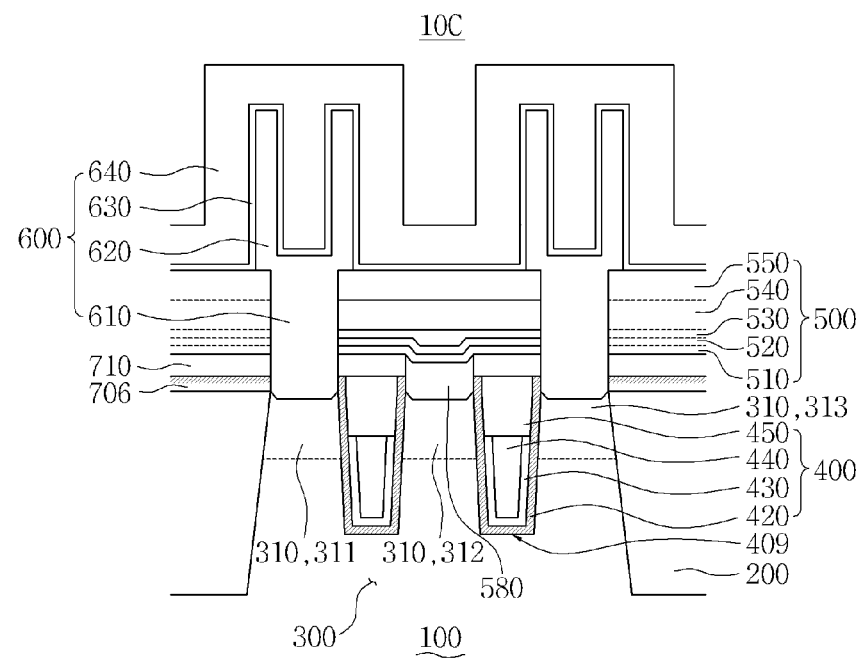

FIGS. 2A through 2C are conceptual longitudinal sectional views taken along line I-I' of FIG. 1, which illustrate semiconductor devices according to various example embodiments.

Referring to FIG. 2A, a semiconductor device 10A according to example embodiments may include gate structures 400 buried in a substrate 100, bit lines 500 disposed on the substrate 100, and capacitors 600 disposed on the bit lines 500. The substrate 100 may include device isolation regions 200, and active regions 300 defined (or delimited) by the device isolation regions 200. The active regions 300 may include impurity layers 310, 311, 312, and 313 isolated from one another by the gate structures 400. For brevity, the impurity layers 310, 311, 312, and 313 will be referred to as source regions 311 and 313 and a drain region 312. Because functions of source and drain regions may be exchanged in a semiconductor technique, the source regions 311 and 313 may function as drain regions, and the drain region 312 may function as a source region. Accordingly, functions or names of the source regions 311 and 313 and the drain region 312 may be exchanged.

The substrate 100 may include a silicon wafer, a silicon-on-insulator (SOI) substrate, a silicon germanium (SiGe) substrate, a silicon carbide (SiC) substrate, a compound semiconductor substrate, or one of various semiconductor substrates.

Each of the gate structures 400 may include a gate insulating layer 420, a gate barrier layer 430, a gate electrode layer 440, and a gate capping layer 450.

The gate insulating layer 420 may be conformally formed on bottom surfaces and inner walls of gate trenches 409 formed by removing the substrate 100 to a given depth. Topmost ends (or uppermost portion) of the gate insulating layers 420 may be at a substantially equal, or similar, level to a top surface of the substrate 100. For example, the gate insulating layer 420 may completely cover the bottom surfaces and inner walls of the gate trenches 409. In other example embodiments, the gate insulating layer 420 may be formed only between the substrate 100 and the gate barrier layer 430. For instance, the gate insulating layer 420 may not be formed on upper regions of the inner walls of the gate trenches 409. In other words, the gate insulating layer 420 may be formed to cover only the middle of the gate trench 409. The gate insulating layer 420 may include silicon oxynitride. The gate insulating layer 420 may include silicon oxide or silicon oxynitride. Alternatively, the gate insulating layer 420 may include silicon oxide, silicon oxynitride, and/or silicon nitride. The gate insulating layer 420 may be a single layer. Accordingly, the content of oxygen and/or nitrogen in the gate insulating layer 420 may vary according to regions. For example, the oxygen content of the gate insulating layer 420 may generally be uniform. In other example embodiments, the oxygen content of the gate insulating layer 420 may gradiently (or gradually) increase toward the substrate, and gradiently (or gradually) decrease toward the gate barrier layer 430. The nitrogen content of the gate insulating layer 420 may generally be uniform. Alternatively, the nitrogen content of the gate insulating layer 420 may gradiently (or gradually) decrease toward the substrate 100, and gradiently (or gradually) increase toward the gate barrier layer 430 or the gate electrode layer 440. Therefore, although the gate insulating layer 420 is physically, or visually, a single layer, the gate insulating layer 420 may be chemically, or non-visually, a multilayered layer.

The gate barrier layer 430 may be conformally formed on the gate insulating layer 420 to fill about the middle of the gate trenches 409. In other words, a top surface of the gate barrier layer 430 may be disposed at a lower level than the top surface of the substrate 100. The gate barrier layer 430 may include a single-layered or multilayered metal, or metal compound. For example, the gate barrier layer 430 may include titanium (Ti), titanium nitride (TiN), tantalum (Ta), tantalum nitride (TaN), ruthenium (Ru), tungsten (W), tungsten titanium (WTi), tungsten nitride (WN), or various other metals or metal compounds.

The gate electrode layer 440 may be formed on the gate barrier layer 430 to fill about the middle of the gate trenches 409. In other words, a top surface of the gate electrode layer 440 may be disposed at a lower level than the top surface of the substrate 100. FIG. 2A illustrates that the top surface of the gate electrode layer 440 is at the same level as the topmost ends of the gate barrier layer 430. However, the top surface of the gate electrode layer 440 may be disposed at a different level from the topmost ends of the gate barrier layer 430. For example, the topmost ends of the gate barrier layer 430 may protrude upward or be recessed downward from the top surface of the gate electrode layer 440.

The gate capping layer 450 may be formed on the gate electrode layer 440 to completely fill a remaining portion of the gate trenches 409. Although FIG. 2A illustrates the gate insulating layer 420 formed between the substrate 100 and the gate capping layer 450, the substrate 100 and the gate capping layer 450 may be in direct contact with each other. A top surface of the gate capping layer 450 may be at the same level as the top surface of the substrate 100. The gate capping layer 450 may include silicon nitride or silicon oxide.

A first interlayer insulating layer 710 may be entirely formed on the top surface of the substrate 100 and the top surface of the gate capping layer 450. The first interlayer insulating layer 710 may include silicon oxide or silicon nitride.

The bit lines 500 may be formed on the first interlayer insulating layer 710. Each of the bit lines 500 may include a lower metal silicide layer 510, a bit line barrier layer 520, an upper metal silicide layer 520, a bit line electrode layer 540, and a bit line capping layer 550. In FIG. 2A, portions illustrated with dotted lines may refer to components that may not be visually seen. That is, components that are not substantially seen from the longitudinal sectional view of FIG. 2A are imaginarily illustrated as if seen.

The lower and upper metal silicide layers 510 and 530 may include tungsten silicide (WSi), titanium silicide (TiSi), tantalum silicide (TaSi), or various other metals, metal compounds, or metal silicides. That is, although the lower and upper metal silicide layers 510 and 530 are metal silicide layers, example embodiments are not limited thereto. Thus, the lower and upper metal silicide layers 510 and 530 may not include a metal silicide. In other example embodiments, the lower and upper metal silicide layers 510 and 530 may be omitted.

The bit line barrier layer 520 may include a metal nitride. For example, the bit line barrier layer 520 may include WN, TiN, TaN, or various other metal nitrides.

The bit line electrode layer 540 may include a metal. For example, the bit line electrode layer 540 may include tungsten (W), aluminum (Al), copper (Cu), or various other metals.

The bit line capping layer 550 may include an inorganic insulating material (e.g., silicon nitride or silicon oxynitride), or a metal oxide (e.g., aluminum oxide ($Al_2O_3$) or hafnium oxide ($HfO_2$)).

A bit line contact plug 580 may be formed between the substrate 100 and the lower metal silicide layer 510. The bit line contact plug 580 may be physically and/or electrically connected to a drain region 312 of the substrate 100 and the lower metal silicide layer 510. The bit line contact plug 580 may vertically penetrate the first interlayer insulating layer 710. A surface of the substrate 100, which may be in contact with the bit line contact plug 580, may be recessed. Similarly, a top surface of the bit line contact plug 580, which may be in contact with the lower metal silicide layer 510, may be recessed. The bit line contact plug 580 may include doped polycrystalline silicon (poly-Si).

A second interlayer insulating layer (not shown) may be formed beside the bit lines 500. The second interlayer insulating layer will be illustrated in other drawings.

The capacitors 600 may be formed on the bit lines 500. Each of the capacitors 600 may include a storage electrode 620, a storage dielectric layer 630, and a plate electrode 640. Each of the capacitors 600 may further include a storage contact plug 610.

The storage contact plug 610 may be physically and/or electrically connected to the source regions 311 and 313 of the substrate 100. The storage contact plug 610 may also vertically penetrate the first interlayer insulating layer 710. A surface of the substrate 100, which may be in contact with the storage contact plug 610, may be recessed. The storage contact plug 610 may include doped poly-Si or a metal.

The storage electrode 620 may have one of various shapes (e.g., a pillar shape, a cylindrical shape, or a bridge shape). In the example embodiments, the storage electrode 620 having a pillar shape or cylindrical shape is briefly illustrated. The storage electrode 620 may include doped poly-Si or a metal. The storage contact plug 610 and the storage electrode 620 may include the same material. For example, the storage contact plug 610 and the storage electrode 620 may be materially in continuity with each other.

The storage dielectric layer 630 may be conformally formed on the storage electrode 620. The storage dielectric layer 630 may include various insulating materials.

The plate electrode 640 may be entirely formed on the storage dielectric layer 630. The plate electrode 640 may include doped poly-Si or a metal (e.g., aluminum).

A third interlayer insulating layer 730 may be entirely formed on the surfaces of the capacitors 600. The third interlayer insulating layer 730 may include silicon oxide.

Referring to FIG. 2B, a semiconductor device 10B according to other example embodiments may include gate structures 400 buried in a substrate 100, bit lines 500 disposed on the substrate 100, and capacitors 600 disposed on the bit lines 500. The substrate 100 may include device isolation regions 200 and active regions 300 defined by the device isolation regions 200. The semiconductor device 10B may include a bottom insulating layer 705 interposed between a surface of the substrate 100 or surfaces of the device isolation regions 200 and a first interlayer insulating layer 710. Topmost ends of a gate insulating layer 420 may be disposed at substantially the same level as a top surface of the bottom insulating layer 795. The bottom insulating layer 705 may include silicon oxide. When the first interlayer insulating layer 710 and the bottom insulating layer 705 include the same material, the boundary there between may not be seen. Accordingly, the topmost ends of the gate insulating layer 420 may protrude upward from the top surface of the substrate 100.

Referring to FIG. 2C, a semiconductor device 10C according to other example embodiments may include gate structures 400 buried in a substrate 100, bit lines 500 disposed on the substrate 100, and capacitors 600 disposed on the bit lines 500. The substrate 100 may include device isolation regions 200 and active regions 300 defined by the device isolation regions 200. The semiconductor device 10B may include a nitrided bottom insulating layer 706 interposed between a surface of the substrate 100 or surfaces of the device isolation regions 200 and a first interlayer insulating layer 710. The nitrided bottom insulating layer 706 may wholly include silicon oxynitride. An upper region of the nitrided bottom insulating layer 706 may include silicon oxynitride or silicon nitride, and a lower region thereof may include silicon oxide. Alternatively, the nitrided bottom insulating layer 706 may wholly include silicon oxynitride or silicon nitride. The topmost ends of the gate insulating layer 420 may be disposed at substantially the same level as a top surface of the nitrided bottom insulating layer 706.

FIGS. 3A through 3H are conceptual longitudinal sectional views taken along line II-II' of FIG. 1, which illustrate semiconductor devices according to various example embodiments.

Figure 3A:
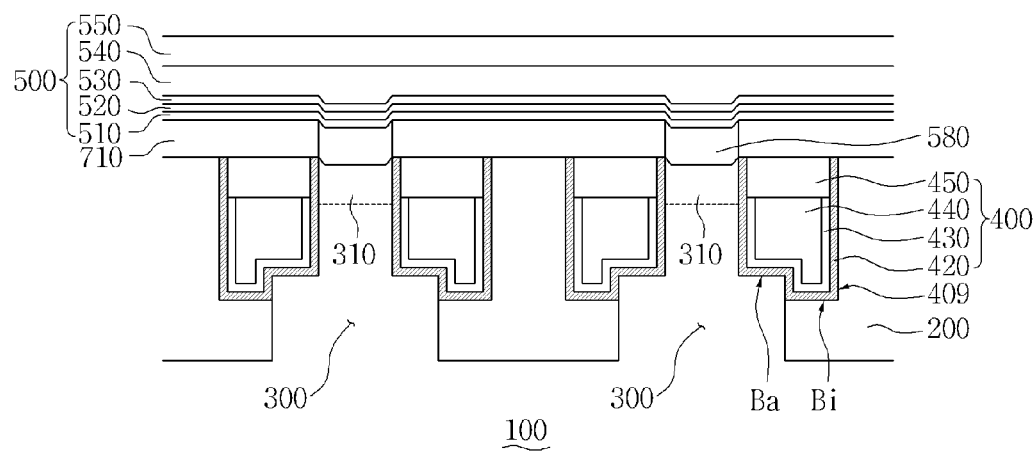
FIGS. 3A through 3H are conceptual longitudinal sectional views taken along line II-II' of FIG. 1, which illustrate semiconductor devices according to various example embodiments.

Referring to FIG. 3A, a semiconductor device 20A according to other example embodiments may include gate structures 400 buried in a substrate 100, and bit lines 500 disposed on the substrate 100. The substrate 100 may include device isolation regions 200 and active regions 300 defined by the device isolation regions 200. The active regions 300 may include impurity layers 310 formed between the buried gate structures 400. For brevity, FIG. 3A illustrates that the device isolation regions 200 have vertical sidewalls and horizontal bottom surfaces. Similarly, FIG. 3A illustrates that gate trenches 409 have vertical sidewalls and bottom surfaces.

The gate trenches 409 according to example embodiments may include staircase-type stepped bottom surfaces Ba and Bi. For example, each of the gate trenches 409 may include an active bottom surface Ba formed to a relatively higher height in a position corresponding to the active region 300, and an isolating bottom surface Bi formed to a relatively lower height in a position corresponding to the device isolation region 200. Accordingly, each of a gate insulating layer 420 and a gate barrier layer 430 may have a profile running along the active bottom surface Ba and the isolating bottom surface Bi. Other unmentioned components will be understood with reference to FIG. 2A.

Figure 3B:
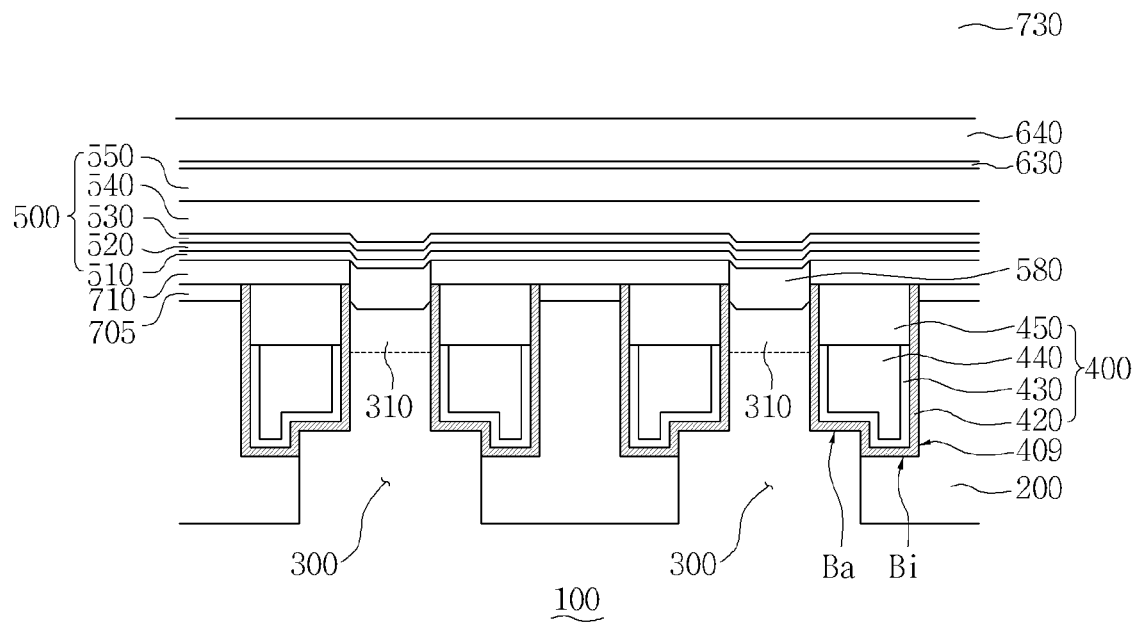

Referring to FIG. 3B, as compared with the semiconductor device 20A of FIG. 3A, a semiconductor device 20B according to other example embodiments may include a bottom insulating layer 705 interposed between a surface of a substrate 100 or surfaces of device isolation regions 200 and a first interlayer insulating layer 710. Topmost ends of a gate insulating layer 420 may be at substantially the same level as a top surface of the bottom insulating layer 705. The bottom insulating layer 705 may include silicon oxide.

Figure 3C:
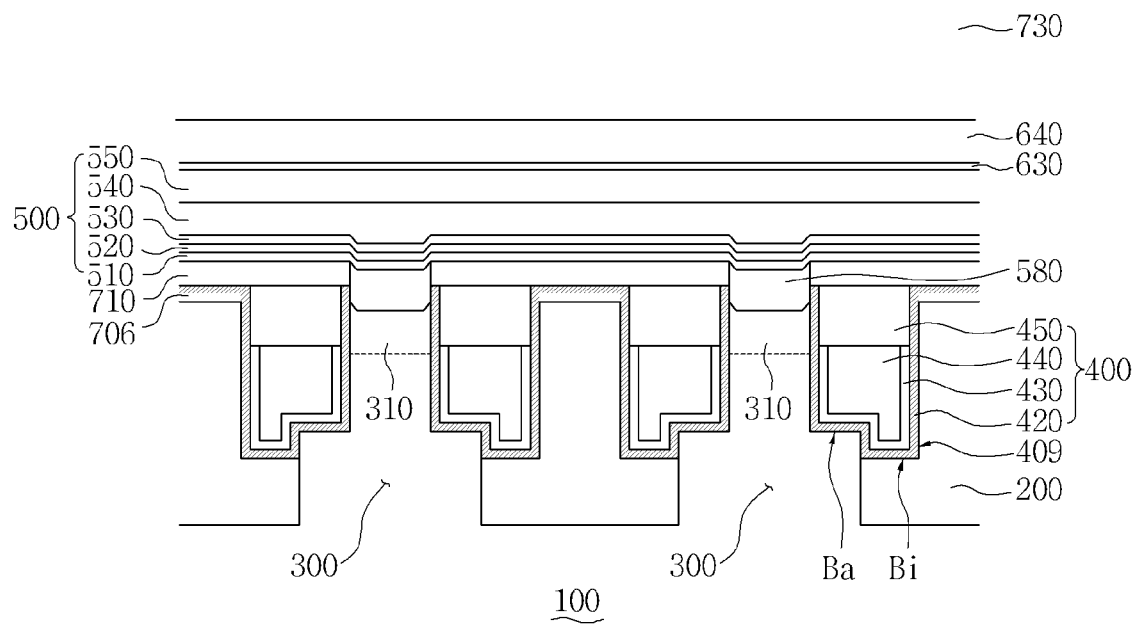

Referring to FIG. 3C, as compared with the semiconductor device 20A of FIG. 3A, a semiconductor device 20C according to other example embodiments may include a nitrided bottom insulating layer 706 interposed between a surface of a substrate 100 or surfaces of device isolation regions 200 and a first interlayer insulating layer 710. The nitride bottom insulating layer 706 may wholly include silicon oxynitride. An upper region of the nitrided bottom insulating layer 706 may include silicon oxynitride or silicon nitride, and a lower region thereof may include silicon oxide. Alternatively, the nitrided bottom insulating layer 706 may wholly include silicon oxynitride or silicon nitride. The topmost ends of the gate insulating layer 420 may be disposed at substantially the same level as a top surface of the nitrided bottom insulating layer 706.

Figure 3D:
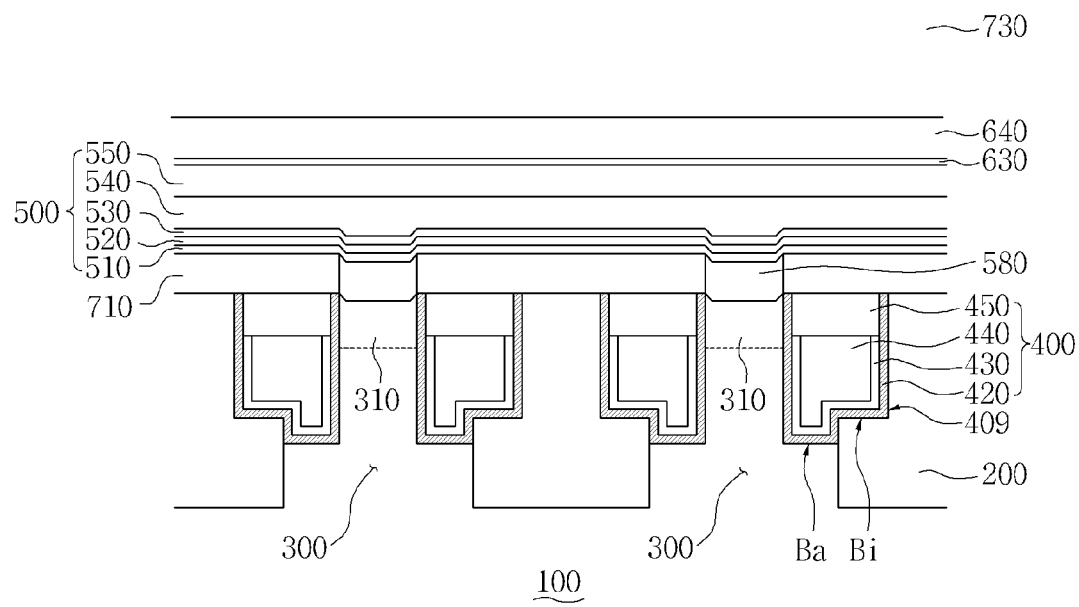

Referring to FIG. 3D, as compared with the semiconductor device 20A of FIG. 3A, in a semiconductor device 20D according other example embodiments, gate trenches 409 may include staircase-type stepped bottom surfaces Ba and Bi whose heights may be exchanged. That is, the active bottom surface Ba may be formed to a relatively lower height, and the isolating bottom surface Bi may be formed to a relatively higher height.

Figure 3E:
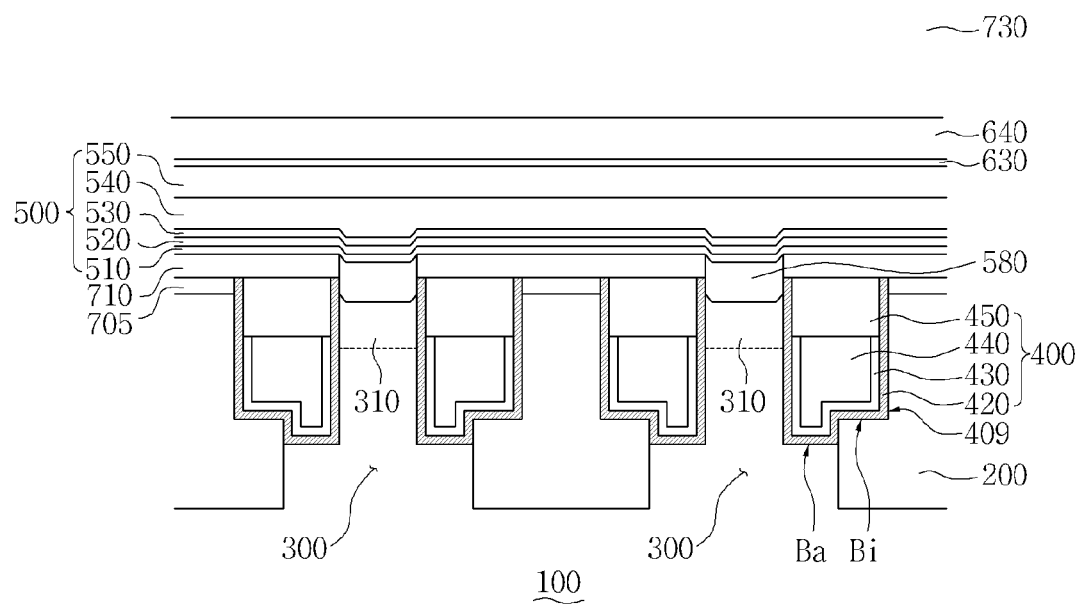

Referring to FIG. 3E, as compared with the semiconductor device 20D of FIG. 3D, a semiconductor device 20E according to other example embodiments may include a bottom insulating layer 705 interposed between a surface of a substrate 100 or surfaces of device isolation regions 200 and a first interlayer insulating layer 710. Topmost ends of a gate insulating layer 420 may be at substantially the same level as a top surface of the bottom insulating layer 705. The bottom insulating layer 705 may include silicon oxide.

Figure 3F:
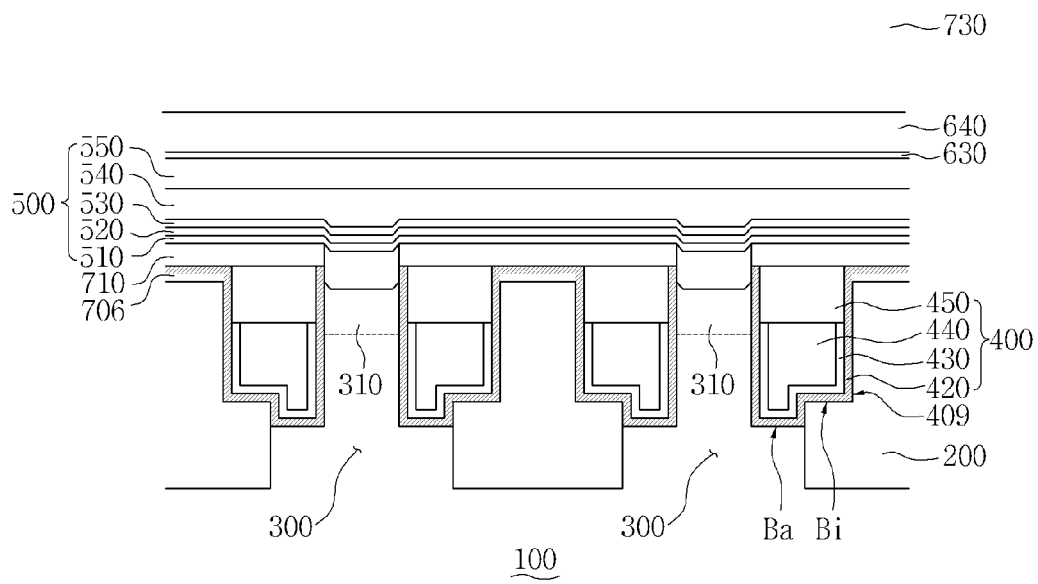

Referring to FIG. 3F, as compared with the semiconductor device 20D of FIG. 3D, a semiconductor device 20F according to other example embodiments may include a nitrided bottom insulating layer 706 interposed between a surface of a substrate 100 or surfaces of device isolation regions 200 and a first interlayer insulating layer 710.

Figure 3G:
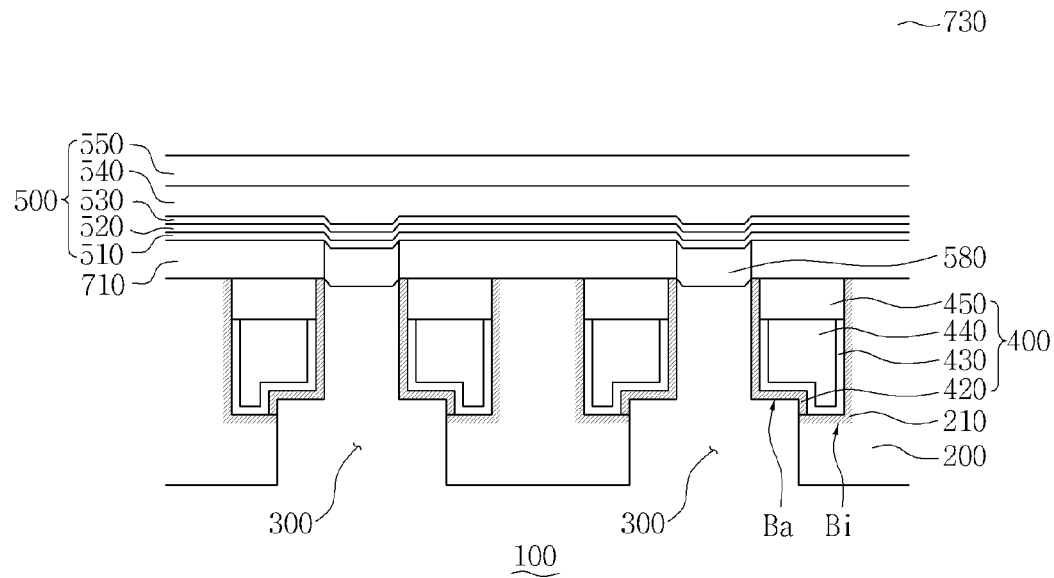
Figure 3H:
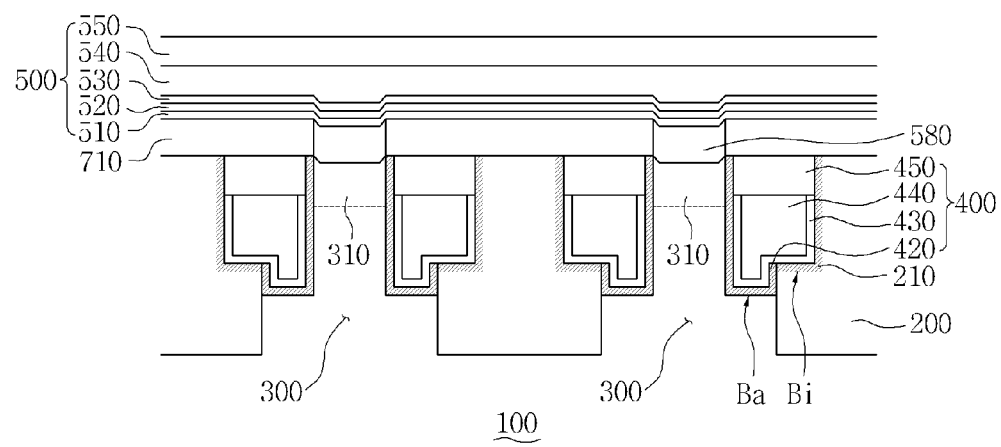

Referring to FIGS. 3G and 3H, in each of semiconductor devices 20G and 20H according to other example embodiments, a gate insulating layer 420 may be formed only in active regions 300 or on exposed surfaces of the active region 300 in the gate trenches 409 with further reference to FIGS. 3A and 3D. For example, the gate insulating layer 420 may not be formed in device isolation regions 200. However, the device isolation regions 200 may respectively include nitrided regions 210 formed along surfaces of the device isolation regions 200.

FIGS. 4A through 4D are conceptual longitudinal sectional views taken along line III-III' of FIG. 1, which illustrate semiconductor devices 30A through 30D according to various example embodiments.

Figure 4A:
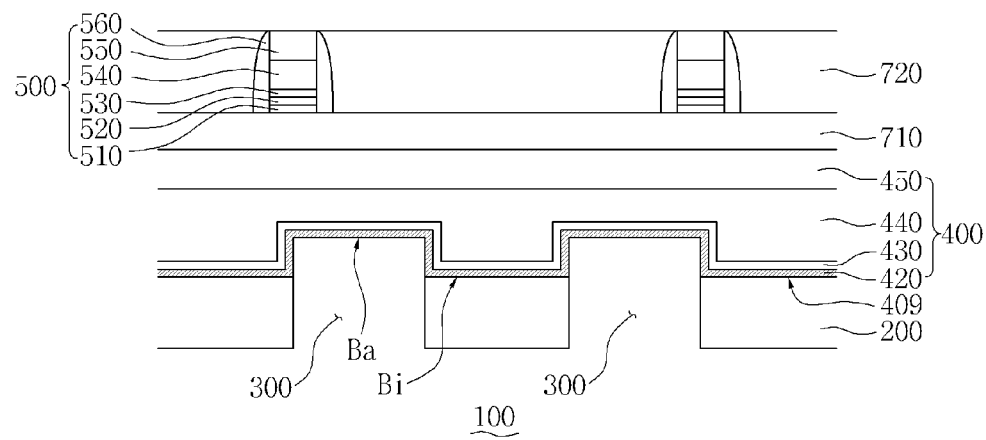
FIGS. 4A through 4D are conceptual longitudinal sectional views taken along line III-III' of FIG. 1, which illustrate semiconductor devices according to various example embodiments.

Referring to FIG. 4A, a semiconductor device 30A according to example embodiments may include device isolation regions 200, active regions 300, gate structures 400, and bit lines 500.

The device isolation regions 200 may be formed in the substrate 100. The device isolation regions 200 may define the active regions 300.

Each of the gate structures 400 may include a gate insulating layer 420 formed within a gate trench 409, a gate barrier layer 430, a gate electrode layer 440, and a gate capping layer 450.

The gate trench 409 may include staircase-type stepped bottom surfaces Ba and Bi. For example, each of gate trenches 409 may include an active bottom surface Ba formed to a relatively higher height in a position corresponding to the active region 300, and an isolating bottom surface Bi formed to a relatively lower height in a position corresponding to the device isolation region 200. Accordingly, each of a gate insulating layer 420 and a gate barrier layer 430 may have a profile running along the active bottom surface Ba and the isolating bottom surface Bi. Similarly, the gate electrode layer 450 may have a profile running along the active bottom surface Ba and the isolating bottom surface Bi. The gate capping layer 450 may be formed on the gate electrode layer 440. The shape of the gate structures 400 will be understood with reference to other drawings.

A first interlayer insulating layer 710 may be formed on the gate capping layer 450. The bit lines 400 and a second interlayer insulating layer 720 may be formed on the first interlayer insulating layer 710. Top surfaces of the bit lines 400 may be disposed at the same level as a top surface of the second interlayer insulating layer 720. The second interlayer insulating layer 720 may include silicon oxide.

Each of the bit lines 400 may include a lower metal silicide layer 510, a bit line barrier layer 520, an upper metal silicide layer 530, a bit line electrode layer 540, a bit line capping layer 550, and bit line spacers 560. The bit line spacers 560 may include silicon nitride.

A third interlayer insulating layer 730 may be formed on the bit lines 400 and the second interlayer insulating layer 720.

Figure 4B:
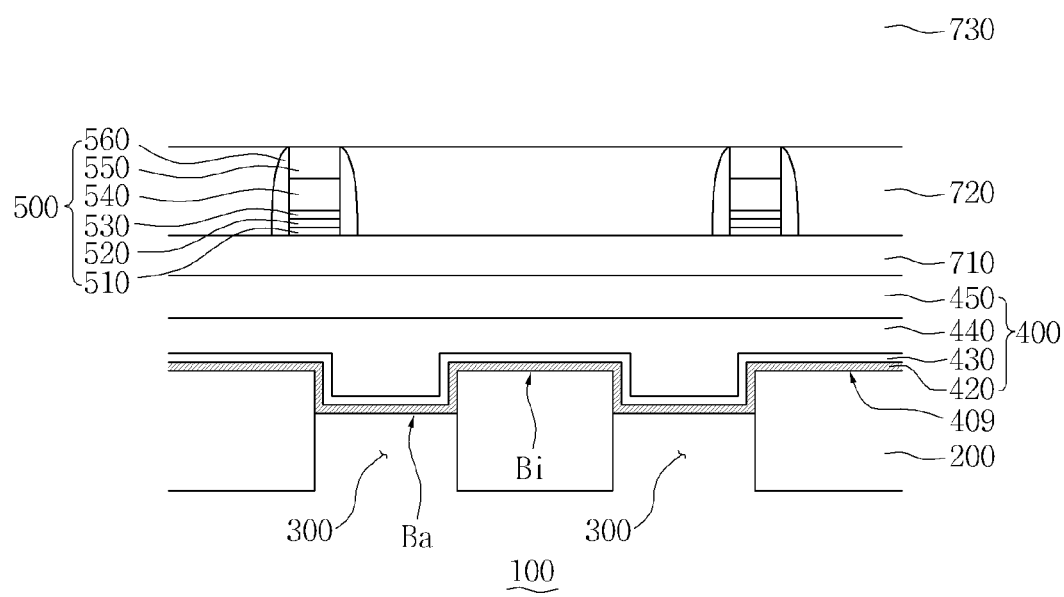

Referring to FIG. 4B, as compared with the semiconductor device 30A of FIG. 4A, a semiconductor device 30B according to other example embodiments may include an active bottom surface Ba formed to a relatively lower height in a position corresponding to an active region 300, and an isolating bottom surface Bi formed to a relatively higher height in a position corresponding to a device isolation region 200.

Figure 4C:
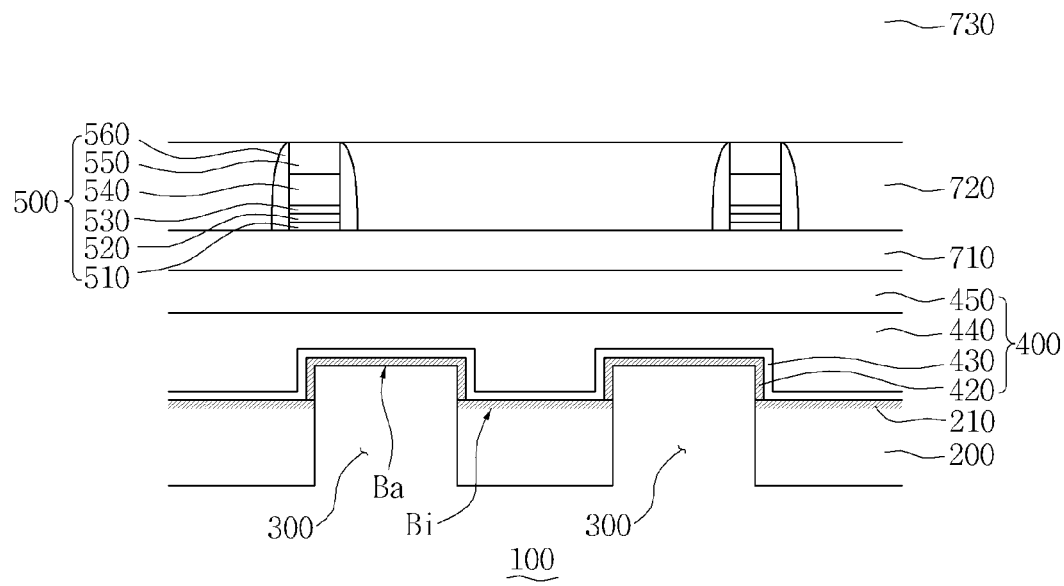
Figure 4D:
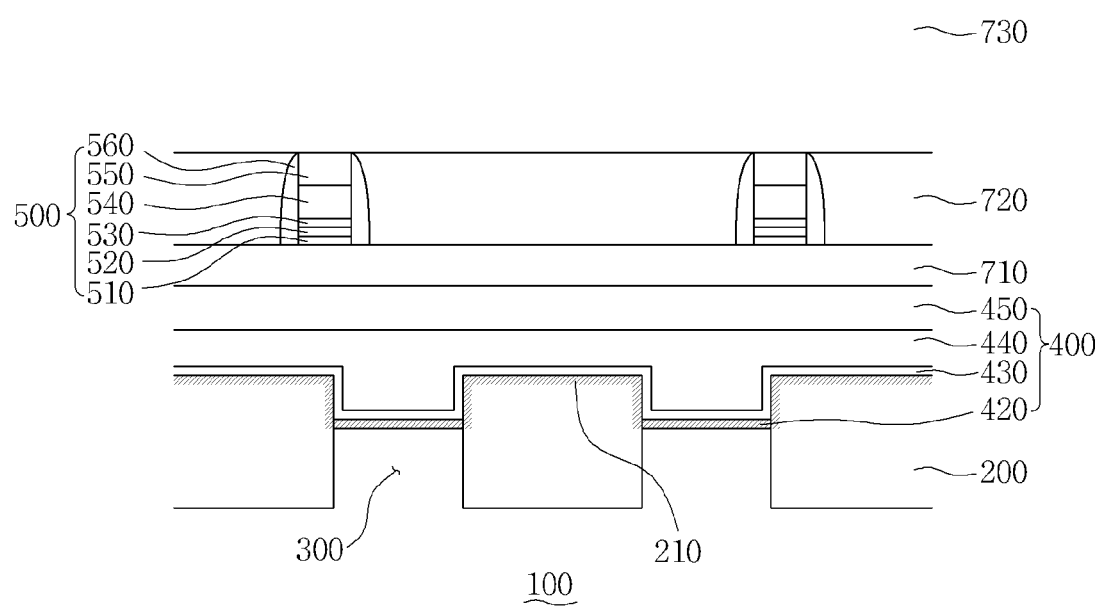

Referring to FIGS. 4C and 4D, in each of semiconductor devices 30C and 30H according to other example embodiments, a gate insulating layer 420 may be formed only in active regions 300 with further reference to FIGS. 4A and 4B. For example, the gate insulating layer 420 may not be formed in device isolation regions 200. However, the device isolation regions 200 may respectively include nitrided regions 210 formed along surfaces of the device isolation regions 200.

Each of the semiconductor devices 10A to 10C, 20A to 20H, and 30A to 30D shown in FIGS. 1 and 2A through 4D, according to various example embodiments, may include a partially or wholly nitrided gate insulating layer 420. Silicon nitride may have a higher dielectric constant than silicon oxide. In this case, the gate insulating layer 420 including nitride may have a smaller equivalent oxide thickness (EOT) than a gate insulating layer having only oxide. That is, even if the thickness of the gate insulating layer 420 is physically increased, the thickness of the gate insulating layer 420 may be electrically reduced. Accordingly, a threshold voltage and leakage current of a metal-oxide-semiconductor field-effect transistor (MOSFET) may be reduced so that the MOSFET may have an increased on-current and a reduced off-current. As a result, the performance and efficiency of the MOSFET may be improved.

Each of the semiconductor devices 20A to 30D shown in FIGS. 3A through 4D according to various example embodiments may include a gate insulating layer 420 having an increased surface area. That is, an area of the gate insulating layer 420 disposed adjacent to each of the active regions 300 may be increased using various methods. Accordingly, a channel width of the MOSFET may be increased, thereby improving the driving capability of the MOSFET.

When the gate barrier layer 430 includes titanium nitride, grains of the titanium nitride may be grown during various subsequent processes. In this case, the gate barrier layer 430 may physically apply stress to the gate insulating layer 420. For example, during the growth of the grains of the gate barrier layer 430, damage (e.g., dents, stabs, slits, recesses, and grooves) may be partially or wholly inflicted on the gate insulating layer 420. The damage may be used as current leakage paths to preclude operations of the MOSFET. Accordingly, the gate insulating layer 420 may need to be physically hard. When the gate insulating layer 420 is physically hard, damage caused by physical stress applied to the gate insulating layer 420 by the gate barrier layer 430 or the gate electrode 440 may be prevented or suppressed. That is, when silicon oxide is converted into silicon oxynitride or silicon nitride, physical damage inflicted on the gate insulating layer 420 may be prevented or suppressed.

It is assumed that each of the semiconductor devices 10A to 10C, 20A to 20H, and 30A to 30D shown in FIGS. 1 through 4D, according to various example embodiments, necessarily includes the gate barrier layer 430. However, in other example embodiments, the gate barrier layer 430 may be omitted. That is, the gate electrode layer 440 may be in direct contact with the gate insulating layer 420.

In each of the semiconductor devices 20A to 30D shown in FIGS. 2A through 4D according to various example embodiments, respective components may be variously combined with one another.

FIGS. 5A through 5D are conceptual flowcharts illustrating methods of fabricating semiconductor devices according to various example embodiments.

Figure 5A:
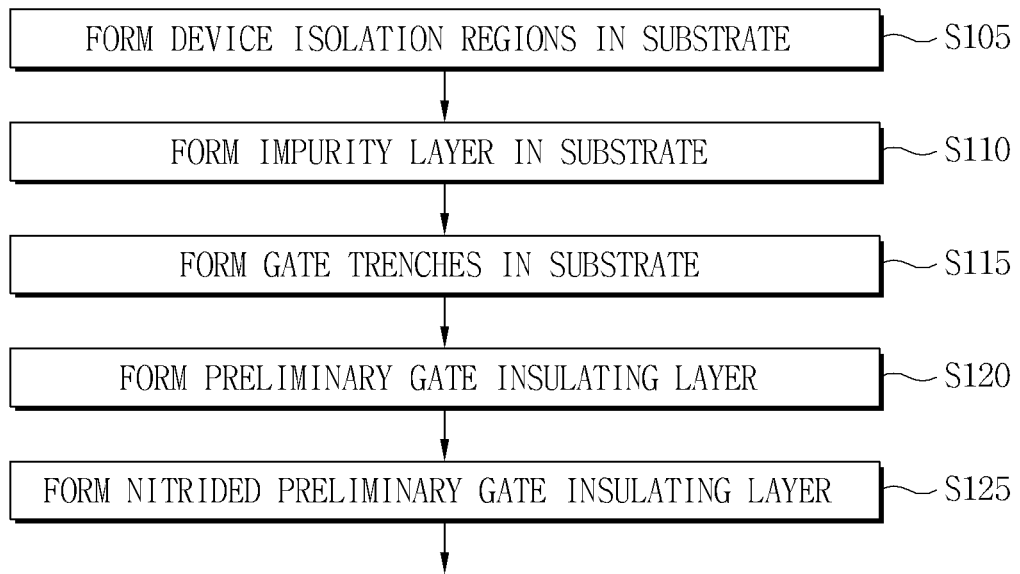
FIGS. 5A through 5D are conceptual flowcharts illustrating methods of fabricating semiconductor devices according to various example embodiments.
Figure 5B:
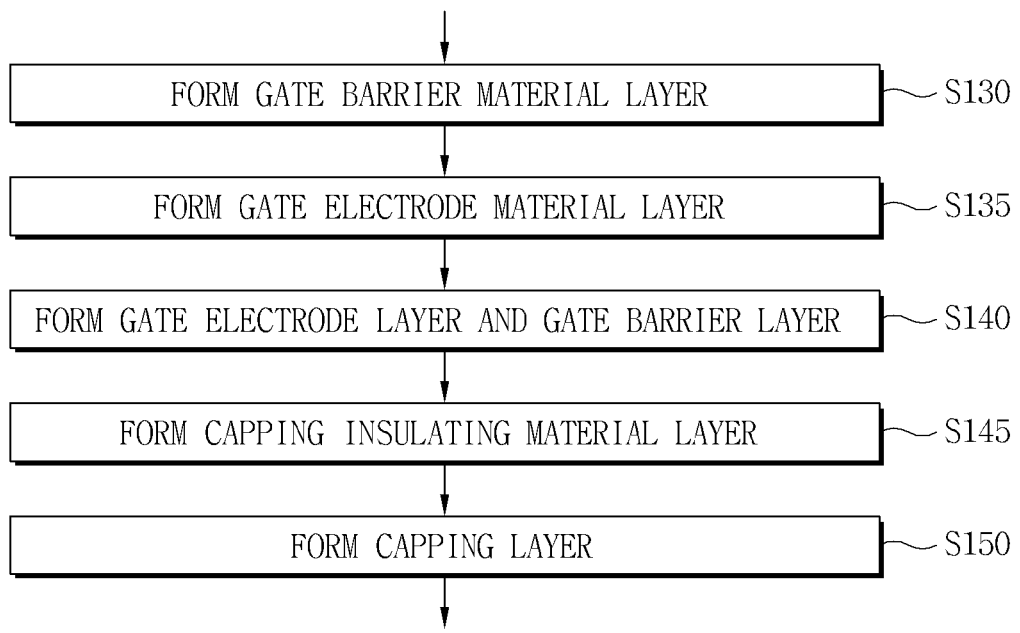
Figure 5C:
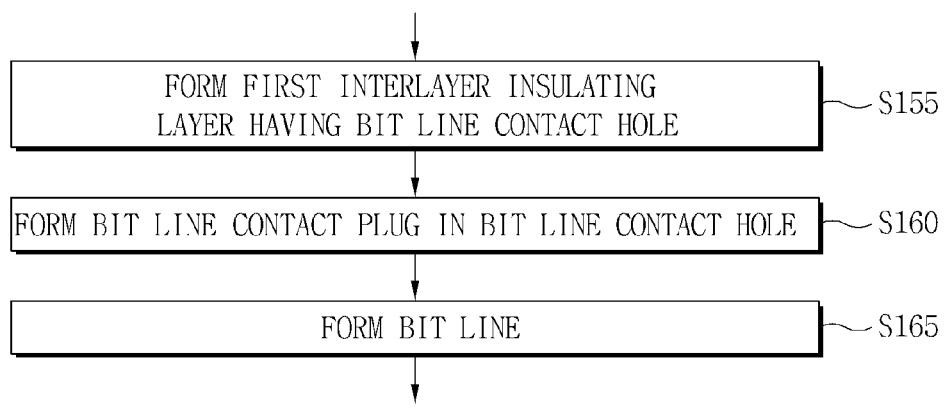
Figure 5D:
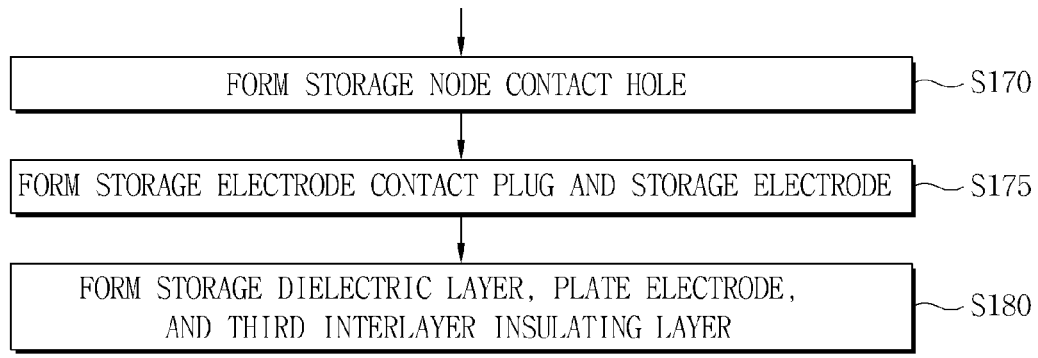

For example, FIG. 5A is a conceptual flowchart illustrating a method of forming a nitride preliminary gate insulating layer, FIG. 5B is a conceptual flowchart illustrating a method of forming a gate structure, FIG. 5C is a conceptual flowchart illustrating a method of forming bit lines, and FIG. 5D is a conceptual flowchart illustrating a method of forming capacitors.

Figure 6A:
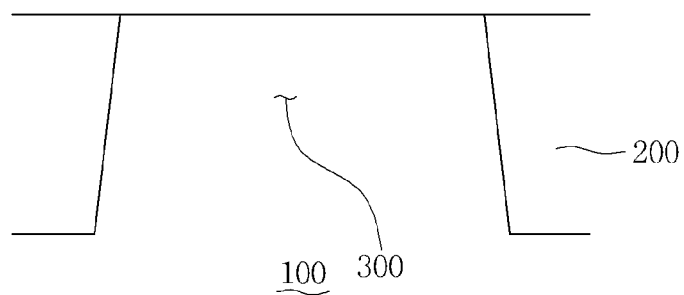
FIGS. 6A through 6Q, 7A through 7E, and 8A through 8C are diagrams illustrating methods of fabricating semiconductor devices according to example embodiments.
Figure 6B:
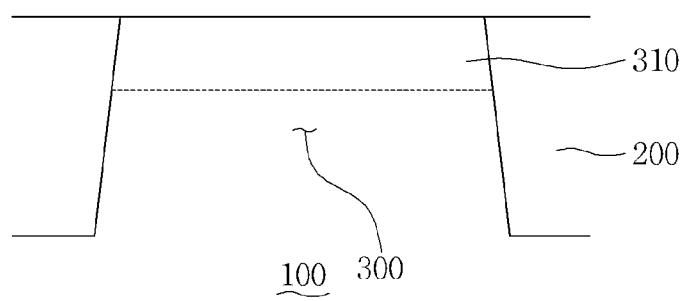
Figure 6C:
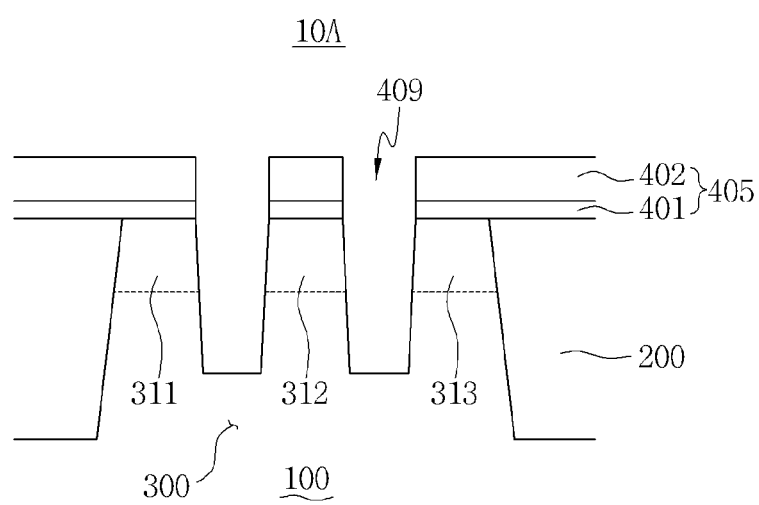
Figure 6D:
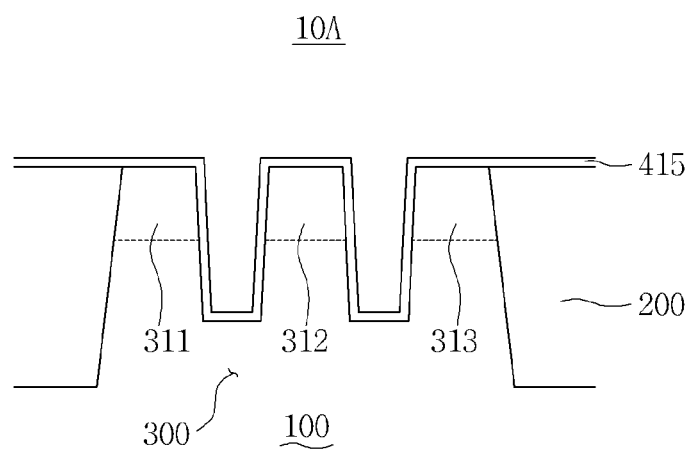
Figure 6E:
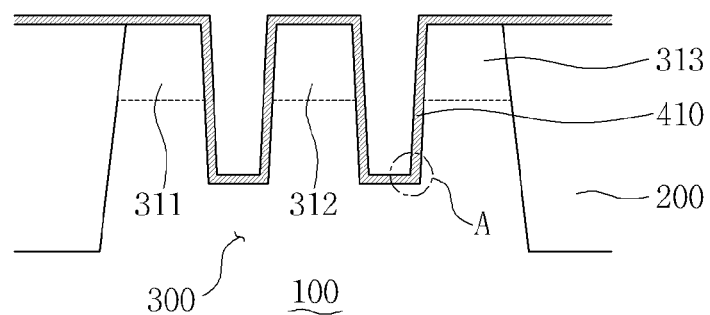
Figure 6F:
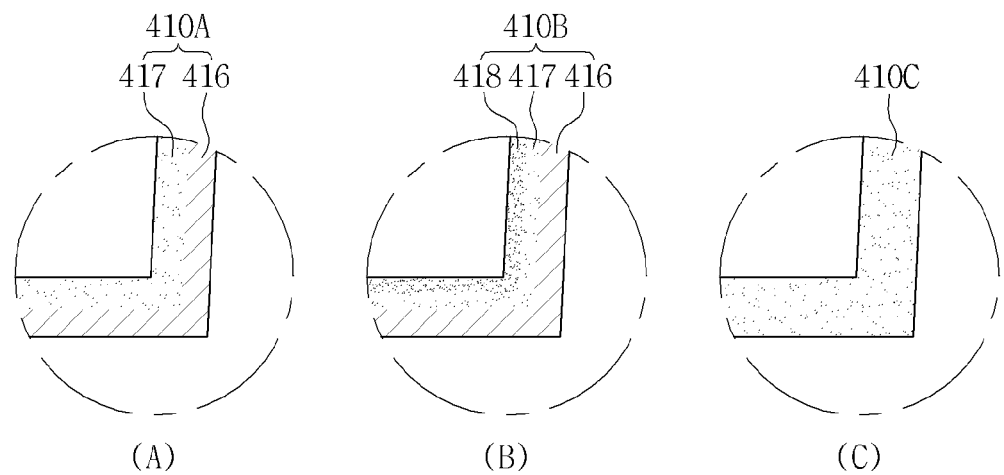
Figure 6G:
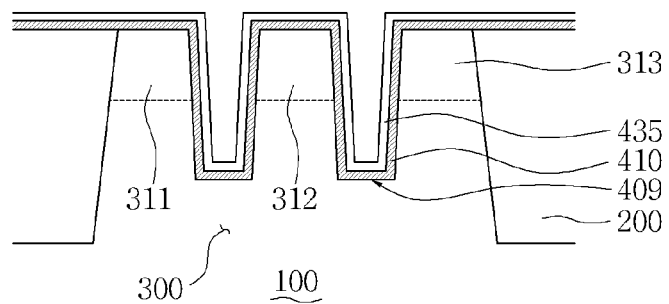
Figure 6H:
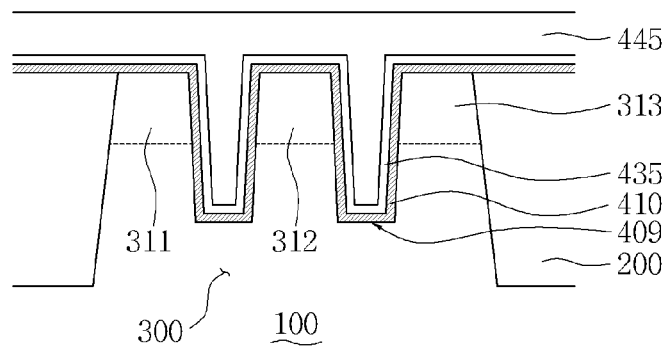
Figure 6I:
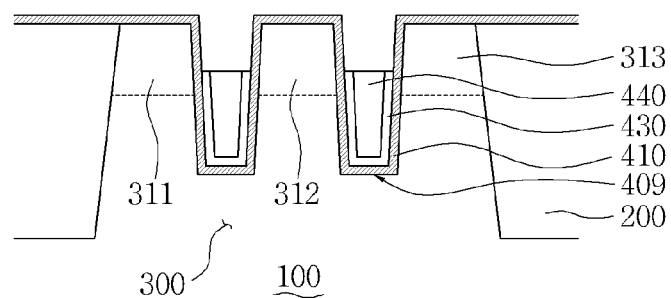
Figure 6J:
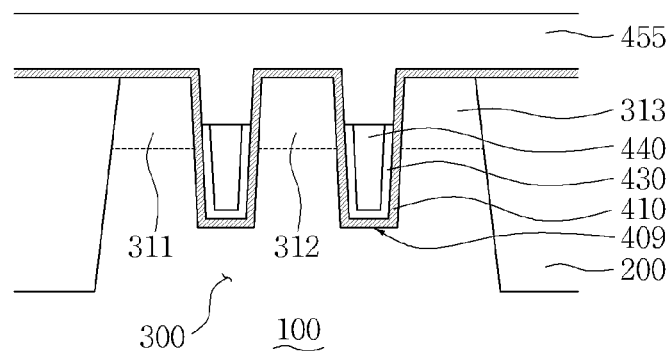
Figure 6K:
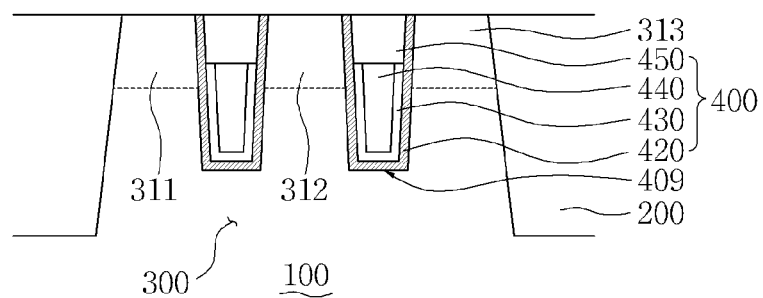
Figure 6L:
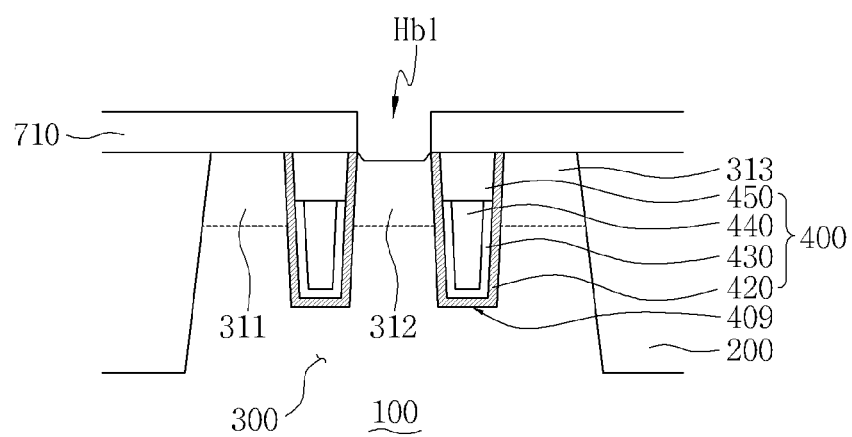
Figure 6M:
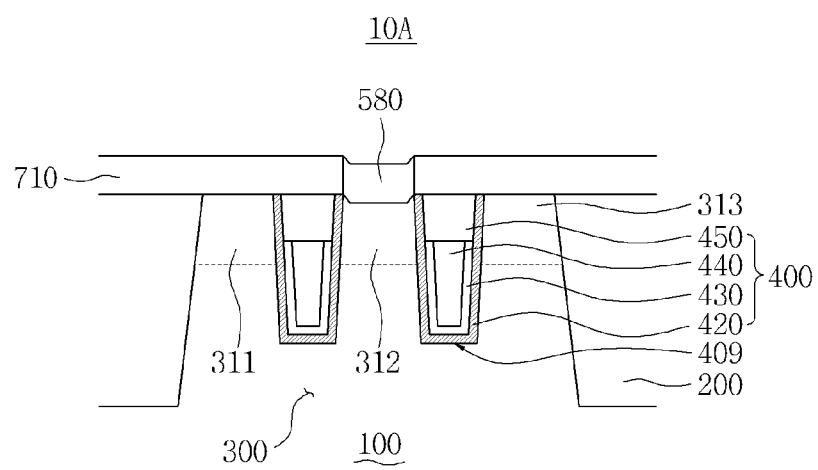
Figure 6N:
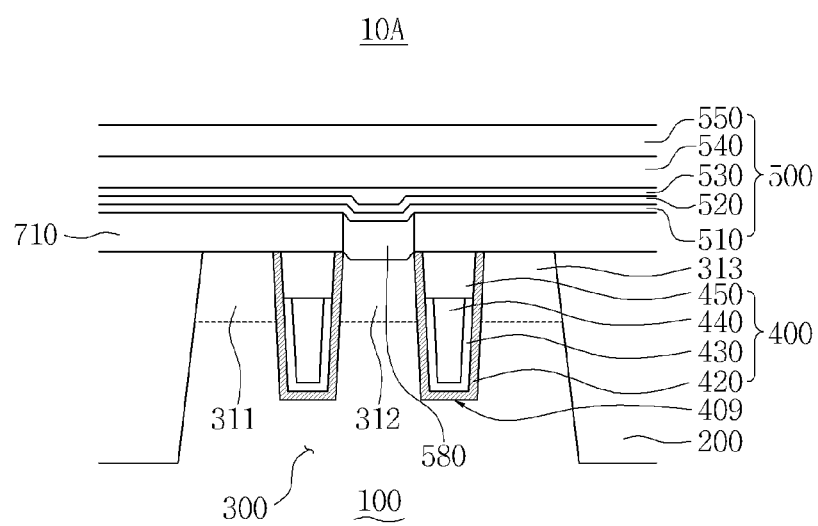
Figure 6O:
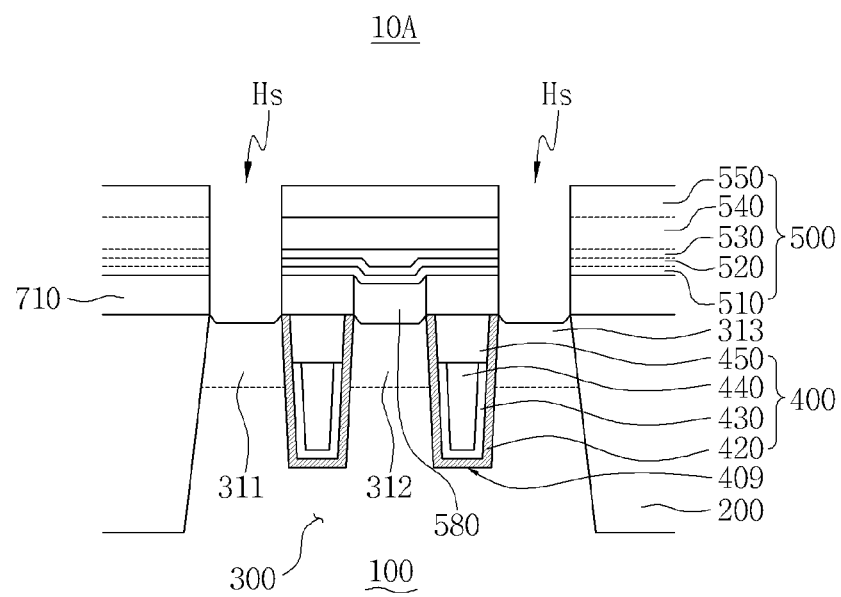
Figure 6P:
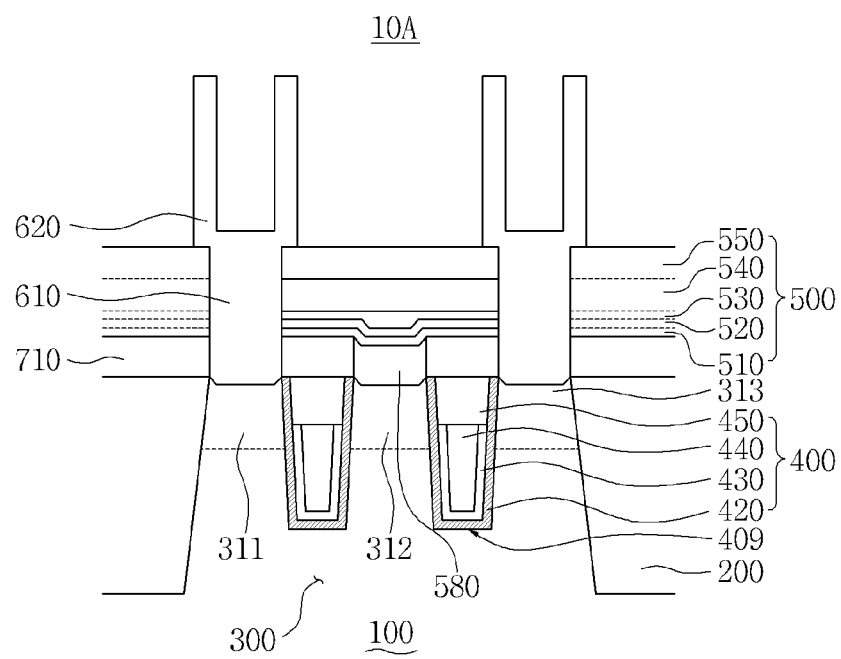
Figure 6Q:
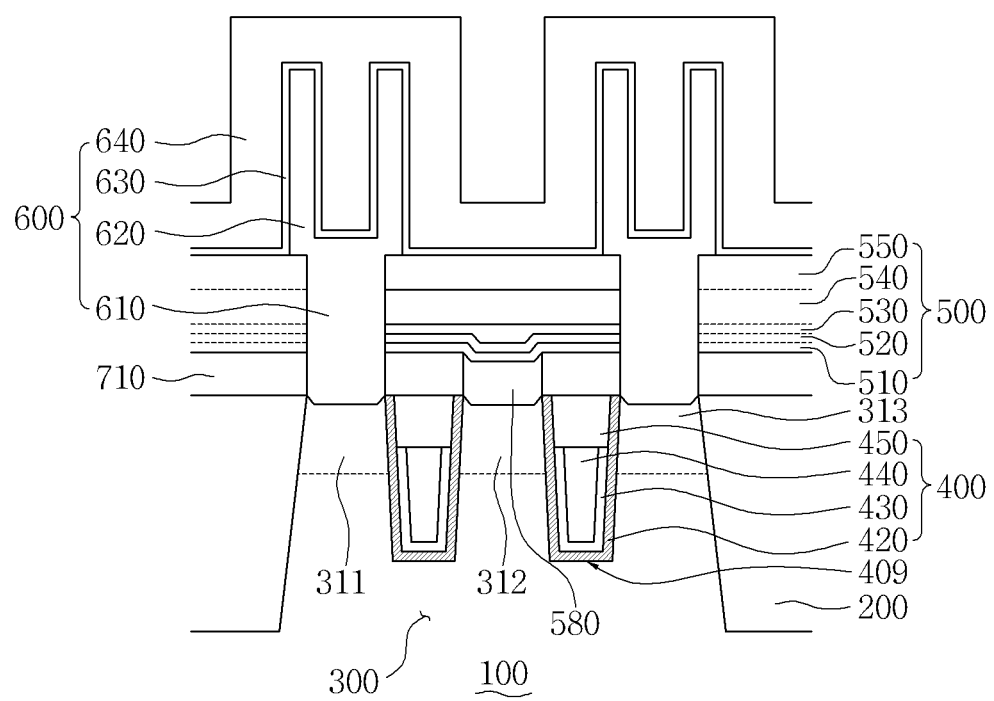

FIGS. 6A through 6Q are conceptual longitudinal sectional views illustrating a method of fabricating the semiconductor device shown in FIG. 2A according to example embodiments.

Referring to FIGS. 5A and 6A, the method of fabricating the semiconductor device 10A according to the example embodiments may include forming device isolation regions 200 in a substrate 100 to define an active region 300 (S105). Accordingly, the active region 300 may be defined by the device isolation regions 200. The device isolation regions 200 may be formed using a shallow trench isolation (STI) technique. Lateral surfaces of the device isolation regions 200 may be tapered. The substrate 100 may include a silicon bulk substrate including single-crystalline silicon, a SOI substrate, a SiGe epitaxial substrate, a SiC epitaxial substrate, or various other substrates. The formation of the device isolation region 300 may include forming trenches in the substrate 100, and filling the trenches with an insulating material (e.g., silicon oxide and/or silicon nitride).

Referring to FIGS. 5A and 6B, the method of fabricating the semiconductor device 10A according to example embodiments may include forming an impurity layer 310 in the substrate 100 (S110). The formation of the impurity layer 310 may include implanting phosphorus (P), arsenic (As), or boron (B) into the substrate 100. The impurity layer 310 may be used as a source and/or a drain.

Referring to FIGS. 5A and 6C, the method of fabricating the semiconductor device 10A according to example embodiments may include forming gate trenches 409 in the substrate 100 (S115). The formation of the gate trenches 409 may include removing the substrate to expose portions of the device isolation regions 200 and/or the active regions 300. Alternatively, the gate trenches 409 may intersect the device isolation regions 200 and/or the active regions 300. The formation of the gate trenches 409 may include entirely forming a mask pattern 405 for forming gate trenches on the substrate 100, and removing exposed portions of the substrate 100. The mask pattern 405 for forming the gate trenches may include a lower mask pattern 401 and an upper mask pattern 402. The lower mask pattern 401 may include silicon oxide, and the upper mask pattern 402 may include silicon nitride. During this process, the gate trenches 409 may separate the impurity layer 310 into source regions 311 and 313 and a drain region 312. The source regions 311 and 313 and the drain region 312 may be used in exchange for each other. Subsequently, the mask pattern 405 for forming the gate trenches may be removed. In other example embodiments, a subsequent process may be performed with the mask pattern 405 for forming the gate trenches partially or wholly left, as will be understood with reference to other drawings.

Referring to FIGS. 5A and 6D, the method of fabricating the semiconductor device 10A according to example embodiments may include forming a preliminary insulating layer 415 in the gate trenches 409 (S120). The preliminary gate insulating layer 415 may be conformally formed on a surface of the substrate 100, surfaces of the device isolation regions 200, and bottom surfaces and inner walls of the gate trenches 409. The preliminary gate insulating layer 415 may include silicon oxide. For example, the preliminary gate insulating layer 415 may be obtained by thermally oxidizing an exposed surface of the substrate 100. In other example embodiments, the preliminary gate insulating layer 415 may be formed using an atomic layer deposition (ALD) method. In addition, when the preliminary gate insulating layer 415 is formed using an oxidation process, the surface of the substrate 100 may be oxidized so that a boundary between the preliminary gate insulating layer 415 and the surface of the substrate 100 after oxidation may be formed inside the substrate 100 (or at a lower height). However, for brevity, FIG. 6D illustrates that the boundary between the preliminary gate insulating layer 415 and the surface of the substrate 100 is disposed on the surface of the substrate 100 (at the same height before and after oxidation).

Referring to FIGS. 5A and 6E, the method of fabricating the semiconductor device 10A according to example embodiments may include nitriding the preliminary gate insulating layer 415 to form a nitrided preliminary gate insulating layer 410 (S125). The nitridation of the preliminary gate insulating layer 415 may be performed using plasma. The nitridation of the preliminary gate insulating layer 415 may be performed using microwaves having power between about 1500 W and about 3800 W and a frequency of about 2.45 GHz as a power source for plasma. For example, microwaves having power between about 3000 W and about 3600 W may be used. Because microwaves having a frequency of about 2.45 GHz are widely used in the industrial field, a low-cost process may be realized without complicated equipment or new equipment. When microwaves have power of less than about 1500 W, plasma may not be sufficiently excited to cause a shortage of reactant sources, such as radicals. That is, because the nitridation process has low reactivity, processing rate or throughput may be degraded. When microwaves have power of more than about 3800 W, reactant sources (e.g., radicals) may be excessively generated so that an appropriate plasma region may not be maintained. That is, process reliability and yield may be degraded.

The nitridation of the preliminary gate insulating layer 415 may be performed using an RF bias having a frequency of about 13.56 MHz, and power between about 100 W and about 300 W. When the RF bias has power of less than about 100 W, radicals may be weakly accelerated, thereby precluding the nitridation of the preliminary gate insulating layer 415 formed on the bottom surfaces of the gate trenches 409. When the RF bias has power of more than about 300 W, the radicals may be excessively accelerated, thereby precluding the nitridation of the preliminary gate insulating layer 415 formed on the inner walls of the gate trenches 409. Accordingly, when the RF bias has power between about 100 W and about 300 W, the preliminary gate insulating layer 415 formed on the bottom surfaces and inner walls of the gate trenches 409 may be conformally and uniformly nitrided.

The nitridation of the preliminary gate insulating layer 415 may be performed in a vacuum chamber with pressure between about 100 mTorr and about 400 mTorr. When the vacuum chamber has a pressure of about 100 mTorr or less, horizontal portions of the preliminary gate insulating layer 415 may be effectively nitrided, while vertical portions (e.g., inner walls of the gate trenches 409) thereof may not be properly nitrided.

The nitridation of the preliminary gate insulating layer 415 may be performed at a temperature between about 450° C. and about 550° C. For instance, the substrate 100 or a component in direct contact with the substrate 100 may be heated to a temperature between about 450° C. and about 550° C. When the temperature of the component in direct contact with the substrate 100 is less than about 450° C., the temperature of the substrate 100 may be low, thereby degrading the volatility of by-products or reactivity. When the temperature of the component in direct contact with the substrate 100 is more than about 550° C., controlling the reaction rate may be difficult, or the diffusion or mobility of reactant sources may excessively increase.

The nitridation of the preliminary gate insulating layer 415 may be performed using nitrogen ($N_2$), ammonia ($NH_3$), hydrogen ($H_2$), or argon (Ar). For example, the nitridation of the preliminary gate insulating layer 415 may be performed using a combination of a combination of $NH_3$ gas and Ar gas, or a combination of $N_2$ gas, $H_2$ gas, and Ar gas. For instance, when the combination of a combination of $NH_3$ gas and Ar gas is used, the $NH_3$ gas may be supplied into a process chamber at a flow rate between about 100 sccm and about 500 sccm, and the Ar gas may be supplied into the process chamber at a rate between about 1000 sccm and about 3000 sccm, which may be as much as several times the flow rate of the $NH_3$ gas. Also, when the combination of $N_2$ gas, $H_2$ gas, and Ar gas is used, the $N_2$ gas may be supplied into the process chamber at a flow rate between about 50 sccm and about 400 sccm, the $H_2$ gas may be supplied at a flow rate between about 20 sccm and about 200 sccm, and the Ar gas may be supplied at a flow rate between about 500 sccm and about 3000 sccm.

In the example embodiments, experiments were conducted by supplying $NH_3$ gas and Ar gas at flow rates of about 150 sccm and about 1500 sccm, respectively, or by supplying $N_2$ gas, $H_2$ gas, and Ar gas at flow rates of about 100 sccm, about 50 sccm, and about 1500 sccm, respectively. This will be described later in further detail with reference to FIGS. 14 and 15.

When source gases (e.g., $NH_3$ and $N_2$ gases) for supplying $N_2$ are supplied at insufficient flow rates, reactivity is degraded. When the source gases for supplying $N_2$ are supplied at excessive flow rates, nitrogen (N) may permeate into unnecessary portions. When the Ar gas is supplied at an insufficient flow rate, it may be difficult to form dangling bonds on the surface of the preliminary gate insulating layer 415 to degrade reactivity. In contrast, when the Ar gas is supplied at an excessive flow rate, unnecessary damage may be applied to the surface of the preliminary gate insulating layer 415. The $H_2$ gas may serve to capture oxygen ($O_2$) discharged from the preliminary gate insulating layer 415, control reaction rates, or passivate the nitrided surface of the preliminary gate insulating layer 415.

In other example embodiments, the preliminary gate insulating layer 415 may be nitrided as a multilayered type. In other example embodiments, the preliminary gate insulating layer 415 may be wholly nitrided. In various example embodiments, the nitrogen (N) content of the nitrided preliminary gate insulating layer 410 may be gradiently distributed. For example, the N content of the nitrided preliminary gate insulating layer 410 may increase toward the surface thereof, and decrease toward the substrate 100.

FIG. 6F is a conceptual enlarged view of region A of FIG. 6E.

Referring to (A) of FIG. 6F, a nitrided preliminary gate insulating layer 410A according to example embodiments may include a silicon oxide layer 416 and a silicon oxynitride layer 417. For instance, a surface of the silicon oxide layer 416 of FIG. 6E may be nitrided to form the silicon oxynitride layer 417.

Referring to (B) of FIG. 6F, a nitrided preliminary gate insulating layer 410B according to other example embodiments may include a silicon oxide layer 416, a silicon oxynitride layer 417, and a silicon nitride layer 418.

Referring to (C) of FIG. 6E, a nitrided preliminary gate insulating layer 410C according to yet other example embodiments may wholly include only a silicon oxynitride layer or a silicon nitride layer.

In (A) through (C) of FIG. 6F, the silicon oxynitride layer 417 or the silicon nitride layer 418 may be richer in oxygen than in nitrogen toward the silicon oxide layer 416, and richer in nitrogen than in oxygen toward the surface of the silicon oxynitride layer 417 or the silicon nitride layer 418. That is, boundaries may not be clear, but nitrogen or oxygen content may be gradiently varied. In all the drawings appended to the present specification, the nitrided preliminary gate insulating layer 410A will be hatched in the same way. However, it should be understood that the nitrided preliminary gate insulating layer 410 may be variously formed, as shown in FIG. 6F.

Referring to FIGS. 5B and 6G, the method of fabricating the semiconductor device according to example embodiments may include conformally forming a gate barrier material layer 435 on the nitrided preliminary gate insulating layer 410 (S130). The gate barrier material layer 435 may be formed by means of an ALD process or a chemical vapor deposition (CVD) process using heat or plasma. The gate barrier material layer 435 may include a metal compound. For example, the gate barrier material layer 435 may include a single-layered or multilayered metal, or metal compound (e.g., Ti, TiN, Ta, TaN, Ru, RuN, W, WTi, WN or combinations thereof). In the present example embodiments, it is assumed that the gate barrier material layer 435 includes titanium nitride.

Referring to FIGS. 5B and 6H, the method of forming the semiconductor device 10A according to example embodiments may include forming a gate electrode material layer 445 on the gate barrier material layer 435 (S135). The gate electrode material layer 445 may be formed by means of an ALD process or CVD process using heat or plasma. The gate electrode material layer 445 may include a conductive material. For example, the gate electrode material layer 445 may include a metal (e.g., tungsten).

Referring to FIGS. 5B and 6I, the method of fabricating the semiconductor device 10A according to example embodiments may include forming a gate electrode layer 440 and a gate barrier layer 430 (S140). The formation of the gate electrode layer 440 and the gate barrier layer 430 may include partially removing the gate electrode material layer 445 and the gate barrier material layer 435 using an etch-back process. A top surface of the gate electrode 440 and topmost ends of the gate barrier layer 430 may be recessed to a lower level than the surface of the substrate 100.

Referring to FIGS. 5B and 6J, the method of fabricating the semiconductor device 10A according to example embodiments may include forming a gate capping insulating material layer 455 (S145) covering the resulting structure. The gate capping insulating material layer 455 may be formed by means of a chemical deposition process using heat or plasma. The gate capping insulating material layer 455 may include silicon nitride.

Referring to FIGS. 5B and 6K, the method of fabricating the semiconductor device 10A according to example embodiments may include forming a gate capping layer 450 (S150). The formation of the gate capping layer 450 may include partially removing the gate capping insulating material layer 455 using an etch-back process. The gate capping layer 450 may fill the insides of the gate trenches 409.

Referring to FIGS. 5C and 6L, the method of fabricating the semiconductor device 10A according to example embodiments may include forming a first interlayer insulating layer 710 (S155). The first interlayer insulating layer 710 may have a bit line contact hole Hbl exposing the surface of the substrate 100. In other words, the bit line contact hole Hbl may expose the drain region 312. The surface of the substrate 100 may be slightly recessed. The first interlayer insulating layer 710 may be formed by means of a chemical deposition process using heat or plasma. The bit line contact hole Hbl may be formed by removing a portion of the first interlayer insulating layer 710 using photolithography and etching processes. The first interlayer insulating layer 710 may include silicon nitride, silicon oxide, or silicon oxynitride.

Referring to FIGS. 5C and 6M, the method of fabricating the semiconductor device 10A according to example embodiments may include forming a bit line contact plug 580 within the bit line contact hole Hbl (S160). The formation of the bit line contact plug 580 may include forming a conductive material (e.g., silicon) within the bit line contact hole Hbl and on the first interlayer insulating layer 710, and removing a portion of the conductive material using an etch-back process. A top surface of the bit line contact plug 580 may be recessed to a lower level than a top surface of the first interlayer insulating layer 710.

Referring to FIGS. 5C and 6N, the method of fabricating the semiconductor device 10A according to example embodiments may include forming a lower silicide layer 510, a bit line barrier layer 520, an upper silicide layer 530, a bit line electrode layer 540, and a bit line capping layer 550 on the first interlayer insulating layer 710 and the bit line contact plug 580 (S165). The lower silicide layer 510, the bit line barrier layer 520, the upper silicide layer 530, the bit line electrode layer 540, and the bit line capping layer 550 may constitute a bit line 500. Referring further to FIG. 1, because the bit lines 500 intersect the active regions 300 at an angle with respect to each other, the bit lines will not be seen from both end regions of the active regions 300. Therefore, dotted lines of FIG. 1 imaginarily illustrate components of the bit lines 500. A second interlayer insulating layer may be formed in portions illustrated with dotted lines. The second interlayer insulating layer will be described with reference to other appended drawings. Each of the lower silicide layer 510, the bit line barrier layer 520, the upper silicide layer 530, the bit line electrode layer 540, and the bit line capping layer 550 may be formed by means of an ALD or CVD process using heat or plasma. The lower and upper silicide layers 510 and 530 may include WSi, TiSi, TaSi, cobalt silicide (CoSi), or various other metal silicides. One or both of the lower and upper silicide layers 510 and 530 may be omitted. The bit line barrier layer 520 may include a metal nitride. For example, the bit line barrier layer 520 may include at least one of TiN, TaN, and WSi. The bit line electrode layer 540 may include at least one of W, Al, Cu, nickel (Ni), and various other metals. The bit line capping layer 550 may include an insulating material (e.g., silicon nitride or silicon oxynitride).

Referring to FIGS. 5D and 6O, the method of fabricating the semiconductor device 10A according to example embodiments may include forming storage electrode contact holes Hs (S170). Although FIG. 6O illustrates that the storage electrode contact holes Hs penetrate the components of the bit lines 500, the storage electrode contact holes Hs may penetrate the second interlayer insulating layer. The storage electrode contact holes Hs may be distinguished from or disposed adjacent to the components of the bit lines 500. That is, the storage electrode contact holes Hs may partially remove the components of the bit lines 500 but not penetrate the components of the bit lines 500.

Referring to FIGS. 5D and 6P, the method of fabricating the semiconductor device 10A according to example embodiments may include forming storage contact plugs 610 and storage electrodes 620 (S175). The storage contact plugs 610 may include a conductive material (e.g., doped poly-Si or a metal). Similarly, the storage electrodes 620 may include a conductive material (e.g., doped poly-Si) or a metal. The storage contact plugs 610 and the storage electrodes 620 may be formed using separate processes. Although the storage electrodes 620 may have various shapes, the present example embodiments illustrate that each of the storage electrodes 620 has a cylindrical shape.

Referring to FIGS. 5D and 6Q, the method of fabricating the semiconductor device 10A according to example embodiments may include forming a storage dielectric layer 630 and plate electrodes 640 (S180). The storage dielectric layer 630 may include an insulating material. The plate electrodes 640 may include doped poly-Si or a metal.

Subsequently, referring back to FIG. 2A, the method of fabricating the semiconductor device 10A according to example embodiments may include forming a third interlayer insulating layer 730 to cover the plate electrodes 640 (S185). The third interlayer insulating layer 730 may include silicon oxide.

FIGS. 7A through 7E are diagrams illustrating a method of fabricating the semiconductor device according to other example embodiments.

Figure 7A:
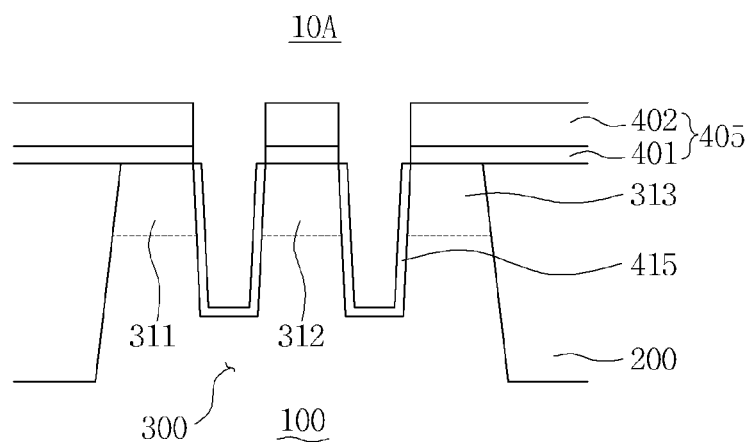

Referring to FIG. 7A, the method of fabricating the semiconductor device 10A according to example embodiments may include conformally forming a preliminary gate insulating layer 415 on bottom surfaces and inner walls of gate trenches 409 following the operations of FIG. 6C. The formation of the preliminary gate insulating layer 415 may include thermally oxidizing an exposed surface of a substrate 100. In other example embodiments, the preliminary gate insulating layer 415 may also be formed on lateral surfaces of a lower mask pattern 401. For example, when the lower mask pattern 401 includes silicon oxide and an upper mask pattern 402 includes silicon nitride, the preliminary gate insulating layer 415 may not be formed on the lateral surfaces of the upper mask pattern 402 as shown. In other example embodiments, the preliminary gate insulating layer 415 may also be formed on lateral surfaces of a mask pattern 405 for forming gate trenches.

Figure 7B:
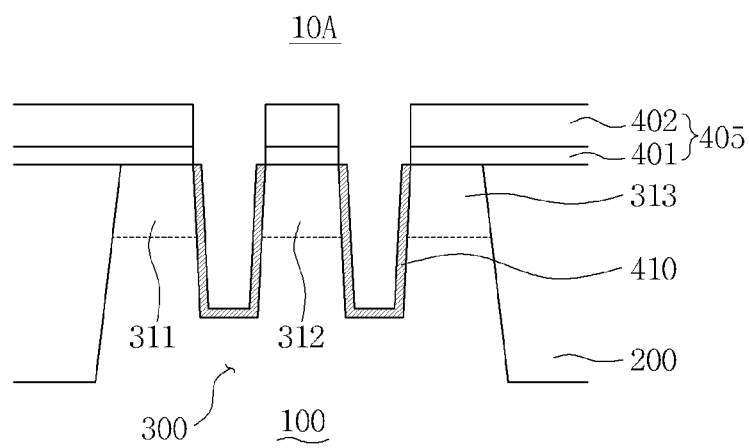

Referring to FIG. 7B, the method of fabricating the semiconductor device 10A according to example embodiments may include nitriding a surface of the preliminary gate insulating layer 415 to form a nitrided preliminary gate insulating layer 410. The nitridation of the surface of the preliminary gate insulating layer 415 will be understood with reference to FIG. 6E. The nitrided preliminary gate insulating layer 410 will be understood with reference to FIG. 6F.

Figure 7C:
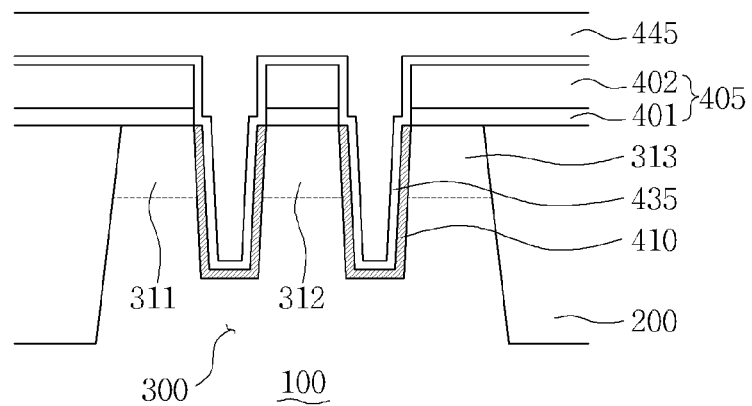

Referring to FIG. 7C, the method of fabricating the semiconductor device 10A according to example embodiments may include forming a gate barrier material layer 435 and a gate electrode material layer 445 on a surface of the nitrided preliminary gate insulating layer 410. The gate barrier material layer 435 may be formed by means of an ALD process or a CVD process using heat or plasma. The gate barrier material layer 435 may include a metal compound. For instance, the gate barrier material layer 435 may include a metal nitride (e.g., titanium nitride, tantalum nitride, or tungsten nitride). In the present example embodiments, it is assumed that the gate barrier material layer 435 includes titanium nitride. The gate electrode material layer 445 may be formed by means of an ALD process or a CVD process using heat or plasma. The gate electrode material layer 445 may include a conductive material. For example, the gate electrode material layer 445 may include a metal (e.g., tungsten).

Figure 7D:
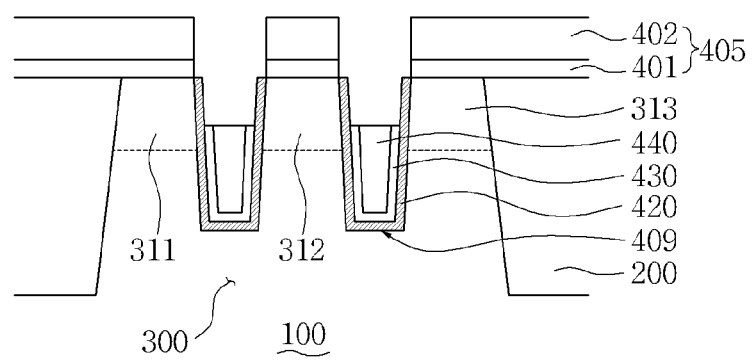

Referring to FIG. 7D, the method of fabricating the semiconductor device 10A according to example embodiments may include forming a gate electrode layer 440 and a gate barrier layer 430. The formation of the gate electrode layer 440 and the gate barrier layer 430 may include removing portions of the gate electrode material layer 445 and the gate barrier material layer 435 using an etch-back process. A top surface of the gate electrode 440 and topmost ends of the gate barrier layer 430 may be recessed to a lower level than the surface of the substrate 100. The nitrided preliminary gate insulating layer 410 may form a gate insulating layer 420.

Figure 7E:
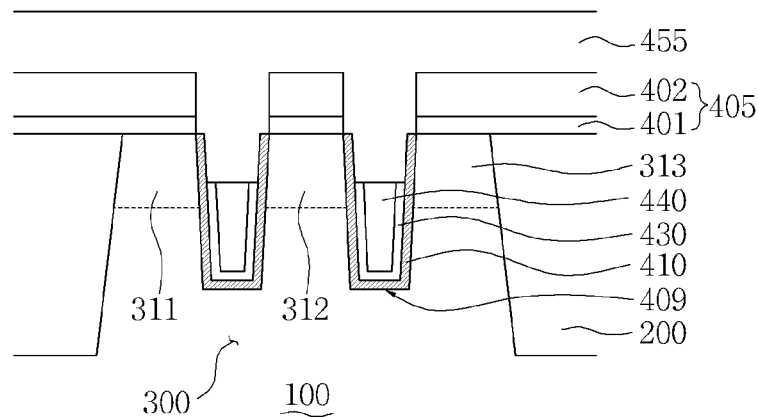

Referring to FIG. 7E, the method of fabricating the semiconductor device 10A according to example embodiments may include forming a gate capping insulating material layer 455 covering the resulting structure. The gate capping insulating material layer 455 may be formed by means of a chemical deposition method using heat or plasma. The gate capping insulating material layer 455 may include silicon nitride.

Subsequently, the method of fabricating the semiconductor device 10A according to example embodiments may include removing the gate capping material layer 455 and the mask pattern 405 for forming the gate trenches to form a gate capping layer 450 shown in FIG. 6K.

Figure 8A:
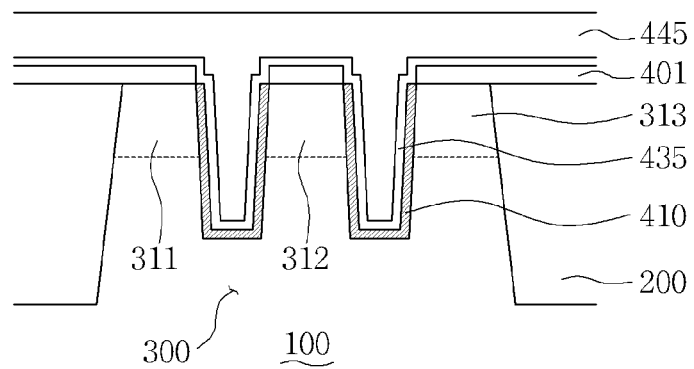
Figure 8B:
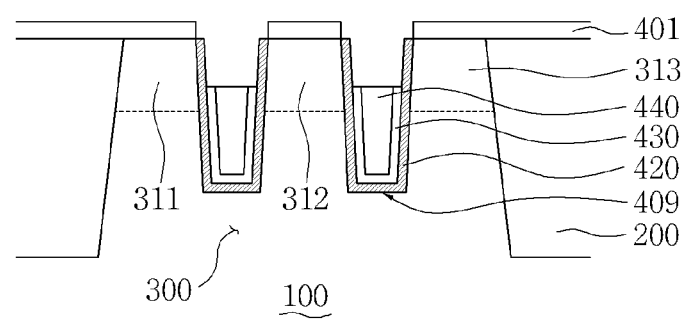
Figure 8C:
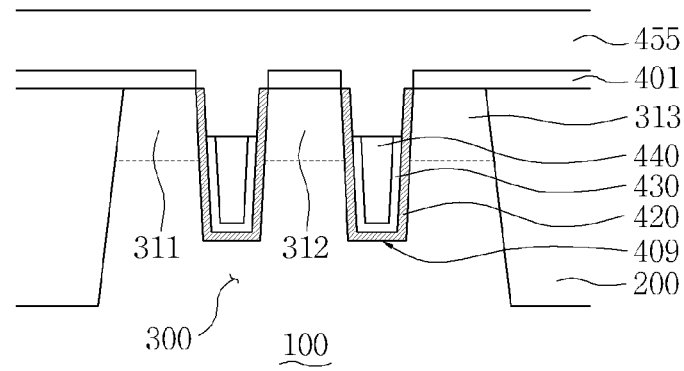

FIGS. 8A through 8C are diagrams illustrating a method of fabricating the semiconductor device according to yet other example embodiments.

Referring to FIG. 8A, the method of fabricating the semiconductor device 10A according to example embodiments may include removing an upper mask pattern 402, and forming a gate barrier material layer 435 and a gate electrode material layer 445 following the operations of FIG. 7B. The formation of the gate barrier material layer 435 and the gate electrode material layer 445 will be understood with reference to FIGS. 6G and 6H. In other example embodiments, a mask pattern 405 for forming gate trenches may be wholly removed.

Referring to FIG. 8B, the method of fabricating the semiconductor device 10A according to example embodiments may include forming a gate electrode layer 440 and a gate barrier layer 430. The formation of the gate electrode layer 440 and the gate barrier layer 430 will be understood with reference to FIG. 6I.

Referring to FIG. 8C, the method of fabricating the semiconductor device 10A according to example embodiments may include forming a gate capping material layer 455. The formation of the gate capping material layer 455 will be understood with reference to FIG. 6J. Subsequently, with further reference to FIG. 6K, the method of fabricating the semiconductor device 10A according to example embodiments may include forming a gate capping layer 450 by removing a portion of the gate capping material layer 455 and a lower mask pattern 401.

FIGS. 9A through 9G are diagrams illustrating a method of forming the semiconductor device shown in FIG. 2B according to example embodiments.

Figure 9A:
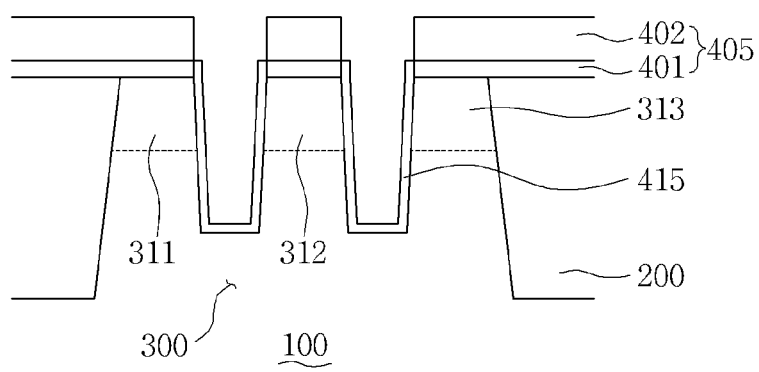
FIGS. 9A through 9G are diagrams illustrating methods of fabricating semiconductor devices according to other example embodiments.

Referring to FIG. 9A, the method of fabricating the semiconductor device 10B according to example embodiments, and with reference to FIG. 7A, may include conformally forming a preliminary gate insulating layer 415C on bottom surfaces and inner walls of gate trenches 409 following the operations of FIG. 6C. The preliminary gate insulating layer 415C may also be formed on lateral surfaces of a lower mask pattern 410.

Figure 9B:
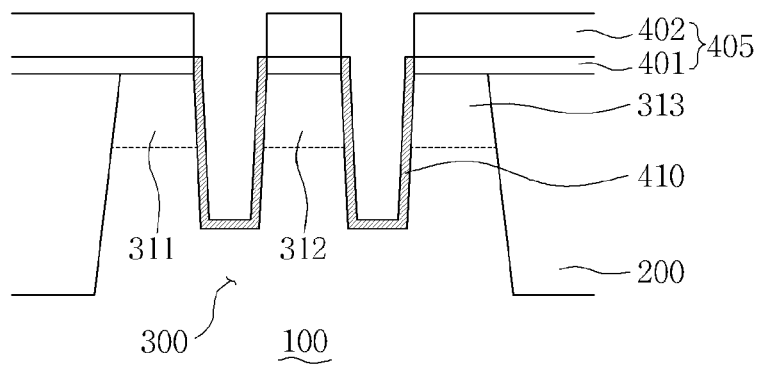

Referring to FIG. 9B, the method of fabricating the semiconductor device 10B according to example embodiments may include nitriding a surface of the preliminary gate insulating layer 415C to form a nitrided preliminary gate insulating layer 410.

Figure 9C:
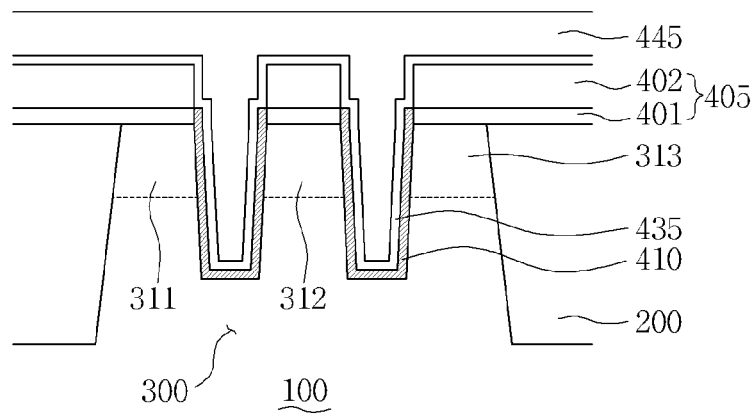

Referring to FIG. 9C, the method of fabricating the semiconductor device 10B according to example embodiments may include forming a gate barrier material layer 435 and a gate electrode material layer 445 on a surface of the nitrided preliminary gate insulating layer 410.

Figure 9D:
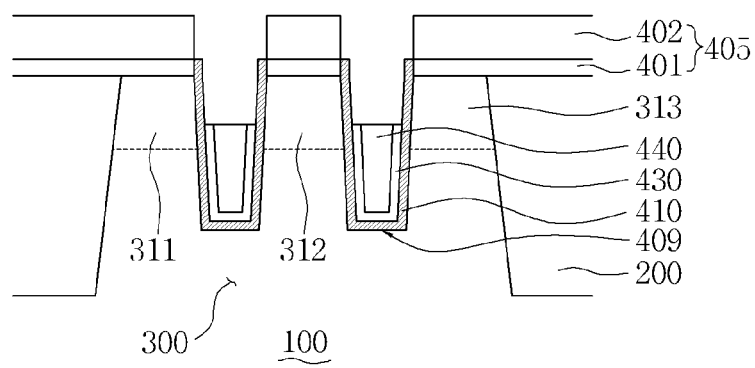

Referring to FIG. 9D, the method of fabricating the semiconductor device 10B according to example embodiments may include removing portions of the gate electrode material layer 445 and the gate barrier material layer 435 to form a gate electrode layer 440 and a gate barrier layer 430.

Figure 9E:
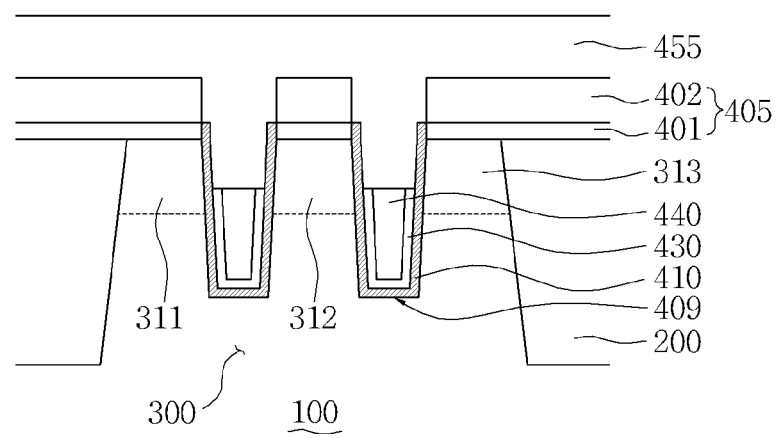

Referring to FIG. 9E, the method of fabricating the semiconductor device 10B according to example embodiments may include forming a gate capping insulating material layer 455 covering the resulting structure.

Figure 9F:
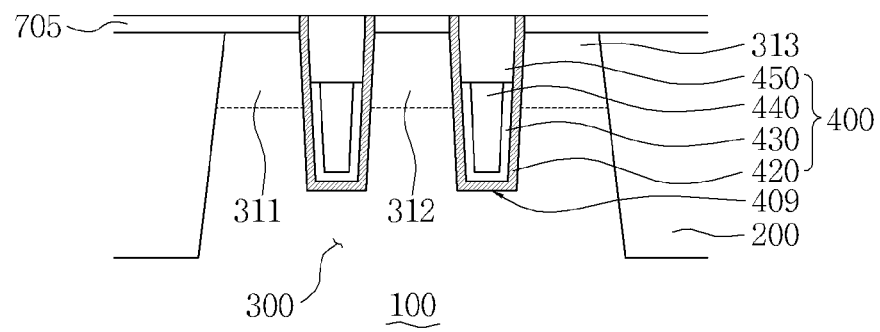

Referring to FIG. 9F, the method of fabricating the semiconductor device 10B according to example embodiments may include removing an upper portion of the gate capping material layer 455 and an upper mask pattern 402 to form a gate capping layer 450. The lower mask pattern 401 may form a bottom insulating layer 705. The nitrided preliminary gate insulating layer 410 may form a gate insulating layer 420.

Figure 9G:
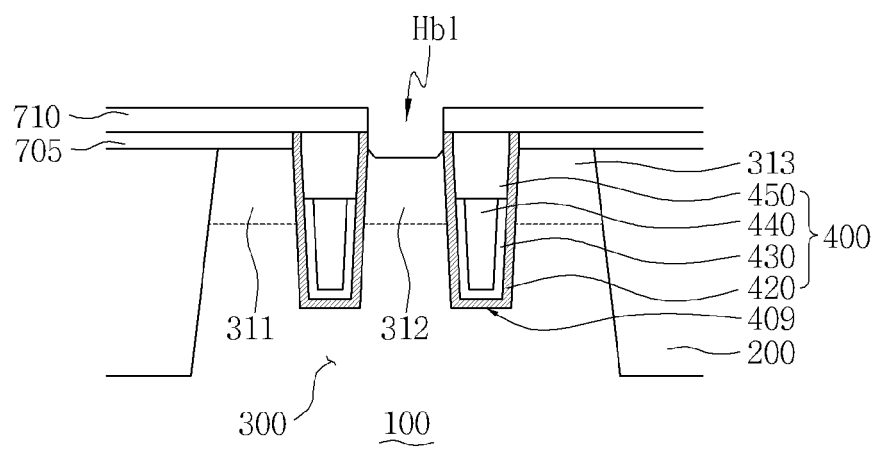

Referring to FIG. 9G, the method of fabricating the semiconductor device 10B according to example embodiments may include forming a first interlayer insulating layer 710 having a bit line contact hole Hbl on the bottom insulating layer 705. An exposed surface of the substrate 100 may be recessed by the bit line contact hole Hbl.

Subsequently, with reference to FIGS. 6M to 6Q, the semiconductor device 10B shown in FIG. 2B according to example embodiments may be formed.

FIGS. 10A through 10D are diagrams illustrating a method of forming the semiconductor device shown in FIG. 2C according to example embodiments.

Figure 10A:
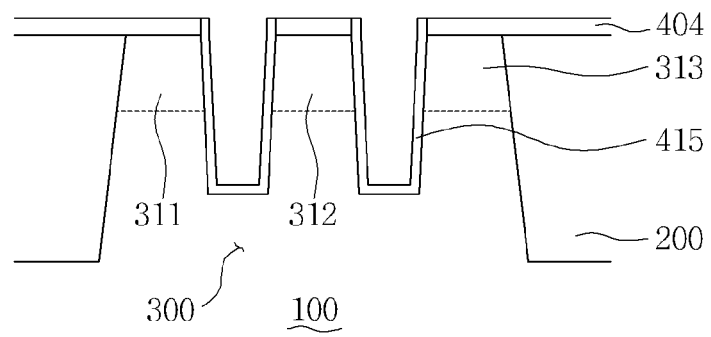
FIGS. 10A through 10D are diagrams illustrating methods of fabricating semiconductor devices according to other example embodiments.

Referring to FIG. 10A, the method of fabricating the semiconductor device 10C according to example embodiments may include removing an upper mask pattern 402 following the operations of FIG. 9A.

Figure 10B:
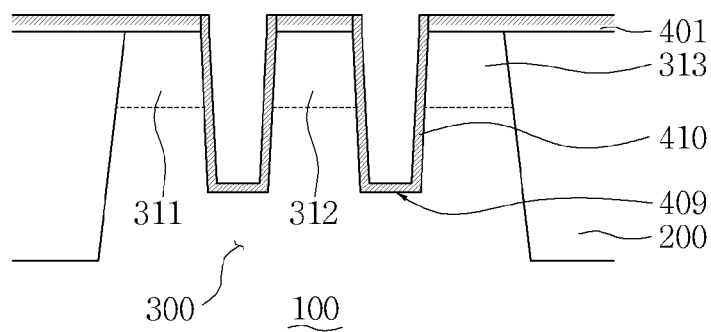

Referring to FIG. 10B, the method of fabricating the semiconductor device 10C according to example embodiments may include nitriding a surface of a preliminary gate insulating layer 415 to form a nitrided preliminary gate insulating layer 410. During this process, an upper portion of a lower mask pattern 401 may also be nitrided.

Figure 10C:
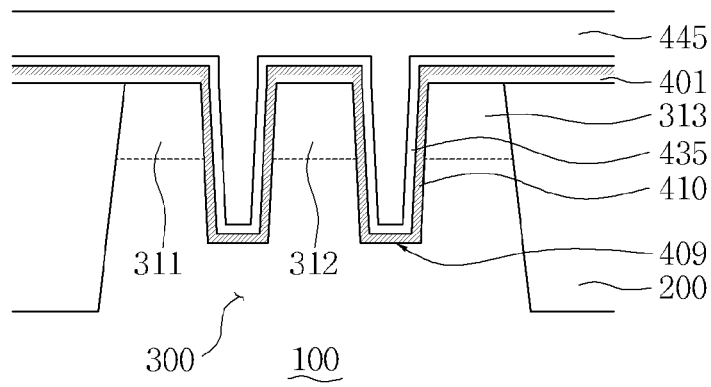

Referring to FIG. 10C, the method of fabricating the semiconductor device 10C according to example embodiments may include forming a gate barrier material layer 435 and a gate electrode material layer 445 on the nitrided preliminary gate insulating layer 410 and the lower mask pattern 401.

Figure 10D:
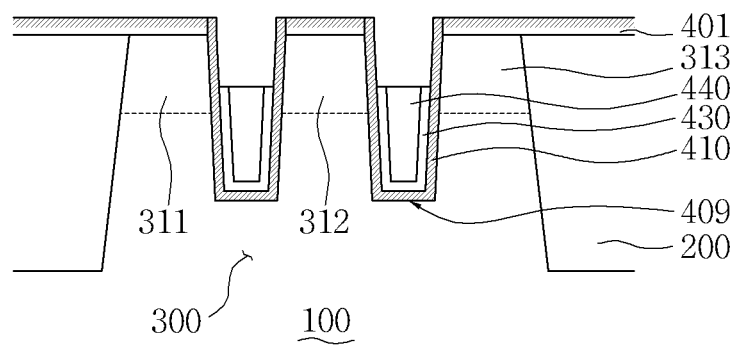

Referring to FIG. 10D, the method of fabricating the semiconductor device 10C according to example embodiments may include removing portions of the gate barrier material layer 435 and the gate electrode material layer 445 to form a gate barrier layer 430 and a gate electrode 440.

Subsequently, the semiconductor device 10C according to example embodiments may be formed with reference to FIGS. 6L through 6Q.

FIGS. 11A through 11I are conceptual longitudinal sectional views taken along line II-II' of FIG. 1, which illustrate a method of fabricating the semiconductor device shown in FIG. 3A according to example embodiments.

Figure 11A:
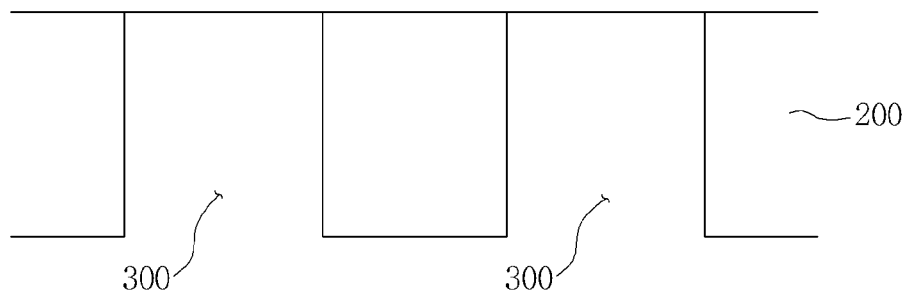
FIGS. 11A through 11K are diagrams illustrating methods of fabricating semiconductor devices according to other example embodiments.

Referring to FIG. 11A, the method of fabricating the semiconductor device 20A according to example embodiments may include forming device isolation regions 200 in a substrate 100 to define active regions 300. For brevity, it is assumed in FIG. 11A that lateral surfaces of the device isolation regions 200 are vertical.

Figure 11B:
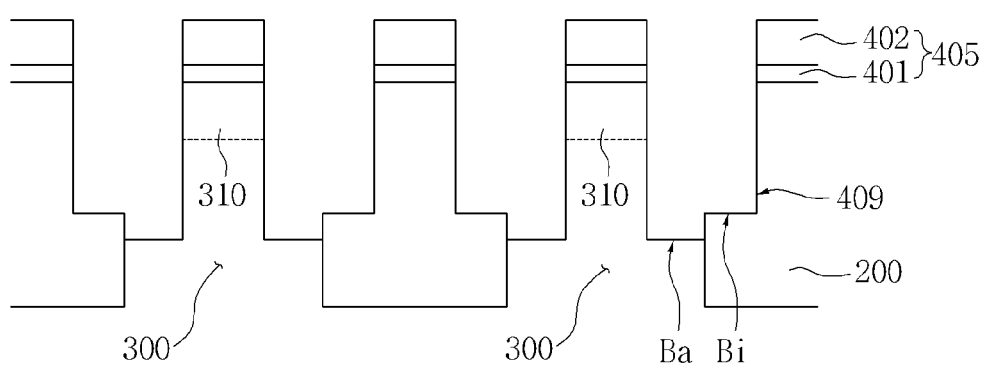

Referring to FIG. 11B, the method of fabricating the semiconductor device 20A according to example embodiments may include forming gate trenches 409. The formation of the gate trenches 409 will be understood with further reference to FIG. 6C. Before forming the gate trenches 409, an impurity layer 310 may be formed. In the present example embodiments, bottom surfaces of the gate trenches 409 may not be planar but have a step difference therebetween. For example, bottom surfaces Ba of the gate trenches 409 corresponding to the active regions 300 may be recessed to a lower level than bottom surfaces Bi of the gate trenches 409 corresponding to the device isolation regions 200.

Figure 11C:
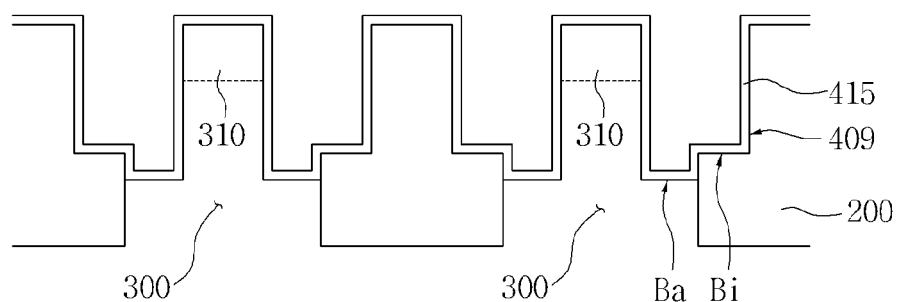

Referring to FIG. 11C, the method of fabricating the semiconductor device 20A according to example embodiments may include conformally forming a preliminary gate insulating layer 415 on a surface of the substrate 100, surfaces of the device isolation regions 200, and bottom surfaces and inner walls of the gate trenches 409. The formation of the preliminary gate insulating layer 415 will be understood with reference to FIG. 6D.

Figure 11D:
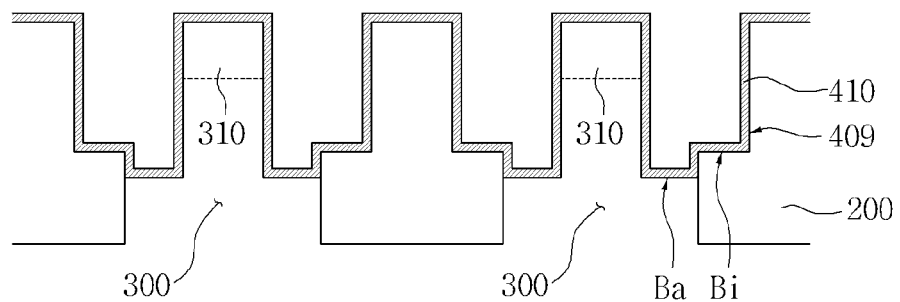

Referring to FIG. 11D, the method of fabricating the semiconductor device 20A according to example embodiments may include nitriding the preliminary gate insulating layer 415 to form a nitrided preliminary gate insulating layer 410. The formation of the nitrided preliminary gate insulating layer 410 will be understood with reference to FIG. 6E. To show the variety of the inventive concept, FIG. 11D illustrates that the nitrided preliminary gate insulating layer 410 is formed on the entire resultant structure. Various shapes of the nitrided preliminary gate insulating layer 410 will be understood with reference to FIG. 6F.

Figure 11E:
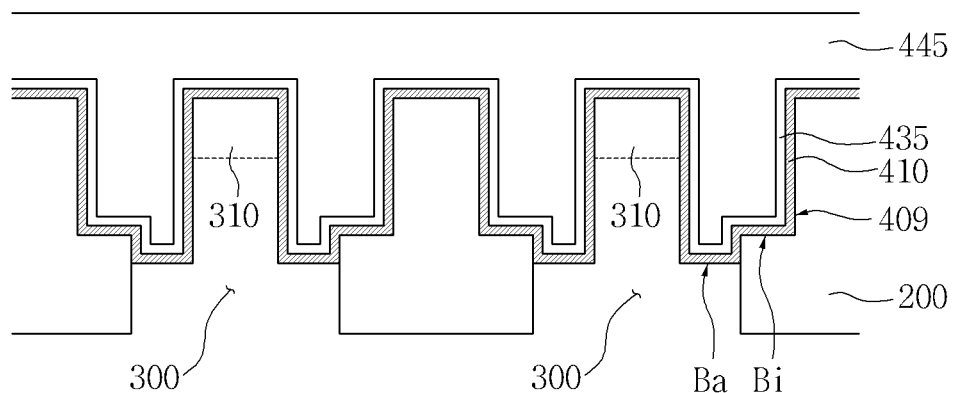

Referring to FIG. 11E, the method of fabricating the semiconductor device 20A according to example embodiments may include forming a gate barrier material layer 435 and an electrode material layer 445 on the nitrided preliminary gate insulating layer 410. The formation of the gate barrier material layer 435 and the electrode material layer 445 will be understood with reference to FIGS. 6G and 6H.

Figure 11F:
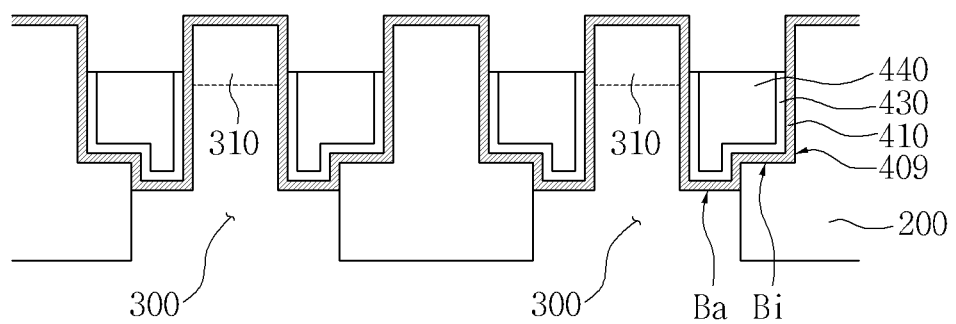

Referring to FIG. 11F, the method of fabricating the semiconductor device 20A according to example embodiments may include removing portions of the gate electrode material layer 445 and the gate barrier material layer 435 using an etch-back process to form a gate electrode layer 440 and a gate barrier layer 430. The formation of the gate electrode layer 440 and the gate barrier layer 430 will be understood with reference to FIG. 6I.

Figure 11G:
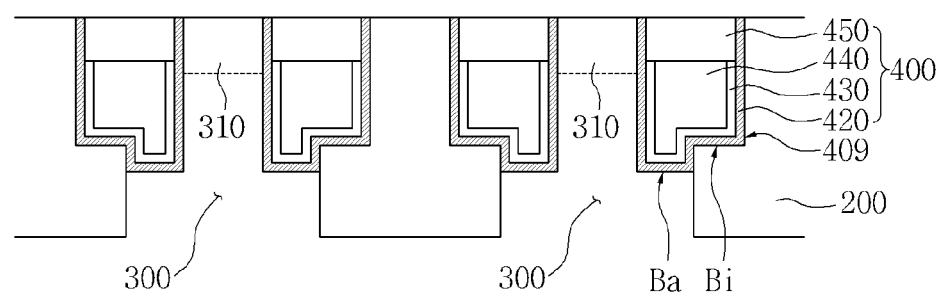
Figure 11H:
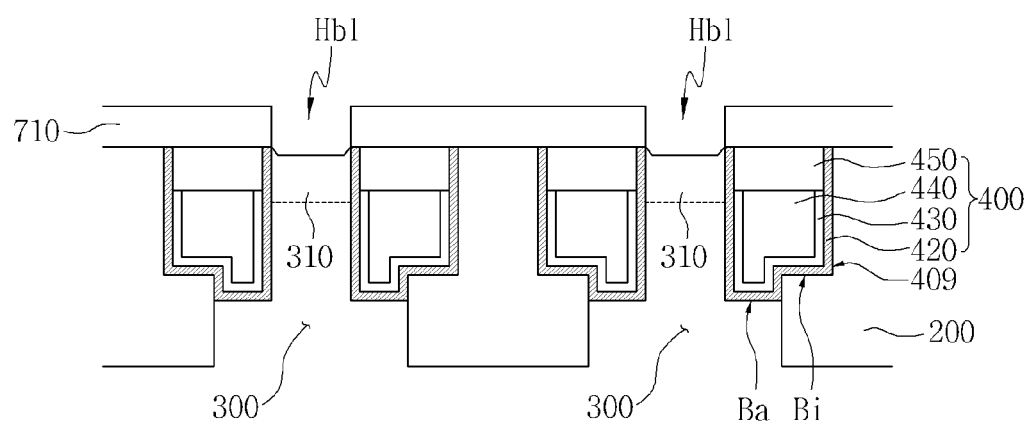

Referring to FIG. 11G, the method of fabricating the semiconductor device 20A according to example embodiments may include forming a gate capping layer 450 to fill a remaining portion of the gate trenches 409. The formation of the gate capping layer 450 will be understood with reference to FIGS. 6J and 6K.

Referring to 11H, the method of fabricating the semiconductor device 20A according to example embodiments may include forming a first interlayer insulating layer 710 having bit line contact holes Hbl exposing the surface of the substrate 100. The surface of the substrate 100 may be slightly recessed. The formation of the first interlayer insulating layer 710 will be understood with reference to FIG. 6L.

Figure 11I:
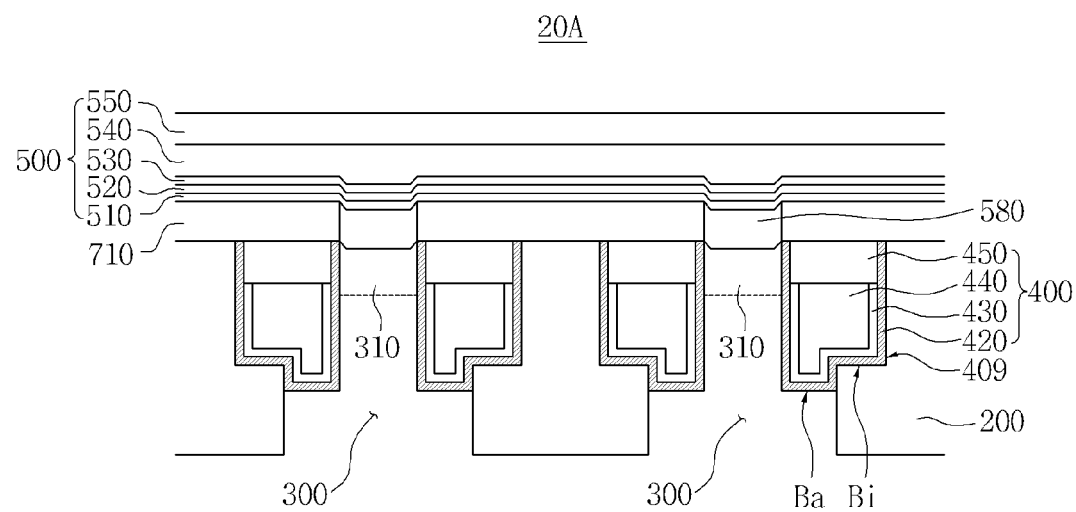

Referring to FIG. 11I, the method of fabricating the semiconductor device 20A according to example embodiments may include forming bit line contact plugs 580, a lower silicide layer 510, a barrier layer 520, an upper silicide layer 530, a bit line electrode layer 540, and a bit line capping layer 550 as will be understood with reference to FIG. 6M. Subsequently, with further reference to FIGS. 6N through 6Q, the semiconductor device 20A shown in FIG. 3A according to example embodiments may be formed.

Methods of fabricating the semiconductor devices shown in FIGS. 3B and 3C according to example embodiments will be described with reference to FIGS. 11A through 11I, 7A through 7E, 8A through 8C, 9A through 9G, and 10A through 10D.

Figure 11J:
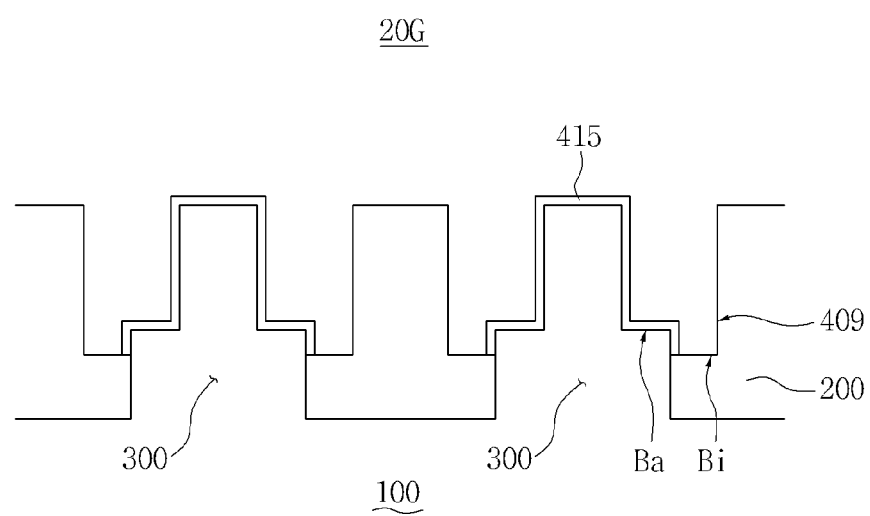
Figure 11K:
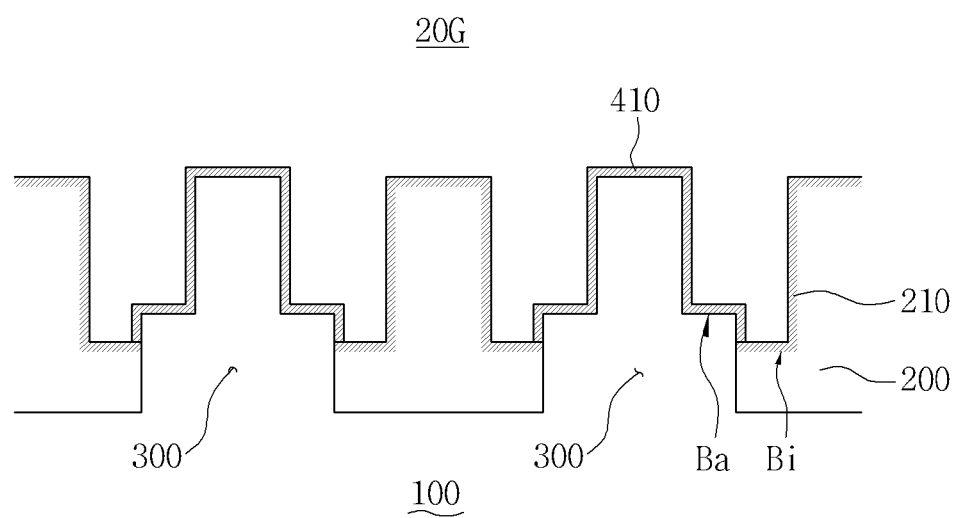

FIGS. 11J and 11K are conceptual longitudinal sectional views illustrating a method of fabricating the semiconductor device shown in FIG. 3G according to example embodiments.

Referring to FIG. 11J, the method of fabricating the semiconductor device 20G shown in FIG. 3G according to example embodiments may include forming a preliminary gate insulating layer 415 only on a substrate 100 corresponding to active regions 300 following the operations of FIG. 11B. For example, when the preliminary gate insulating layer 415 is formed using a silicon oxidation process, the preliminary gate insulating layer 415 may be formed only on silicon. In addition, the preliminary gate insulating layer 415 may not be formed on device isolation regions 200, or may be formed to a negligibly small thickness.

Referring to FIG. 11K, the method of fabricating the semiconductor device 20G shown in FIG. 3G according to example embodiments may include nitriding a surface of the preliminary gate insulating layer 415 and exposed surfaces of the device isolation regions 300 to form a nitrided preliminary gate insulating layer 410 and nitrided regions 210. Subsequently, the semiconductor device 20G shown in FIG. 3G according to example embodiments may be formed with further reference to FIGS. 11E through 11I and 6N through 6Q.

FIGS. 12A through 12E are conceptual longitudinal sectional views taken along line II-II' of FIG. 1, which illustrate a method of fabricating the semiconductor device shown in FIG. 3D according to example embodiments.

Figure 12A:
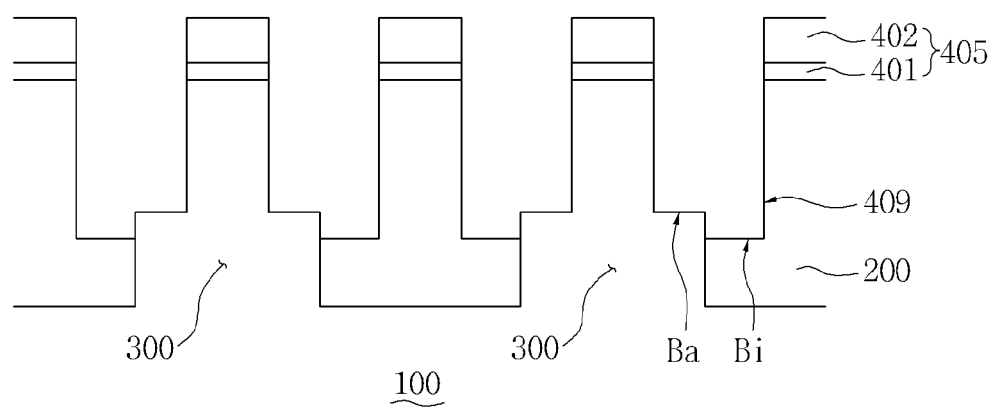
FIGS. 12A through 12G are diagrams illustrating methods of fabricating semiconductor devices according to other example embodiments.

Referring to FIG. 12A, the method of fabricating the semiconductor device 20D according to example embodiments may include forming gate trenches 409 in which bottom surfaces Bi corresponding to device isolation regions 200 are recessed to a lower level than bottom surfaces Ba corresponding to active regions 300, following the operations of FIG. 11A. The formation of the gate trenches 409 may include forming a mask pattern 405 for forming gate trenches on a substrate 100, and removing portions of the substrate 100. The formation of the gate trenches 409 will be understood with further reference to FIG. 6C. Subsequently, the mask pattern 405 for forming the gate trenches may be removed.

Figure 12B:
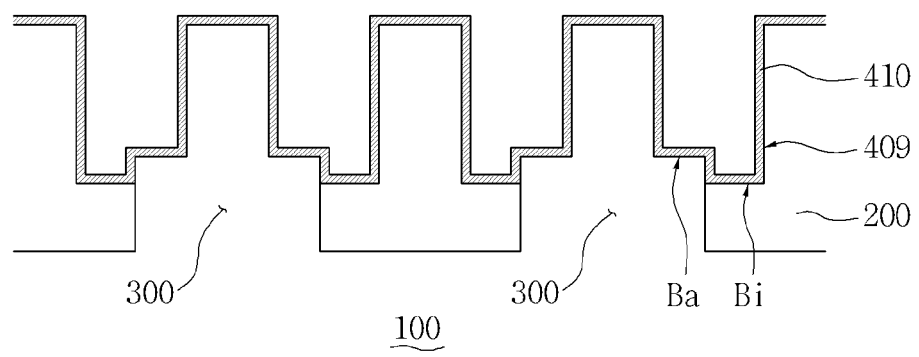

Referring to FIG. 12B, the method of fabricating the semiconductor device 20D according to example embodiments may include conformally forming a nitrided preliminary gate insulating layer 410 on a surface of the substrate 100, surfaces of the device isolation regions 200, and bottom surfaces and inner walls of the gate trenches 409. The nitrided preliminary gate insulating layer 410 may include silicon oxynitride. For example, the nitrided preliminary gate insulating layer 410 may be obtained by nitriding silicon oxide. The formation of the nitrided preliminary gate insulating layer 410 will be understood with reference to FIGS. 6D and 6F. The nitrided preliminary gate insulating layer 410 may also be formed on the mask pattern 405 for forming the gate trenches with reference to other embodiments.

Figure 12C:
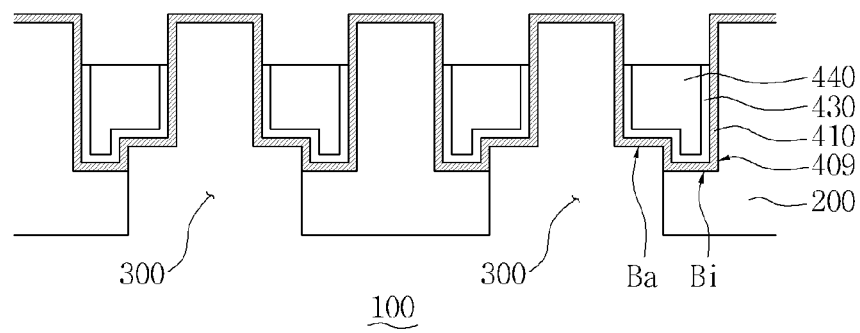

Referring to FIG. 12C, the method of fabricating the semiconductor device 20D according to example embodiments may include forming a gate electrode layer 440 and a gate barrier layer 430 on the nitrided preliminary gate insulating layer 410. The formation of the gate electrode layer 440 and the gate barrier layer 430 will be understood with reference to FIGS. 6G through 6I.

Figure 12D:
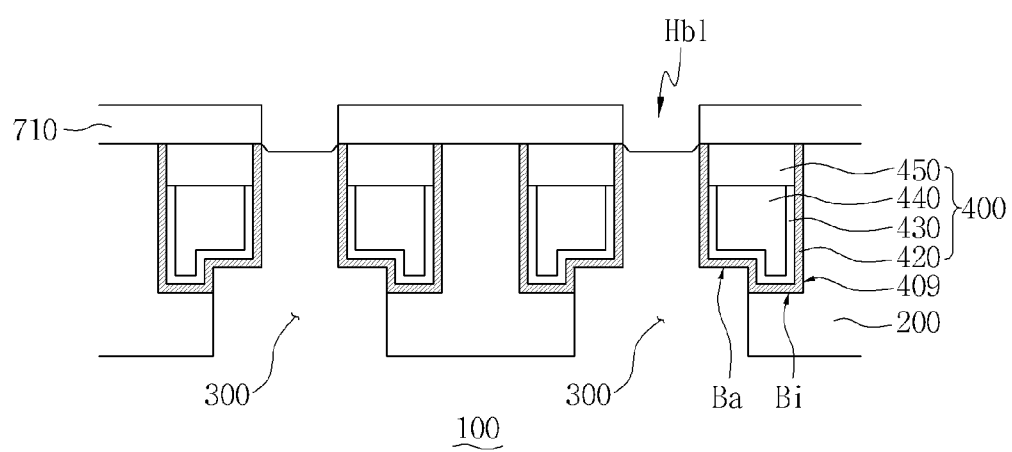

Referring to FIG. 12D, the method of fabricating the semiconductor device 20D according to example embodiments may include forming a gate capping layer 450 and a first interlayer insulating layer 710 having bit line contact holes Hbl. The formation of the gate capping layer 450 and the first interlayer insulating layer 710 will be understood with reference to FIGS. 6J through 6L. Surfaces of the substrate 100 exposed by the bit line contact holes Hbl may be slightly recessed.

Figure 12E:
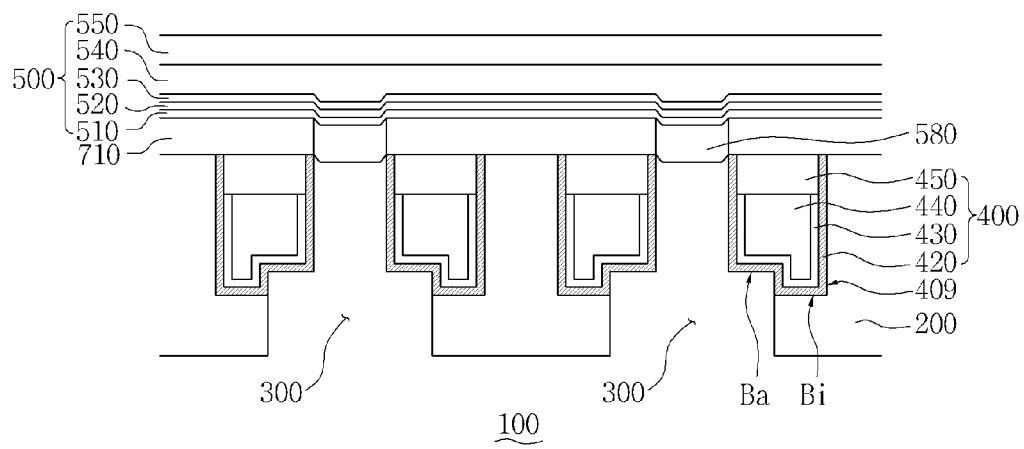

Referring to FIG. 12E, the method of fabricating the semiconductor device 20D according to example embodiments may include forming bit line contact plugs 580, a lower silicide layer 510, a barrier layer 520, an upper silicide layer 530, a bit line electrode layer 540, and a bit line capping layer 550, as will be understood with reference to FIGS. 6M and 6N. Subsequently, with further reference to FIGS. 6O through 6Q, the semiconductor device 20D shown in FIG. 3D according to example embodiments may be formed.

Methods of fabricating the semiconductor devices shown in FIGS. 3E and 3F according to other example embodiments will be understood with reference to FIGS. 12A through 12E, 7A through 7E, 8A through 8C, 9A through 9G, and 10A through 10D.

Figure 12F:
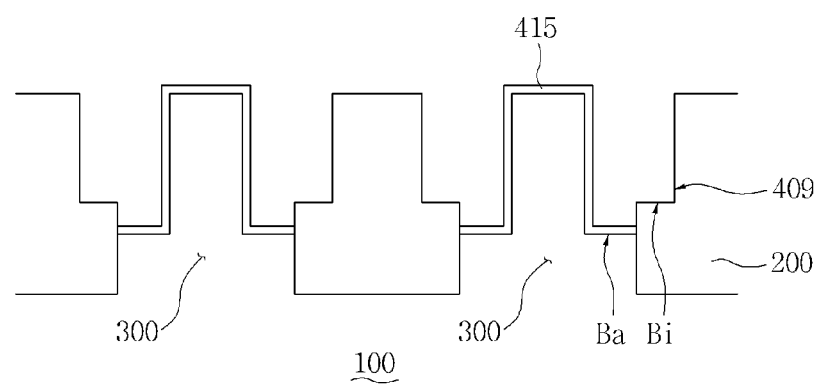
Figure 12G:
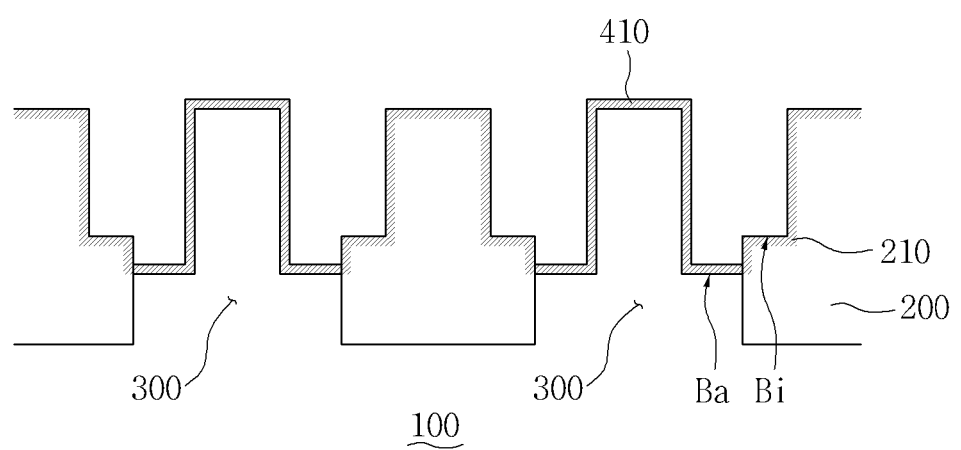

FIGS. 12F and 12G are conceptual longitudinal sectional views illustrating a method of fabricating the semiconductor device shown in FIG. 3H according to example embodiments.

Referring to FIG. 12F, the method of fabricating the semiconductor device 20H of FIG. 3H according to example embodiments may include forming a preliminary gate insulating layer 415 only on a substrate 100 corresponding to active regions 300 following the operations of FIG. 11B. For instance, when the preliminary gate insulating layer 415 is formed using a silicon oxidation process, the preliminary gate insulating layer 415 may be formed only on silicon. In addition, the preliminary gate insulating layer 415 may not be formed on device isolation regions 200, or may be formed to a negligibly small thickness.

Referring to FIG. 12G, the method of fabricating the semiconductor device 20H shown in FIG. 3H according to example embodiments may include nitriding a surface of the preliminary gate insulating layer 415 and exposed surfaces of the device isolation regions 300 to form a nitrided preliminary gate insulating layer 410 and nitrided regions 210. Subsequently, the semiconductor device 20H shown in FIG. 3H according to example embodiments may be formed with further reference to FIGS. 11E through 11I and 6N through 6Q.

FIGS. 13A through 13I are conceptual longitudinal sectional views taken along line III-III' of FIG. 1, which illustrate a method of fabricating the semiconductor device shown in FIG. 4A according to example embodiments.

Figure 13A:
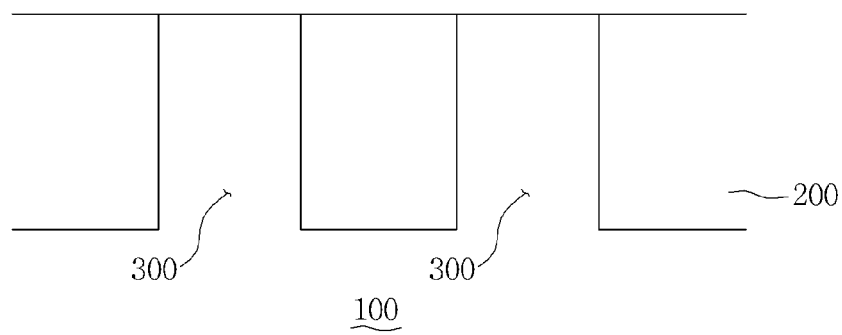
FIGS. 13A through 13M are diagrams illustrating methods of fabricating semiconductor devices according to other example embodiments.

Referring to FIG. 13A, the method of fabricating the semiconductor device 30A according to example embodiments may include forming device isolation regions 200 in a substrate 100 to define active regions 300. For brevity, it is assumed in FIG. 13A that lateral surfaces of the device isolation regions 200 are vertical.

Figure 13B:
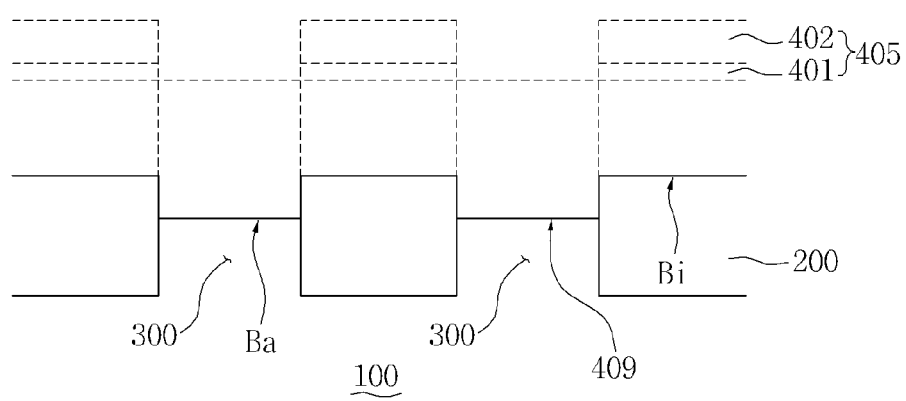

Referring to FIG. 13B, the method of fabricating the semiconductor device 30A according to example embodiments may include forming gate trenches 409. The formation of the gate trenches 409 will be understood with further reference to FIG. 6C. Although an impurity layer 310 may be formed before forming the gate trenches 409, the formation of the impurity layer 310 is omitted for brevity. Bottom surfaces of the gate trenches 409 may include the device isolation regions 200 and the active regions 300. In the present example embodiments, the bottom surfaces of the gate trenches 409 may not be planar but have a step difference therebetween. For example, bottom surfaces Ba of the gate trenches 409 corresponding to the active regions 300 may be recessed to a lower level than bottom surfaces Bi of the gate trenches 409 corresponding to the device isolation regions 200.

During the formation of the gate trenches 409, a mask pattern 405 for forming gate trenches, which includes a lower mask pattern 401 and an upper mask pattern 402, may be used. Because the mask pattern 405 for forming the gate trenches is not seen in a longitudinal sectional view taken along line III-III', the mask pattern 405 for forming the gate trenches is illustrated with dotted lines.

Figure 13C:
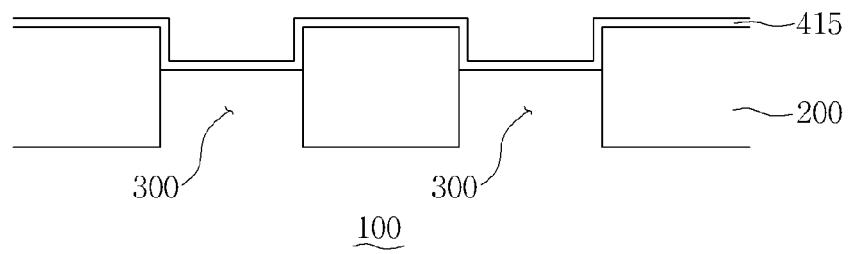

Referring to FIG. 13C, the method of fabricating the semiconductor device 30A according to example embodiments may include conformally forming a preliminary gate insulating layer 415 on the bottom surfaces of the gate trenches 409. The formation of the preliminary gate insulating layer 415 will be understood with reference to FIG. 6D.

Figure 13D:
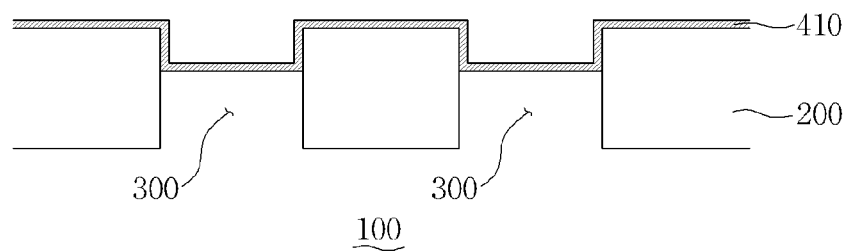

Referring to FIG. 13D, the method of fabricating the semiconductor device 30A according to example embodiments may include nitriding the preliminary gate insulating layer 415 to form a nitrided preliminary gate insulating layer 410. The formation of the nitrided preliminary gate insulating layer 410 will be understood with reference to FIG. 6E. To show the variety of example embodiments, FIG. 13D illustrates that the nitrided preliminary gate insulating layer 410 is formed on the entire resultant structure. Various shapes of the nitrided preliminary gate insulating layer 410 will be understood with reference to FIG. 6F.

Figure 13E:
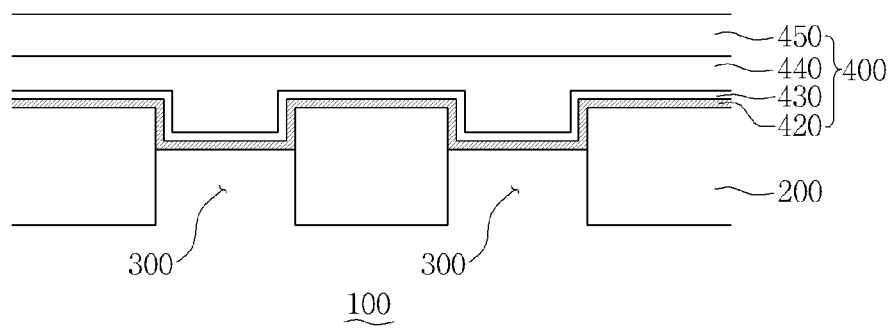

Referring to FIG. 13E, the method of fabricating the semiconductor device 30A according to example embodiments may include forming a gate insulating layer 420, a gate barrier layer 430, a gate electrode layer 440, and a gate capping layer 450 to form gate structures 400. The formation of the gate structures 400 will be understood with reference to FIGS. 6G through 6K.

Figure 13F:
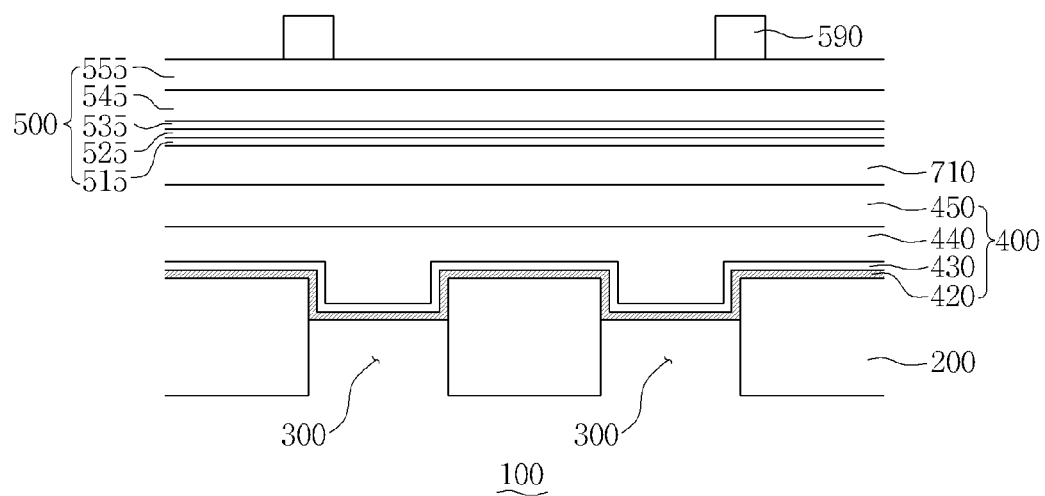

Referring to FIG. 13F, the method of fabricating the semiconductor device 30A according to example embodiments may include forming a first interlayer insulating layer 710, a lower metal silicide material layer 515, a bit line barrier material layer 525, an upper metal silicide material layer 535, a bit line electrode material layer 545, and a bit line capping material layer 555. In addition, the method of fabricating the semiconductor device 30A according to example embodiments may further include forming a mask pattern 590 for forming bit lines. The mask pattern 590 for forming the bit lines may include photoresist.

Figure 13G:
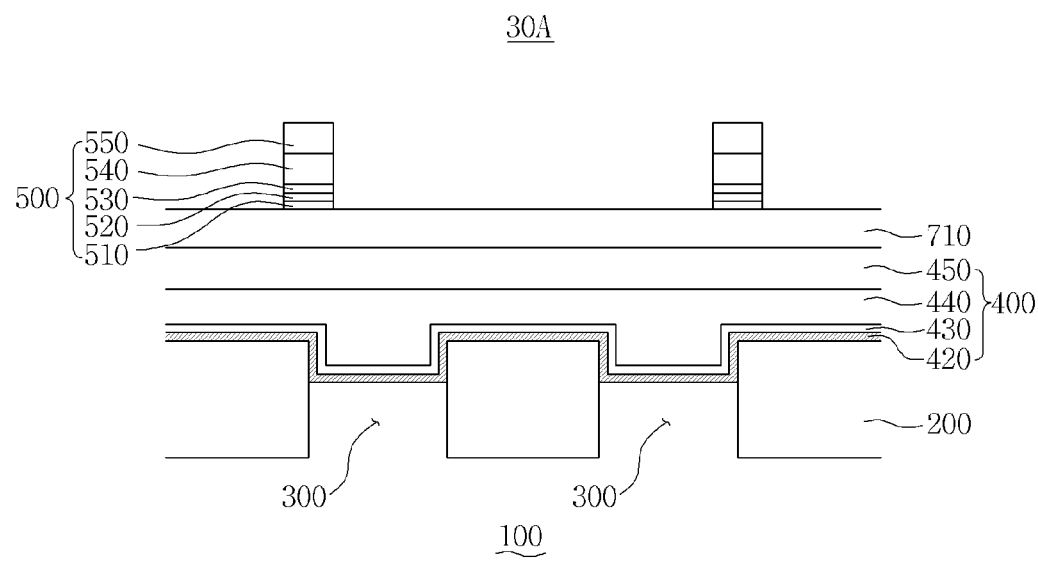

Referring to FIG. 13G, the method of fabricating the semiconductor device 30A according to example embodiments may include forming a lower metal silicide layer 510, a bit line barrier layer 520, an upper metal silicide layer 530, a bit line electrode layer 540, and a bit line capping layer 550. The formation of the lower metal silicide layer 510, the bit line barrier layer 520, the upper metal silicide layer 530, the bit line electrode layer 540, and the bit line capping layer 550 may include patterning the lower metal silicide material layer 515, the bit line barrier material layer 525, the upper metal silicide material layer 535, the bit line electrode material layer 545, and the bit line capping material layer 555 using the mask pattern 590 for forming the bit lines as a patterning mask. The patterning process may include an etching process. Subsequently, the method of fabricating the semiconductor device 30A according to example embodiments may include removing the mask pattern 590 for forming the bit lines.

Figure 13H:
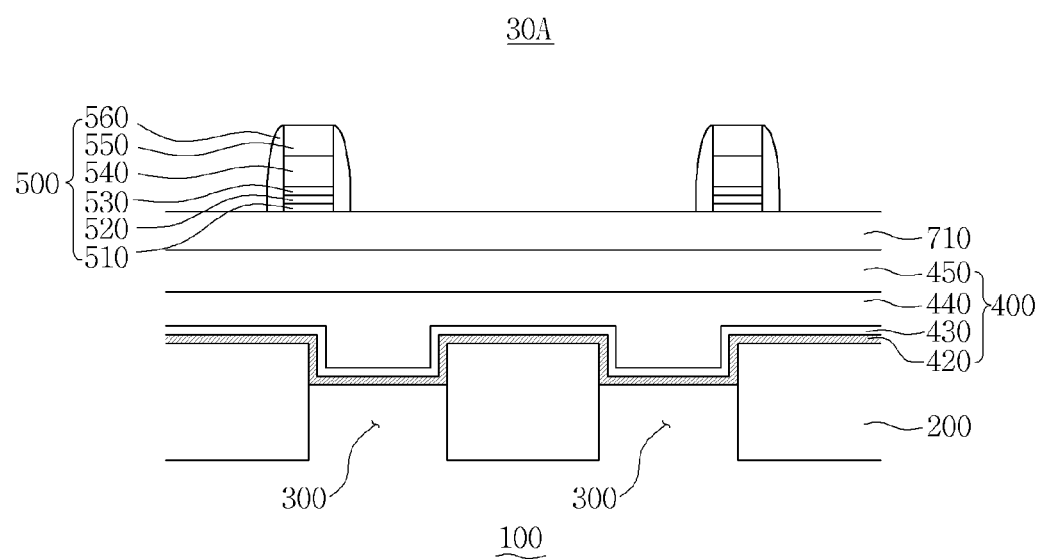

Referring to FIG. 13H, the method of fabricating the semiconductor device 30A according to example embodiments may include forming bit line spacers 560 on lateral surfaces of bit lines 500. The formation of the bit line spacers 560 may include forming a material layer for bit line spacers on the entire resultant structure, and etching back the material layer for the bit line spacers.

Figure 13I:
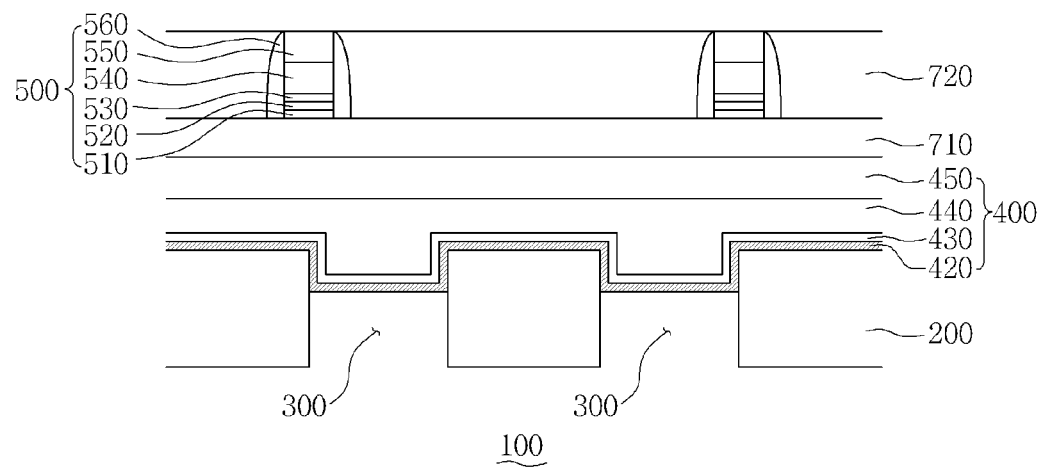

Referring to FIG. 13I, the method of fabricating the semiconductor device 30A according to example embodiments may include forming a second interlayer insulating layer 720. The second interlayer insulating layer 720 may completely cover the bit lines 500 and expose a surface of the bit line capping layer 550. The second interlayer insulating layer 720 may include silicon oxide.

Subsequently, the method of fabricating the semiconductor device 30A according to example embodiments may include forming a third interlayer insulating layer 730. Because capacitors 600 are not seen, a description thereof will be omitted. In addition, a stopper material layer may be formed between the second and third interlayer insulating layers 720 and 730. The stopper material layer may include a harder material than the second and third interlayer insulating layers 720 and 730. For example, the stopper material layer may include silicon nitride or silicon oxynitride.

A method of fabricating the semiconductor device shown in FIG. 4B according example embodiments will be understood with reference to FIGS. 12A through 12E and 13A through 13I.

For example, when the active regions 300 are removed to a relatively greater extent than the device isolation regions 200 during the process described with reference to FIG. 13B, the semiconductor device 30A shown in FIG. 4A may be formed. Conversely, when the device isolation regions 200 are removed to a relatively greater extent than the active regions 300 during the process described with reference to FIG. 13B, the semiconductor device 30B shown in FIG. 4B may be formed.

Figure 13J:
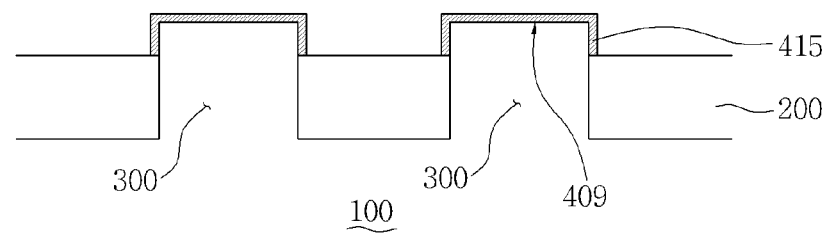
Figure 13K:
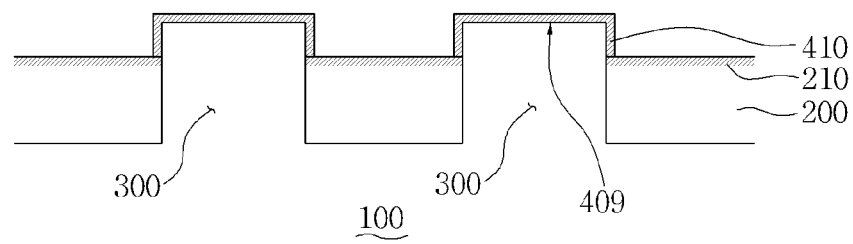

FIGS. 13J and 13K are conceptual longitudinal sectional views illustrating a method of forming the semiconductor device of FIG. 4C according to example embodiments.

Referring to FIG. 13J, the method of fabricating the semiconductor device 30C of FIG. 4C according to example embodiments may include forming a preliminary gate insulating layer 415 only on a substrate 100 corresponding to active regions 300 following the operations of FIG. 13B. For instance, when the preliminary gate insulating layer 415 is formed using a silicon oxidation process, the preliminary gate insulating layer 415 may be formed only on silicon. In addition, the preliminary gate insulating layer 415 may not be formed on device isolation regions 200, or may be formed to a negligibly small thickness.

Referring to FIG. 13K, the method of fabricating the semiconductor device 30C of FIG. 4C according to example embodiments may include nitriding a surface of the preliminary gate insulating layer 415 and exposed surfaces of the device isolation regions 300 to form a nitrided preliminary gate insulating layer 410 and nitrided regions 210. Subsequently, the semiconductor device 30C shown in FIG. 4C according to example embodiments may be formed with further reference to FIGS. 13E through 13I.

Figure 13L:
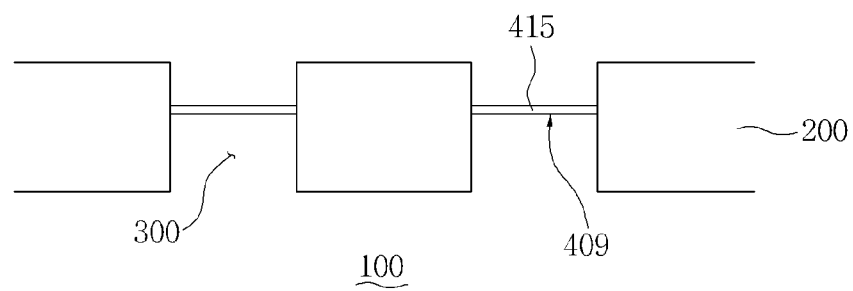
Figure 13M:
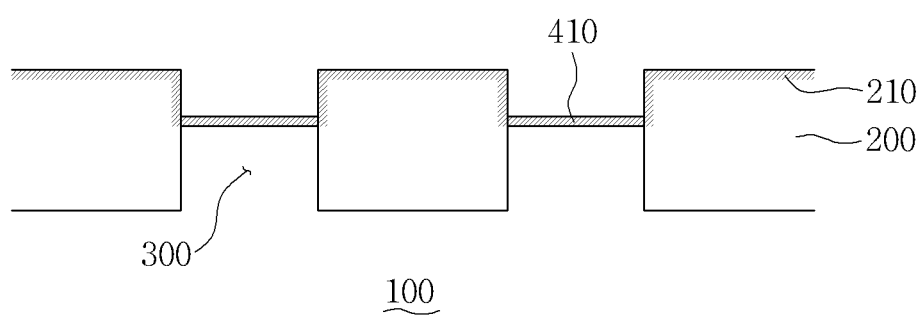

FIGS. 13L and 13M are conceptual longitudinal sectional views illustrating a method of fabricating the semiconductor device shown in FIG. 4D according to example embodiments.

Referring to FIG. 13L, the method of fabricating the semiconductor device 30D of FIG. 4D according to example embodiments may include forming a preliminary gate insulating layer 415 only on a substrate 100 corresponding to active regions 300 following the operations of FIG. 13B. For instance, when the preliminary gate insulating layer 415 is formed using a silicon oxidation process, the preliminary gate insulating layer 415 may be formed only on silicon. In addition, the preliminary gate insulating layer 415 may not be formed on device isolation regions 200, or may be formed to a negligibly small thickness.

Referring to FIG. 13M, the method of fabricating the semiconductor device 30D of FIG. 4D according to example embodiments may include nitriding a surface of the preliminary gate insulating layer 415 and exposed surfaces of the device isolation regions 300 to form a nitrided preliminary gate insulating layer 410 and nitrided regions 210. Subsequently, the semiconductor device 30D shown in FIG. 4D according to example embodiments may be formed with further reference to FIGS. 13E through 13I.

Figure 14:
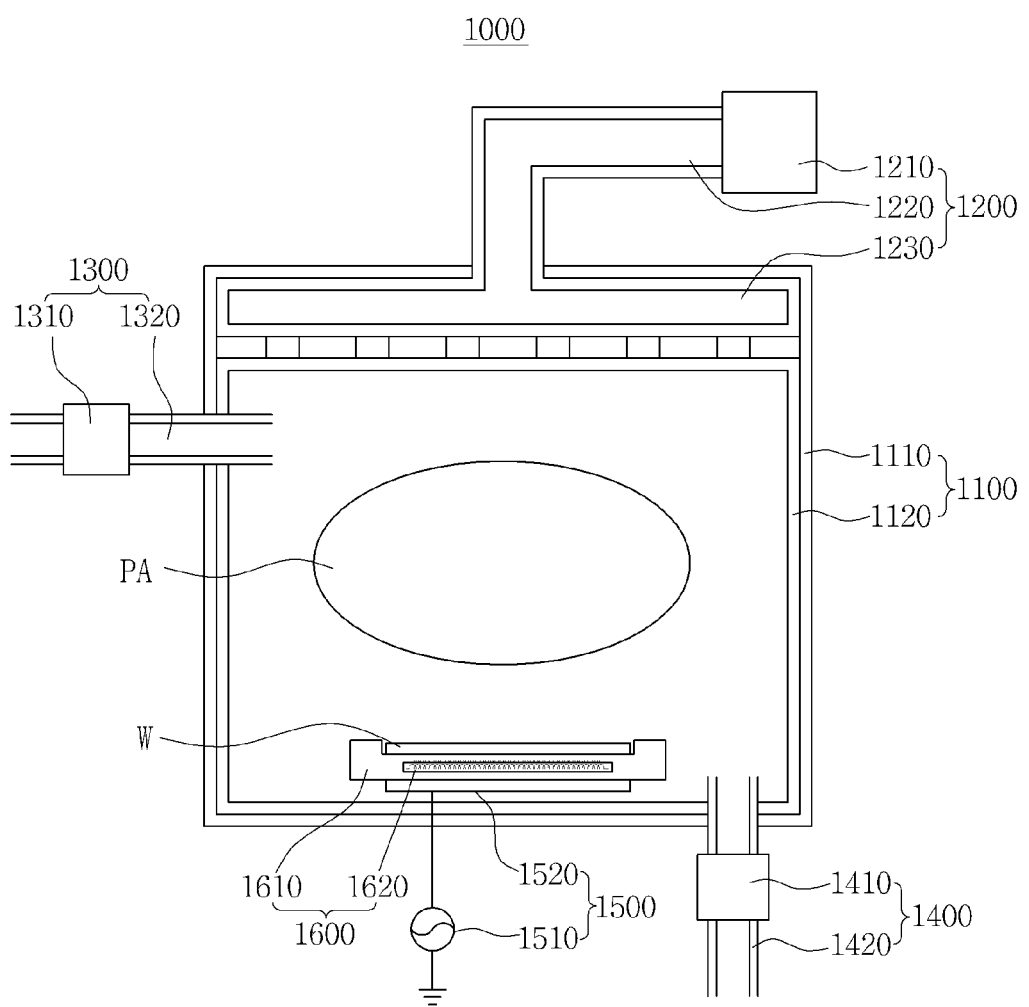

FIG. 14 is a conceptual diagram of a semiconductor fabrication apparatus according to example embodiments.

Referring to FIG. 14, a semiconductor fabrication apparatus 1000 according to example embodiments a chamber 1100, a source power supply unit 1200, a gas supply unit 1300, a gas exhaust unit 1400, a bias power supply unit 1500, and a support unit 1600.

The chamber 1100 may include an external chamber 1110 and an internal chamber 1120. The external chamber 1110 may include a stainless metal (e.g., SUS). The internal chamber 1120 may include an insulating material (e.g., quartz). A plasma region PA may be formed inside the internal chamber 1120.

The source power supply unit 1200 may be disposed in an upper region of the chamber 1100. The source power supply unit 1200 may include a microwave generator 1210, a waveguide 1220, and a microwave emitter 1230. The waveguide 1220 may transmit microwaves generated by the microwave generator 1210 into the chamber 1100. The microwave emitter 1230 may uniformly supply the microwaves into the plasma region PA of the chamber 1100.

The gas supply unit 1300 may be disposed in the upper region, a lateral region, or an upper lateral region of the chamber 1100. The gas supply unit 1300 may include a mass flow controller (MFC) 1310 and a supply pipe 1320. The MFC 1310 may separately or simultaneously control flow rates of gases supplied into the chamber 1100. That is, the MFC 1310 may include a plurality of valves or controllers connected in parallel or in series. The supply pipe 1320 may supply gases into the plasma region PA of the chamber 1100.

The gas exhaust unit 1400 may be disposed in a lower region, a lateral region or a lower lateral region of the chamber 1100. The gas exhaust unit 1400 may include an exhaust pipe 1410 and a vacuum pump 1420. The vacuum pump 1420 may maintain the inner pressure of the chamber 1100.

The bias power unit 1500 may include a radio-frequency (RF) generator 1510 and a bias electrode 1520. The bias electrode 1520 may be disposed under the support unit 1600. In other example embodiments, the bias electrode 1520 may be disposed in the support unit 1600. In other example embodiments, the support unit 1600 may be used as the bias electrode 1520.

The support unit 1600 may be disposed in the lower region of the chamber 1100, for example, in a lower central region of the chamber 1100. The support unit 1600 may include a support chuck 1610 and a heating coil 1620. A wafer W may be mounted on the support chuck 1610. The heating coil 1620 may be disposed under the inside of the support chuck 1610.

Figure 15:
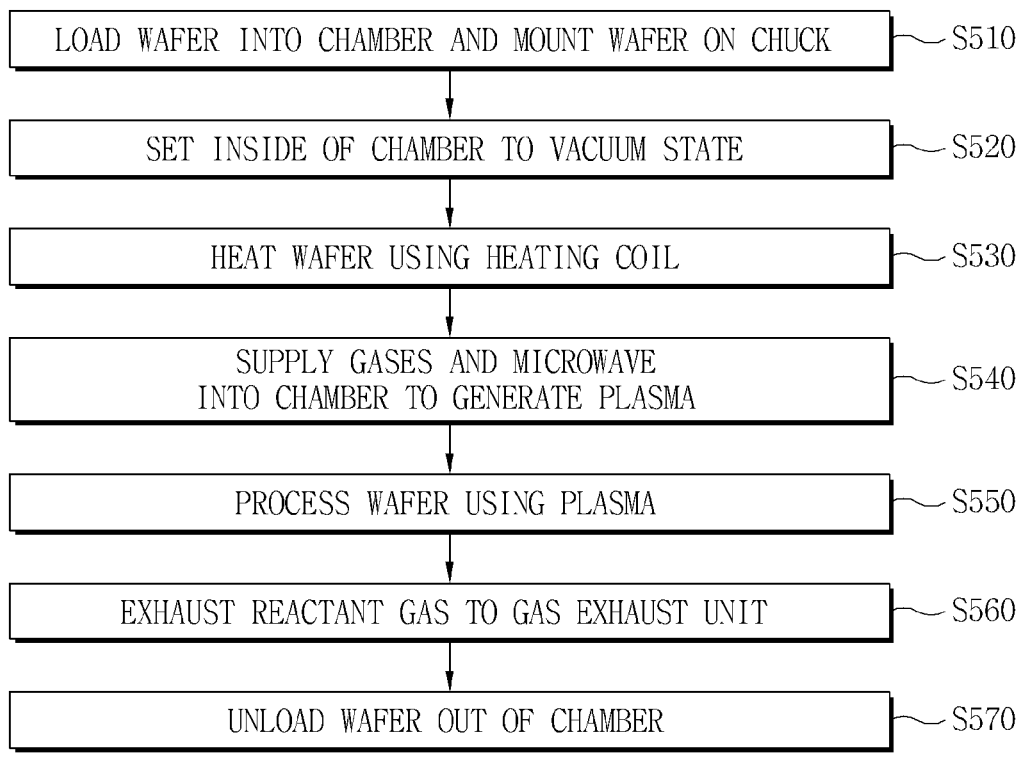

FIG. 15 is a flowchart illustrating a method of fabricating a semiconductor device using a semiconductor fabrication apparatus according to example embodiments.

Referring to FIGS. 14 and 15, the method of fabricating the semiconductor device may include loading the wafer W into the chamber 1100, and mounting the wafer W on the support chuck 1610 (S510).

The method of fabricating the semiconductor device may include setting the inside of the chamber 1100 to a vacuum state (S520). For example, setting the inside of the chamber 1100 to the vacuum state using the vacuum pump 1420 may include setting the inside of the chamber 1100 to a vacuum state under a pressure between about 100 mTorr and about 400 mTorr.

The method of fabricating the semiconductor device may include heating the wafer W using the heating coil 1620 (S530). For example, heating the wafer W may include heating the support chuck 1610 to a temperature between about 450° C. and about 550° C.

The method of fabricating the semiconductor device using the semiconductor fabrication apparatus 1000 according to example embodiments may include supplying gases and microwaves into the chamber 1100 to generate plasma (S540). The gases may include a gas containing nitrogen (N) and an inert gas. For instance, the gases may include a combination of $NH_3$ gas and Ar gas, or a combination of nitrogen ($N_2$) gas, hydrogen ($H_2$) gas, and Ar gas. For example, when the combination of $NH_3$ gas and Ar gas is used, the $NH_3$ gas may be supplied into a processing chamber at a flow rate between about 100 sccm and about 500 sccm. Also, when the combination of $N_2$ gas, $H_2$ gas, and Ar gas is used, the $N_2$ gas may be supplied into the process chamber at a flow rate between about 50 sccm and about 400 sccm, the $H_2$ gas may be supplied at a flow rate between about 20 sccm and about 200 sccm, and the Ar gas may be supplied at a flow rate between about 500 sccm and about 3000 sccm. For example, experiments were conducted by supplying $NH_3$ gas at a flow rate of about 150 sccm and supplying Ar gas at a flow rate of about 1500 sccm, or by supplying $N_2$ gas at a flow rate of about 100 sccm, supplying $H_2$ gas at a flow rate of about 50 sccm, and supplying Ar gas at a flow rate of about 1500 sccm. The microwaves may have a frequency of about 2.45 GHz. The microwaves may have power between about 1.5 KW and about 3.8 KW, for example, between about 3.0 KW and about 3.6 KW. For instance, the microwaves may have power between about 3.3 KW and about 3.4 KW.

The method of fabricating the semiconductor device using the semiconductor fabrication apparatus 100 according to example embodiments may include processing the wafer W using plasma (S550). The processing of the wafer W using plasma may include applying an RF bias at a frequency of about 13.56 MHz with power between about 100 W and about 300 W. Due to the current process, silicon or silicon oxide formed on the wafer W may be converted into silicon nitride or silicon oxynitride.

The method of fabricating the semiconductor device using the semiconductor fabrication apparatus 1000 according to example embodiments may include exhausting a reactant gas into the gas exhaust unit 1400 (S560). For example, gases contained in the chamber 1100 may be exhausted using the vacuum pump 1420. Thereafter, the vacuum state of the chamber 1100 may be adjusted to atmospheric pressure.

Subsequently, the method of fabricating the semiconductor device using the semiconductor fabrication apparatus 1000 according to example embodiments may include unloading the wafer W out of the chamber 1000 (S570).

Figure 16:
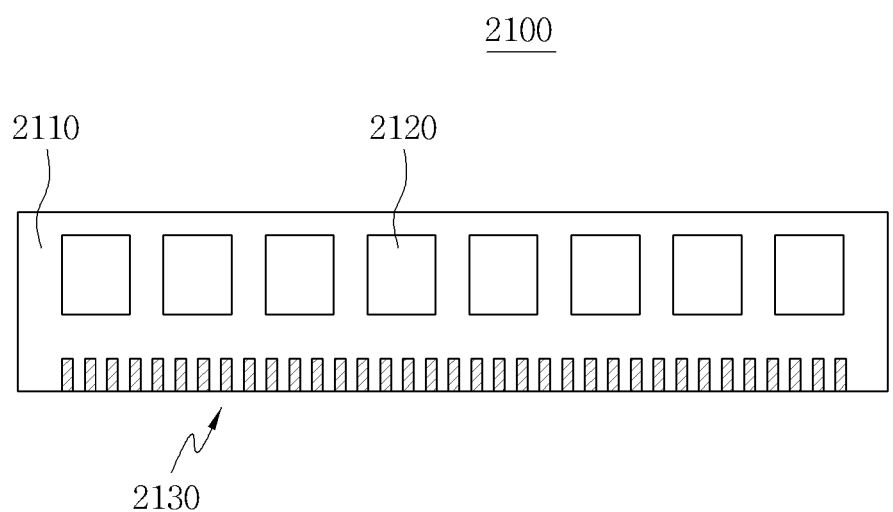

FIG. 16 is a conceptual diagram of a memory module including at least one of the semiconductor devices according to various example embodiments.

Referring to FIG. 16, a memory module 2100 may include a memory module substrate 2110, a plurality of memory devices 2120 disposed on the memory module substrate 2110, and a plurality of terminals 2130. The memory module substrate 2110 may include a printed circuit board (PCB) or a wafer. Each of the memory devices 2120 may be one of the semiconductor devices 10A through 10C, 20A through 20F, and 30A through 30F according to various example embodiments, or a semiconductor package including one of the semiconductor devices 10A to 10C, 20A to 20F, and 30A to 30B. The plurality of terminals 2130 may include a conductive metal. The terminals 2130 may be electrically connected to the memory devices 2120, respectively. Because the memory module 2100 includes semiconductor devices having small leakage current and good on-off current characteristics, the memory module 2100 may have improved module performance.

Figure 17:
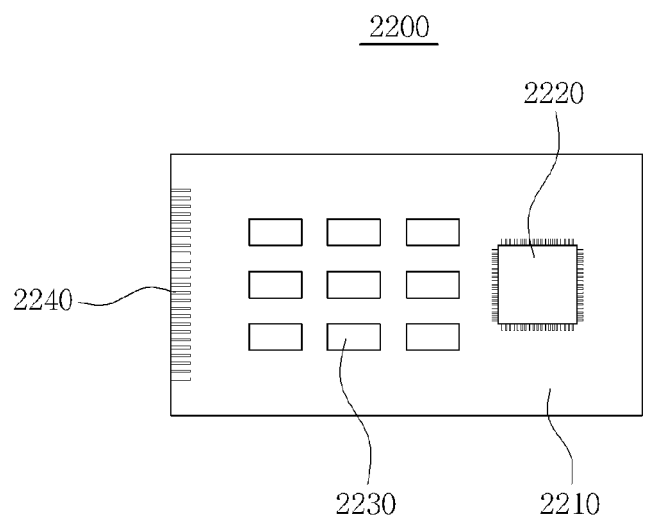

FIG. 17 is a conceptual diagram of a semiconductor module including at least one of the semiconductor devices according to various example embodiments.

Referring to FIG. 17, a semiconductor module 2200 according to example embodiments may include a semiconductor module substrate 2210, a plurality of memory devices 2230 disposed on the semiconductor module substrate 2210, and a plurality of input/output terminals 2240. Each of the memory devices 2230 may be one of the semiconductor devices 10A to 10C, 20A to 20F, and 30A and 30B according to various example embodiments, which may be mounted on the semiconductor module substrate 2210. The semiconductor module 2200 may further include a microprocessor (MP) 2220 mounted on the semiconductor module substrate 2210. The input/output (I/O) terminals 2240 may be disposed on at least one side of the semiconductor module substrate 2210.

Figure 18:
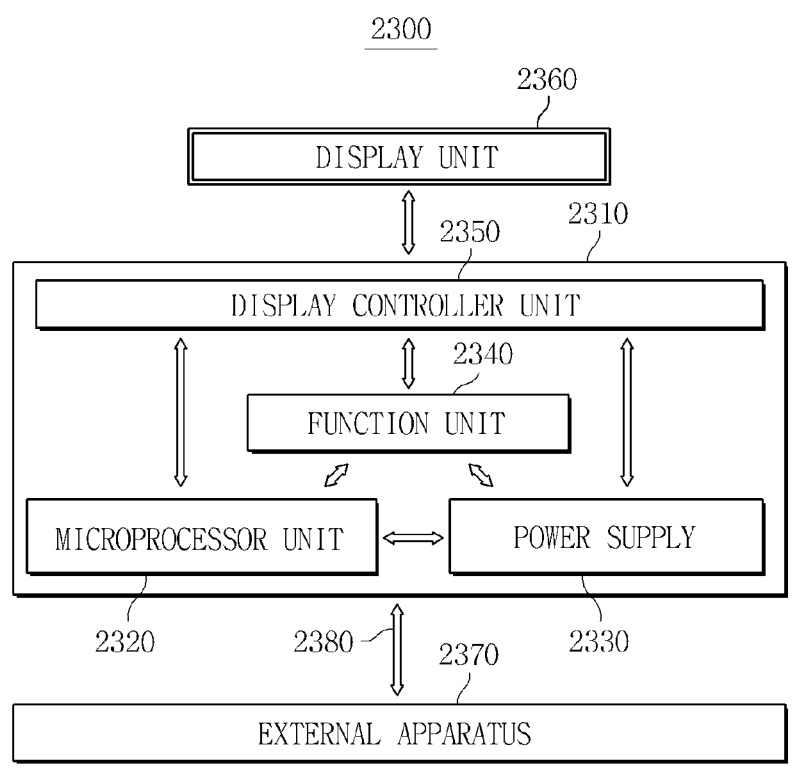

FIG. 18 is a conceptual block diagram of an electronic system including at least one of the semiconductor devices according to various example embodiments.

Referring to FIG. 18, semiconductor devices 10A to 10C, 20A to 20F, and 30A and 30B according to various example embodiments may be applied to an electronic system 2300. The electronic system 2300 may include a body 2310. The body 2310 may include an microprocessor (MP) unit 2320, a power supply 2330, a function unit 2340, and/or a display controller unit 2350. The body 2310 may include a system board or mother board including a PCB. The MP unit 2320, the power supply 2330, the function unit 2340, and the display controller unit 2350 may be mounted on the body 2310. The display unit 2360 may be disposed on a top surface of the body 2310 or outside the body 2310. For example, the display unit 2360 may be disposed on a surface of the body 2310 and display an image processed by the display controller unit 2350. The power supply 2330 may receive a given voltage from an external battery (not shown), divide the voltage into required voltage levels, and supply the divided voltages to the MP unit 2320, the function unit 2340, and the display controller unit 2350. The MP unit 2320 may receive a voltage from the power supply 2330 and control the function unit 2340 and the display unit 2360. The function unit 2340 may serve various functions of the electronic system 2300. For example, when the electronic system 2300 is a mobile electronic product (e.g., a portable phone), the function unit 2340 may include several components capable of serving wireless communication functions (e.g., outputting an image to the display unit 2360 or outputting a voice to a speaker, by dialing or communicating with an external apparatus 2370). When a camera is also mounted, the function unit 2340 may serve as an image processor. In other example embodiments, when the electronic system 2300 is connected to a memory card to increase capacity, the function unit 2340 may be a memory card controller. The function unit 2340 may transmit/receive signals to/from the external apparatus 2370 through a wired or wireless communication unit 2380. Furthermore, when the electronic system 2300 requires a universal serial bus (USB) to increase functionality, the function unit 2140 may serve as an interface controller. The semiconductor devices 10A to 10C, 20A to 20F, and 30A to 30B described in the various example embodiments may be included in at least one of the MP unit 2320 and the function unit 2340.

Figure 19:
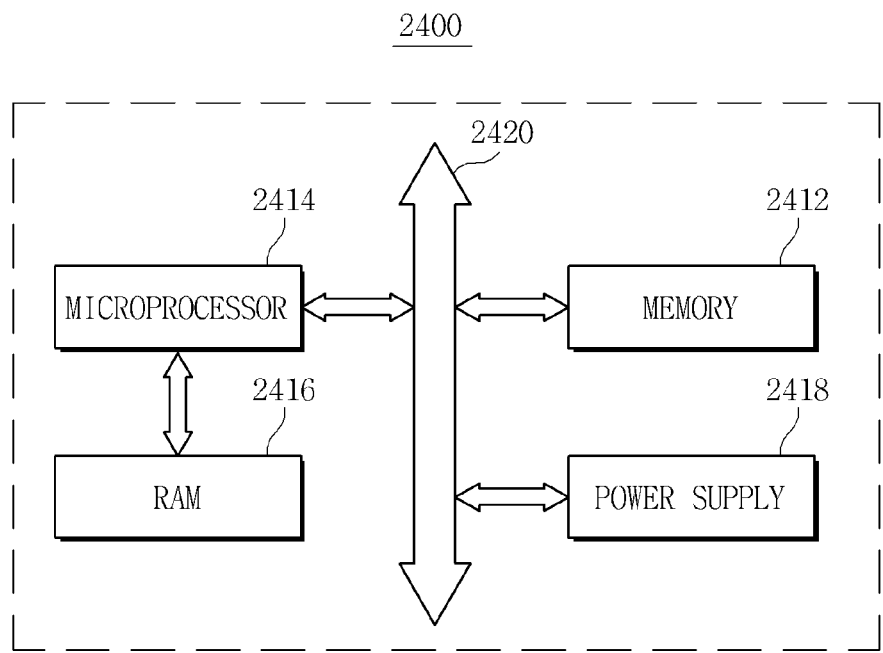

FIG. 19 is a schematic block diagram of another electronic system including at least one of the semiconductor devices according to various example embodiments.

Referring to FIG. 19, an electronic system 2400 may include at least one of the semiconductor devices 10A to 10C, 20A to 20B, and 30A to 30C according to various example embodiments. The electronic system 2400 may be used to fabricate a mobile device or computer. For example, the electronic system 2400 may include a memory system 2412, an MP 2414, a random access memory (RAM) 2416, and a user interface 2418 which may communicate data using a bus 2420. The MP 2414 may program and control the electronic system 2400. The RAM 2416 may be used as an operation memory of the MP 2414. For example, the MP 2414 or the RAM 2416 may include at least one of semiconductor devices according to example embodiments. The MP 2414, the RAM 2416, and/or other components may be assembled within a single package. The user interface 2418 may be used to input/output data to/from the electronic system 2400. The memory system 2412 may store codes for operating the MP 2414, data processed by the MP 2414, or external input data. The memory system 2412 may include a controller and a memory.

Figure 20:
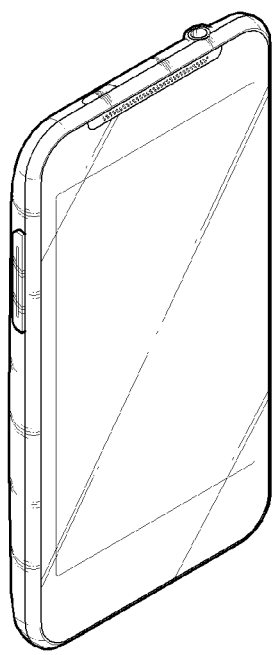

FIG. 20 is a schematic diagram of a mobile wireless phone including at least one of the semiconductor devices according to various example embodiments.

Referring to FIG. 20, a mobile wireless phone 2500 may be interpreted as a tablet personal computer (PC). In addition, at least one of the semiconductor devices 10A to 10C, 20A to 20F, 30A, and 30B according to various example embodiments may be used not only for a tablet PC but also for a portable computer (e.g., a laptop computer, an MPEG-1 audio layer 3 (MP3) player, an MP4 player, a navigation device, a solid-state disk (SSD), a desktop computer, or electronic devices for automotive and household uses).

Because EOTs of MOSFETs according to various example embodiments are reduced, threshold voltages of the MOSFETs can be reduced. Because the MOSFETs according to the various example embodiments may be turned on and off at low threshold voltages, power consumption of the MOSFETs and semiconductor devices can be reduced. The MOSFETs according to various example embodiments can have increased on-currents and reduced off-currents. The semiconductor devices according to the various example embodiments can have improved data retention characteristics.

In nitridation methods according to various example embodiments, the gate insulating layer having silicon oxide can be uniformly nitrided.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope as defined in the claims. In the claims, means-plus-function clauses are intended to cover the structures described herein as performing the recited function, and not only structural equivalents but also equivalent structures.

What is claimed is:

1. A method of fabricating a semiconductor device, the method comprising:
    forming device isolation regions in a substrate to define active regions;
    forming gate trenches in the substrate, wherein the gate trenches expose the active regions and the device isolation regions;
    conformally forming a preliminary gate insulating layer including silicon oxide on the exposed active regions in the gate trenches;
    nitriding the preliminary gate insulating layer by applying a radio-frequency (RF) bias at a frequency of about 13.56 MHz with power between about 100 W and about 300 W to form a nitrided preliminary gate insulating layer including silicon oxynitride;
    forming a gate barrier material layer on the nitrided preliminary gate insulating layer;
    forming a gate electrode material layer on the gate barrier material layer;
    partially removing the nitrided preliminary gate insulating layer, the gate barrier material layer, and the gate electrode material layer to respectively form a gate insulating layer, a gate barrier pattern, and a gate electrode layer; and
    forming a gate capping layer on the gate electrode layer, wherein the gate capping layer fills the gate trenches.

2. The method of claim 1, wherein the gate insulating layer includes silicon oxynitride, and
    a concentration of nitrogen in the gate insulating layer increases toward the gate electrode layer and a concentration of oxygen in the gate insulating layer increases toward the substrate.

3. The method of claim 1, wherein the nitriding of the preliminary gate insulating layer includes generating plasma using microwaves having a frequency of about 2.54 GHz and power between about 2000 W and about 3600 W.

4. The method of claim 1, wherein the nitriding of the preliminary gate insulating layer is performed under a pressure between about 100 mTorr and about 400 mTorr.

5. The method of claim 1, wherein the nitriding of the preliminary gate insulating layer includes nitriding a region of the preliminary gate insulating layer close to surfaces of the device isolation regions.

6. The method of claim 1, wherein the nitriding of the preliminary gate insulating layer is performed using one selected from a N2-containing gas, argon (Ar) gas and a combination thereof.

7. The method of claim 6, wherein the nitriding of the preliminary gate insulating layer is performed using one selected from a combination of ammonia (NH3) gas and the Ar gas, a combination of nitrogen (N2) gas, hydrogen (H2) gas and the Ar gas and combinations thereof.

8. The method of claim 7, wherein the nitriding of the preliminary gate insulating layer includes,
    supplying the NH3 gas at a flow rate between about 100 sccm and about 500 sccm, and
    supplying the Ar gas at a flow rate between about 1000 sccm and about 3000 sccm.

9. The method of claim 7, wherein the nitriding of the preliminary gate insulating layer includes,
    supplying the N2 gas at a flow rate between about 50 sccm and about 400 sccm,
    supplying the H2 gas at a flow rate between about 20 sccm and about 200 sccm, and supplying the Ar gas at a flow rate between about 500 sccm and about 3000 sccm.

10. The method of claim 1, wherein the nitriding of the preliminary gate insulating layer includes heating the substrate to a temperature between about 450° C. and about 500° C.

11. The method of claim 1, wherein the gate barrier layer includes titanium nitride.

12. The method of claim 1, wherein the forming of the gate trenches includes forming first bottom surfaces exposing the active regions, and second bottom surfaces exposing the device isolation regions,
    wherein the first bottom surfaces are at a higher level than the second bottom surfaces.

13. A method of fabricating a semiconductor device, the method comprising:
    providing a substrate having active regions each delimited by device isolation regions, the active regions being exposed;
    forming at least one gate trench in each of the active regions;
    conformally forming a preliminary gate insulating layer including an oxide over the active region in the at least one gate trench;

nitriding the preliminary gate insulating layer by applying a radio-frequency (RF) bias at a frequency of about 13.56 MHz with power between about 100 W and about 300 W to form a nitrided preliminary gate insulating layer including an oxynitride;

forming a nitrided gate insulating layer, a gate barrier layer, and a gate electrode layer partially filling in the at least one gate trench by removing portions of the nitrided preliminary gate insulating layer, a gate barrier material layer, and a gate electrode layer on the nitrided preliminary gate insulating layer; and forming a gate capping layer filling in a remaining portion of the at least one gate trench.

14. The method of claim 13, wherein the preliminary gate insulating layer is excluded from the device isolation regions.

15. The method of claim 13, wherein the forming of the at least one gate trench includes forming a bottom surface including a first bottom surface over active region and a second bottom surface corresponding over one of the device isolation regions, and the second bottom surface is formed at a height different than a height of the first bottom surface.

16. The method of claim 13, wherein sidewalls of the at least one gate trench are formed at an angle of 90-degrees or greater with respect to an upper surface of the substrate.

17. The method of claim 13, further comprising: forming an insulating layer including an oxide over the device isolation regions, prior to the nitriding the preliminary gate insulating layer, wherein an upper portion of the insulating layer is nitrided when nitriding the preliminary gate insulating layer.

\* \* \* \* \*